United States Patent
Karda et al.

(10) Patent No.: US 11,532,630 B2
(45) Date of Patent: Dec. 20, 2022

(54) CHANNEL FORMATION FOR VERTICAL THREE DIMENSIONAL (3D) MEMORY

(71) Applicant: Micron Technology, Inc., Boise, ID (US)

(72) Inventors: Kamal M. Karda, Boise, ID (US); Haitao Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 160 days.

(21) Appl. No.: 17/004,917

(22) Filed: Aug. 27, 2020

(65) Prior Publication Data

US 2022/0068927 A1   Mar. 3, 2022

(51) Int. Cl.
  *H01L 27/108* (2006.01)
  *G11C 8/14* (2006.01)
(52) U.S. Cl.
  CPC .......... *H01L 27/10805* (2013.01); *G11C 8/14* (2013.01); *H01L 27/1085* (2013.01)
(58) Field of Classification Search
  None
  See application file for complete search history.

(56) References Cited

U.S. PATENT DOCUMENTS

| 10,607,995 | B2 | 3/2020 | Roberts et al. |
| 2018/0323200 | A1 | 11/2018 | Tang et al. |
| 2019/0103406 | A1 | 4/2019 | Tang et al. |
| 2019/0164985 | A1* | 5/2019 | Lee ............... H01L 27/10873 |

OTHER PUBLICATIONS

U.S. Appl. No. 16/204,224, entitled, "Memory Arrays," filed Nov. 29, 2018, 43 pages.

\* cited by examiner

*Primary Examiner* — Anthony Ho
*Assistant Examiner* — Kevin Quinto
(74) *Attorney, Agent, or Firm* — Brooks, Cameron & Huebsch, PLLC

(57) ABSTRACT

Systems, methods and apparatus are provided for depositing alternating layers of dielectric material and sacrificial material in repeating iterations to form a vertical stack, forming a plurality of vertical openings through the vertical stack to form elongated vertical, pillar columns with sidewalls in the vertical stack, patterning the pillar columns to expose a location to form a channel region, selectively removing a portion of the sacrificial material to form first horizontal openings in the first horizontal direction in the sidewalls of the elongated vertical, pillar columns, and depositing a channel material in the first horizontal openings to form the channel region within the sidewalls for the horizontally oriented access devices.

21 Claims, 33 Drawing Sheets

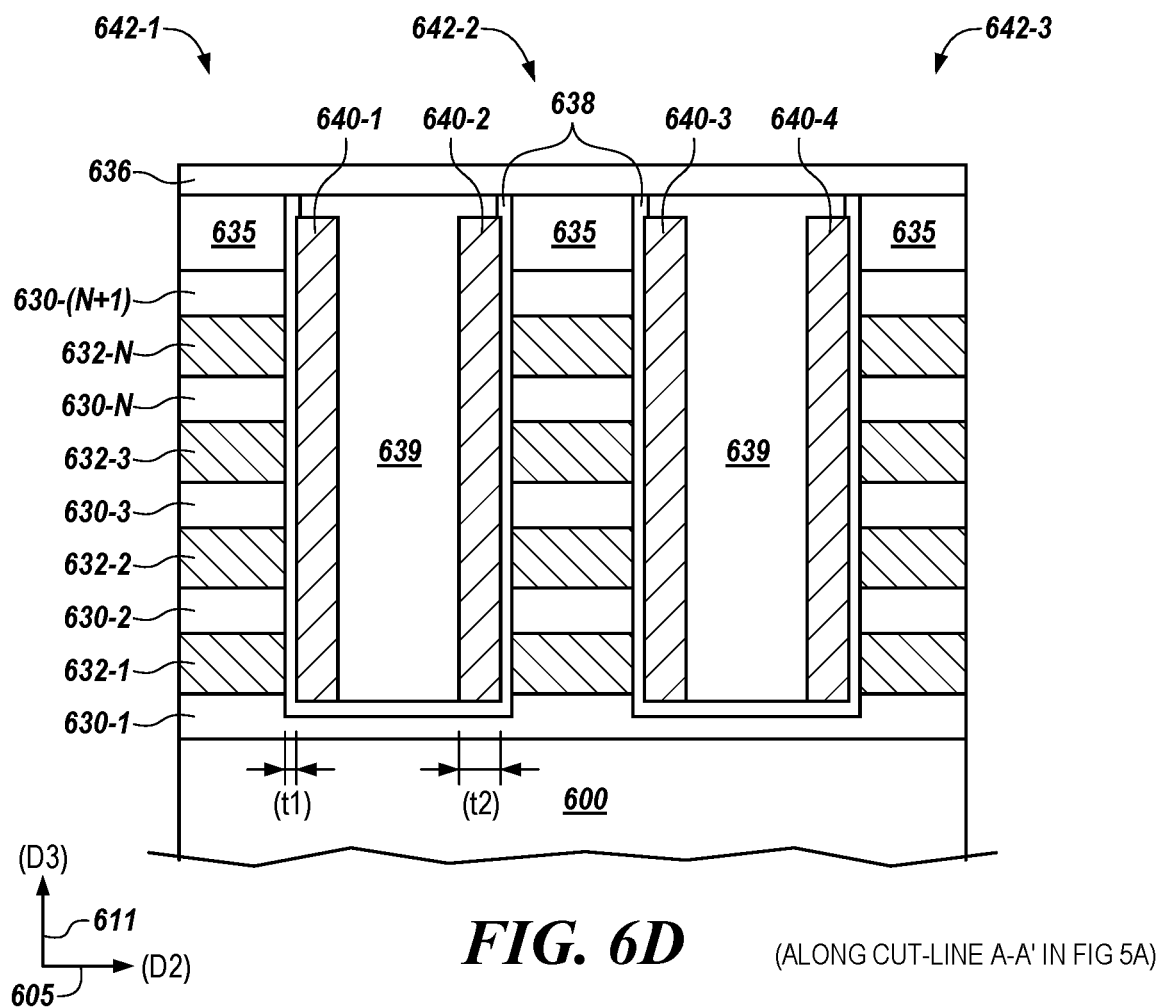
FIG. 6D (ALONG CUT-LINE A-A' IN FIG 5A)

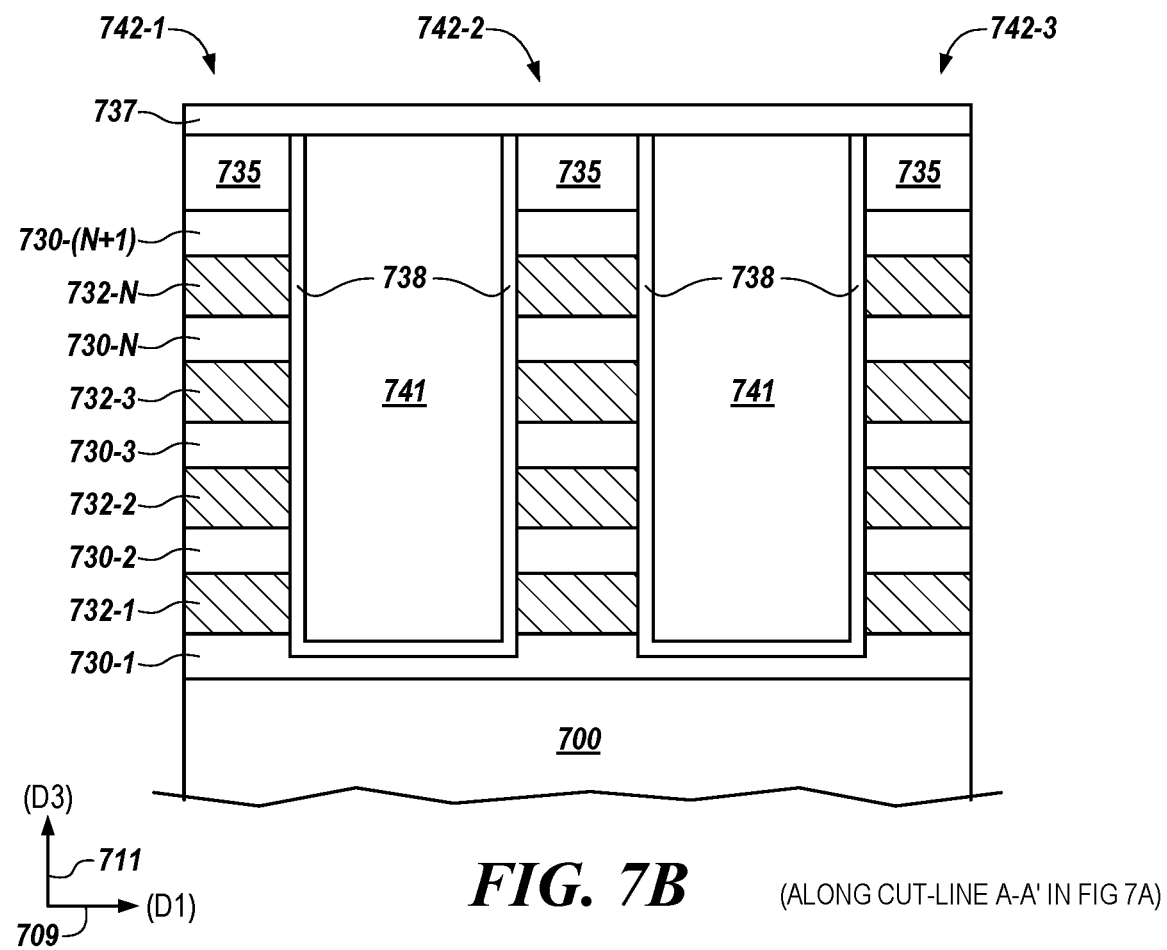
FIG. 7B (ALONG CUT-LINE A-A' IN FIG 7A)

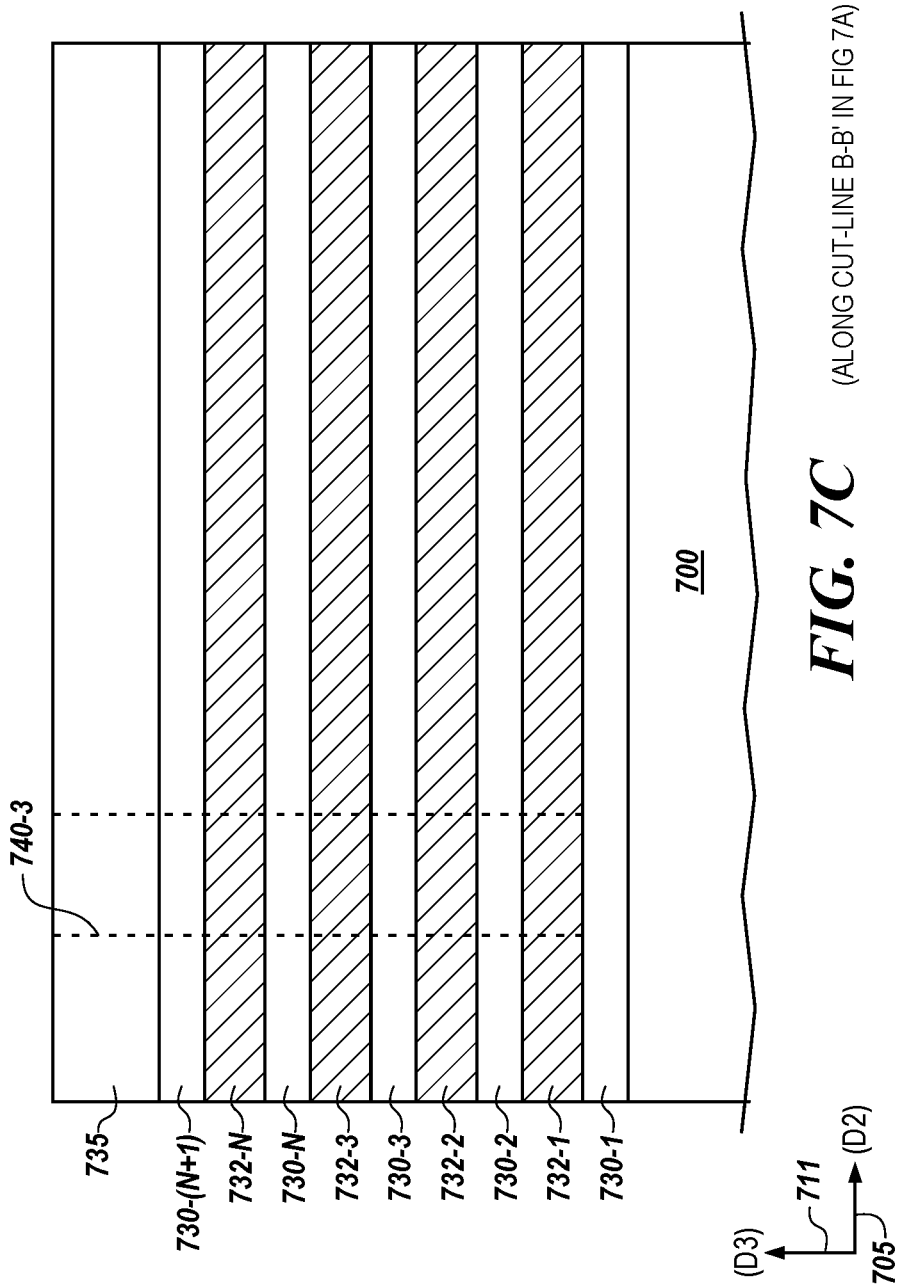

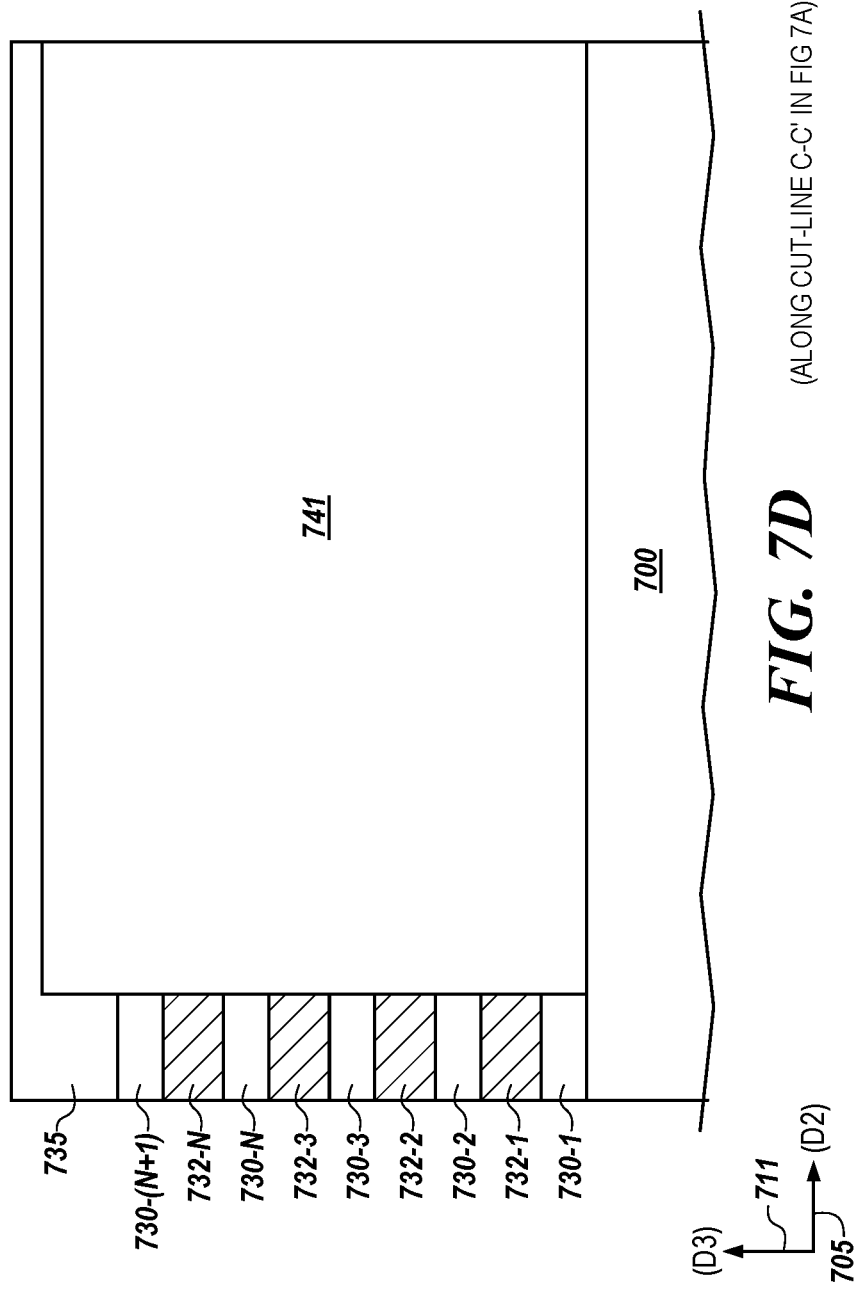
FIG. 7D (ALONG CUT-LINE C-C' IN FIG 7A)

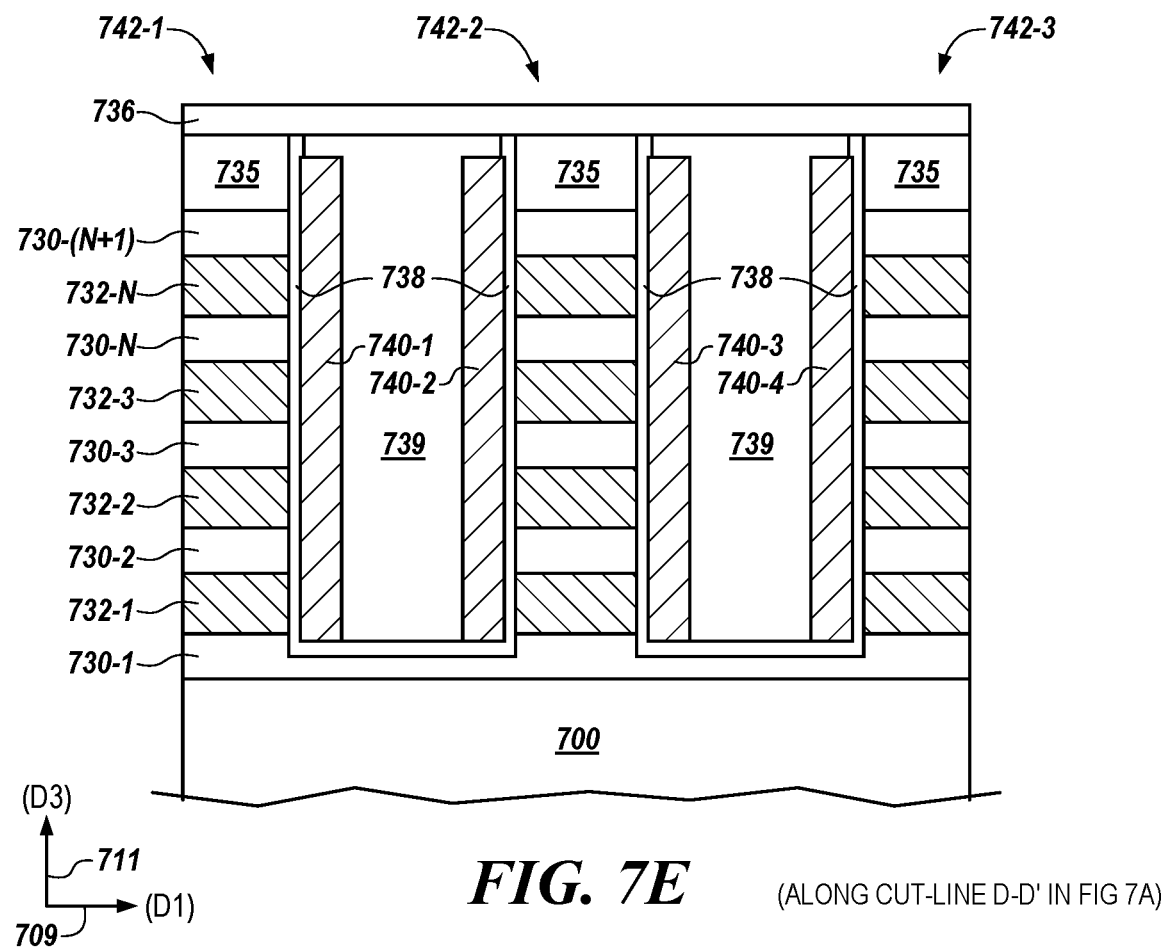
FIG. 7E (ALONG CUT-LINE D-D' IN FIG 7A)

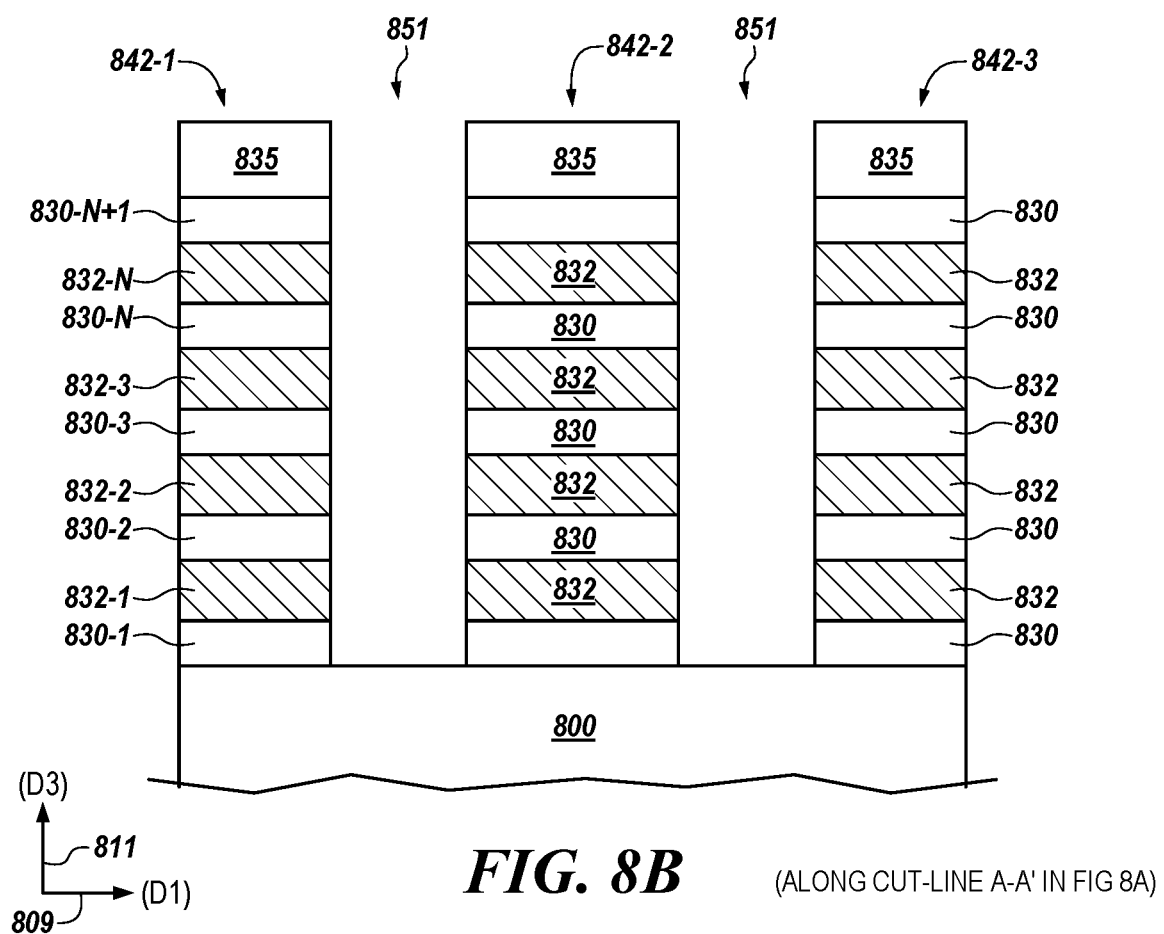
FIG. 8B (ALONG CUT-LINE A-A' IN FIG 8A)

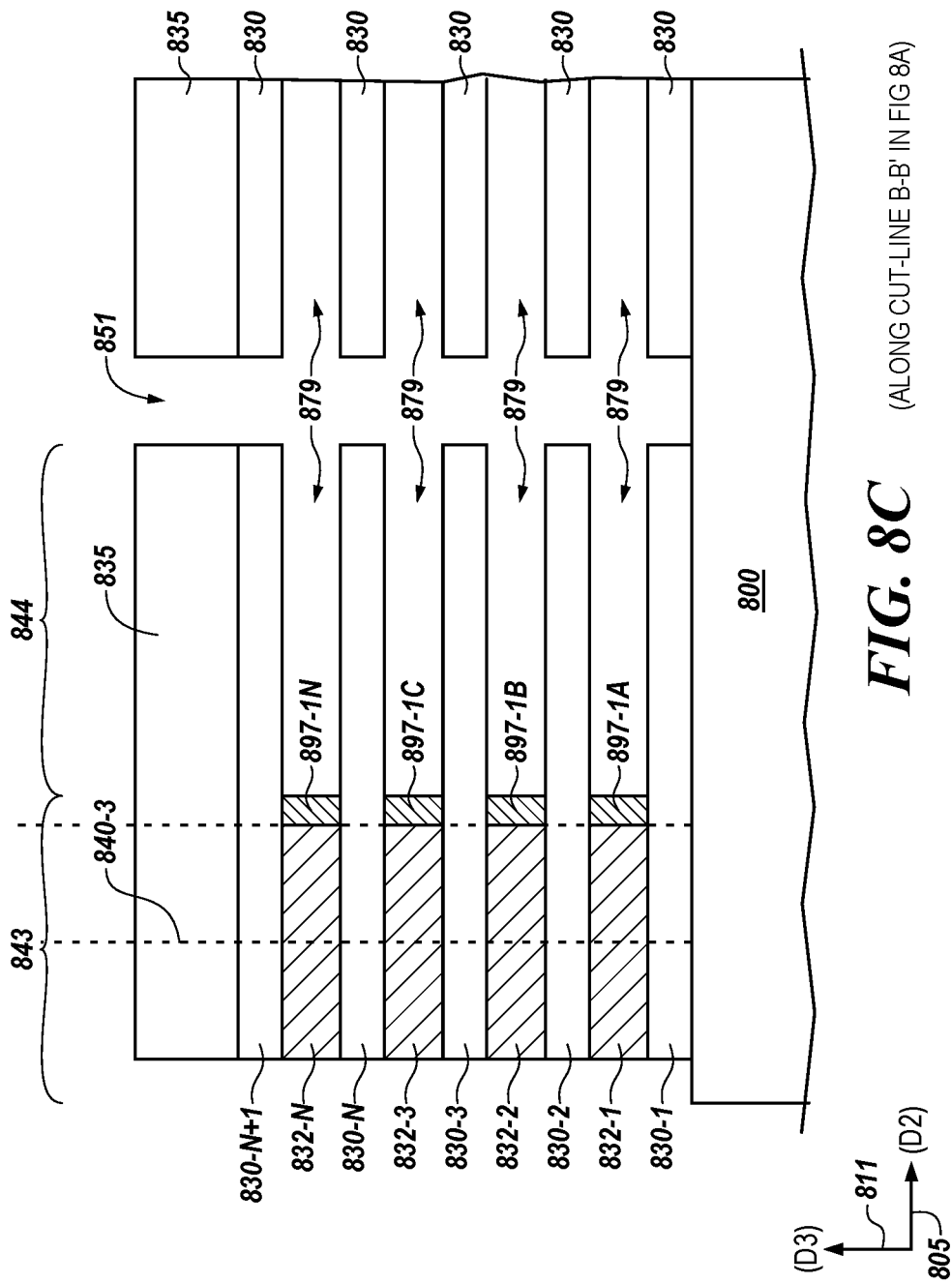
FIG. 8C (ALONG CUT-LINE B-B' IN FIG 8A)

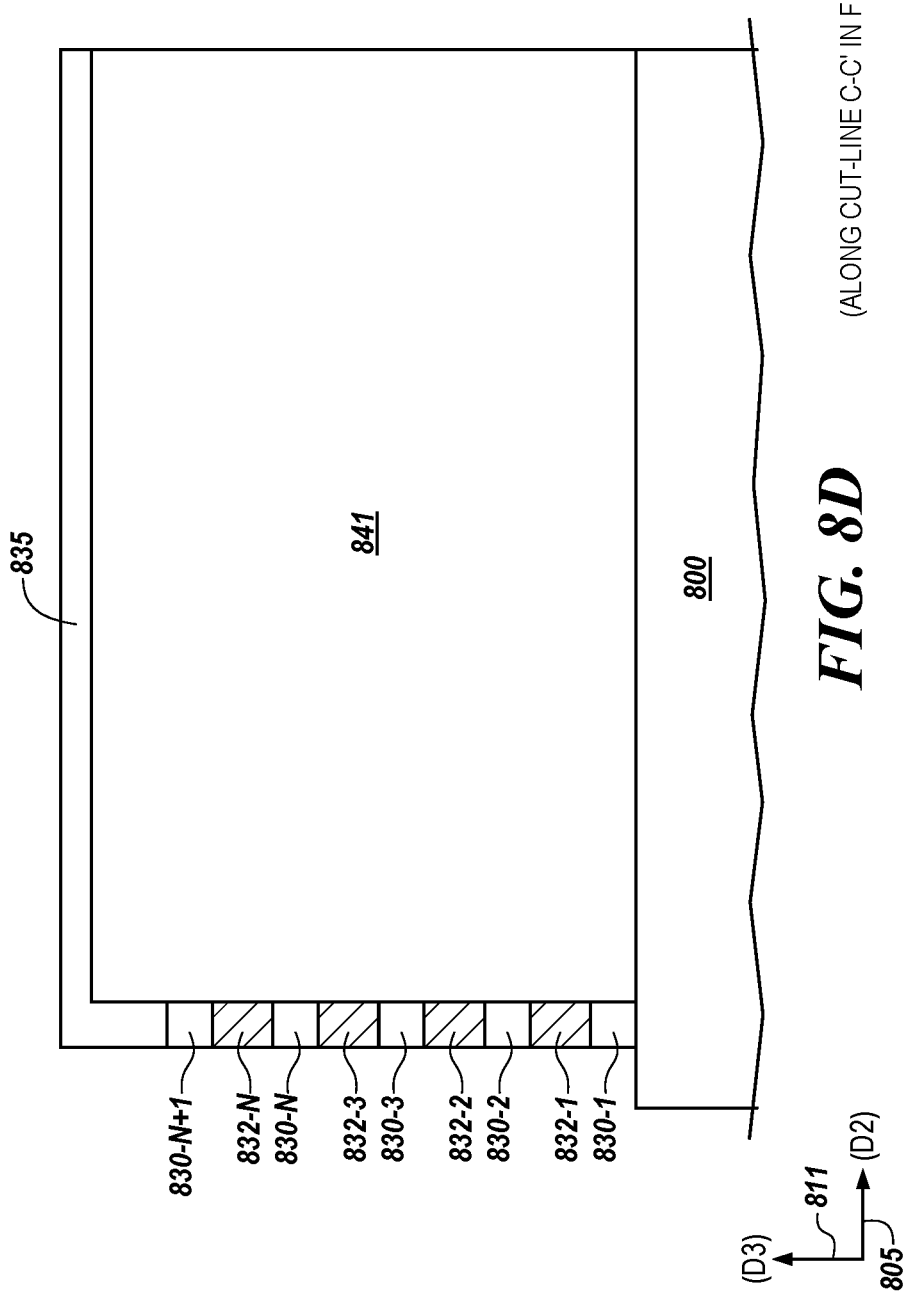

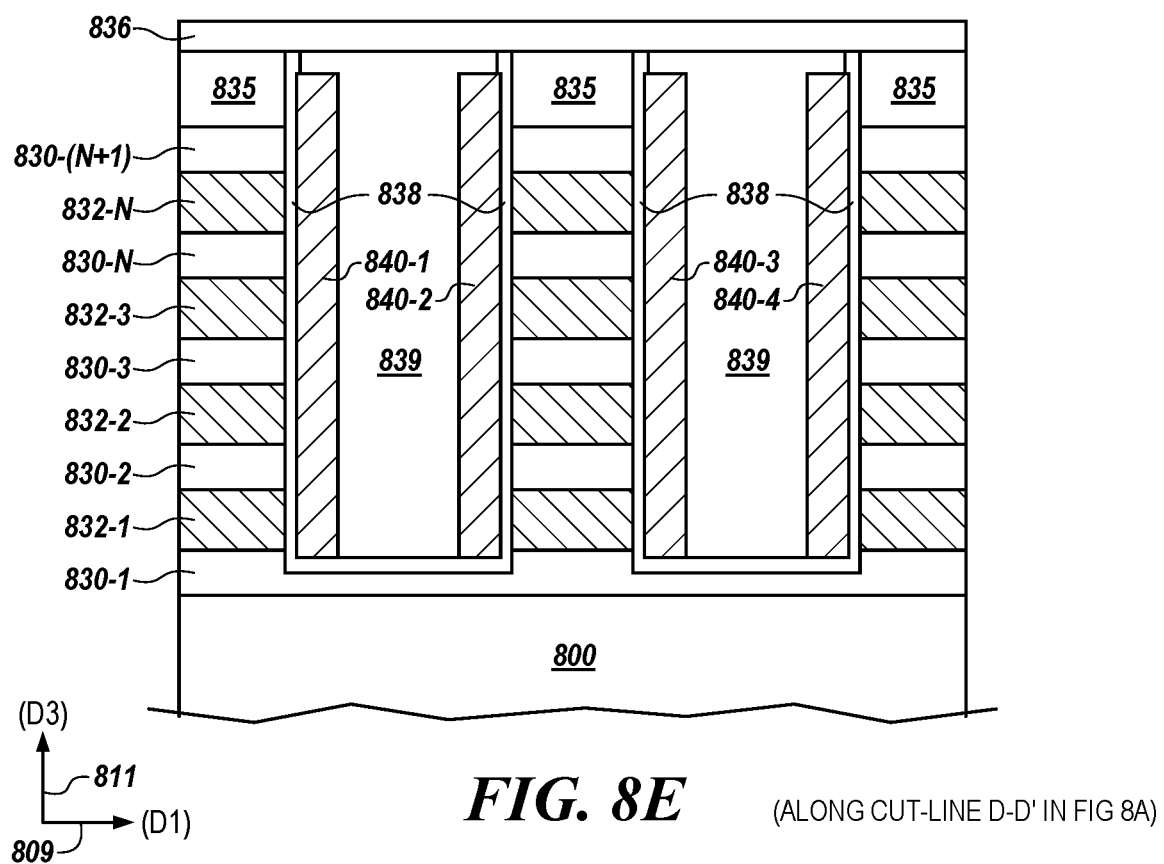
FIG. 8E  (ALONG CUT-LINE D-D' IN FIG 8A)

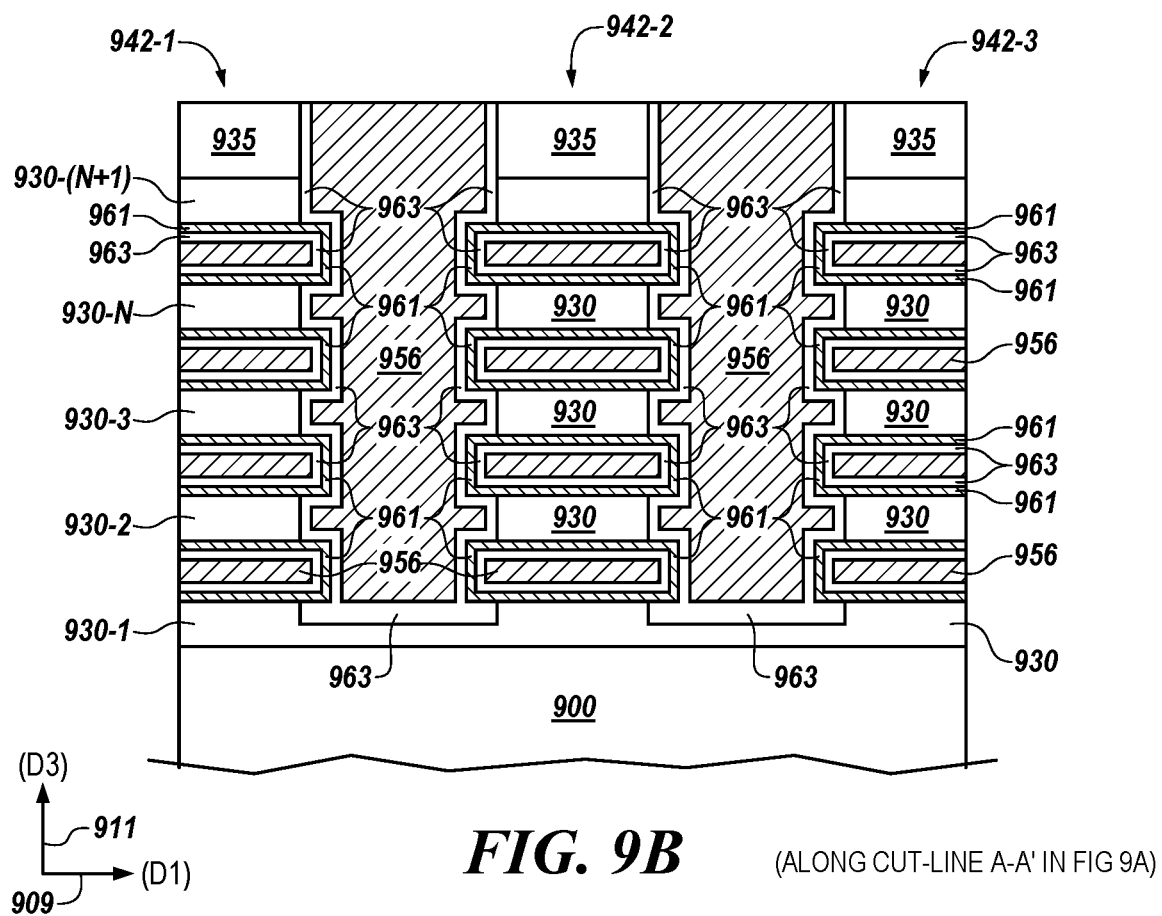
FIG. 9B (ALONG CUT-LINE A-A' IN FIG 9A)

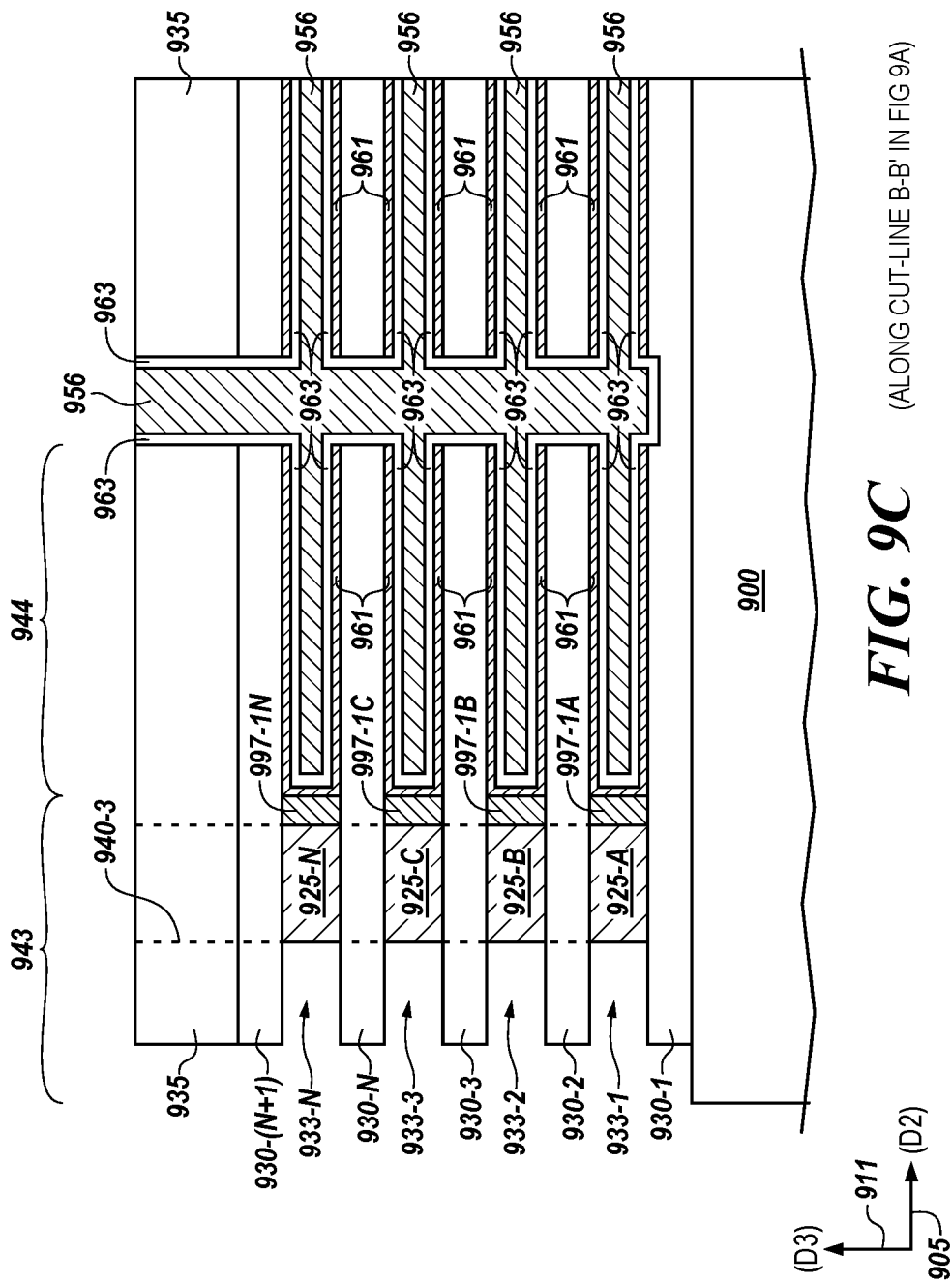
FIG. 9C (ALONG CUT-LINE B-B' IN FIG 9A)

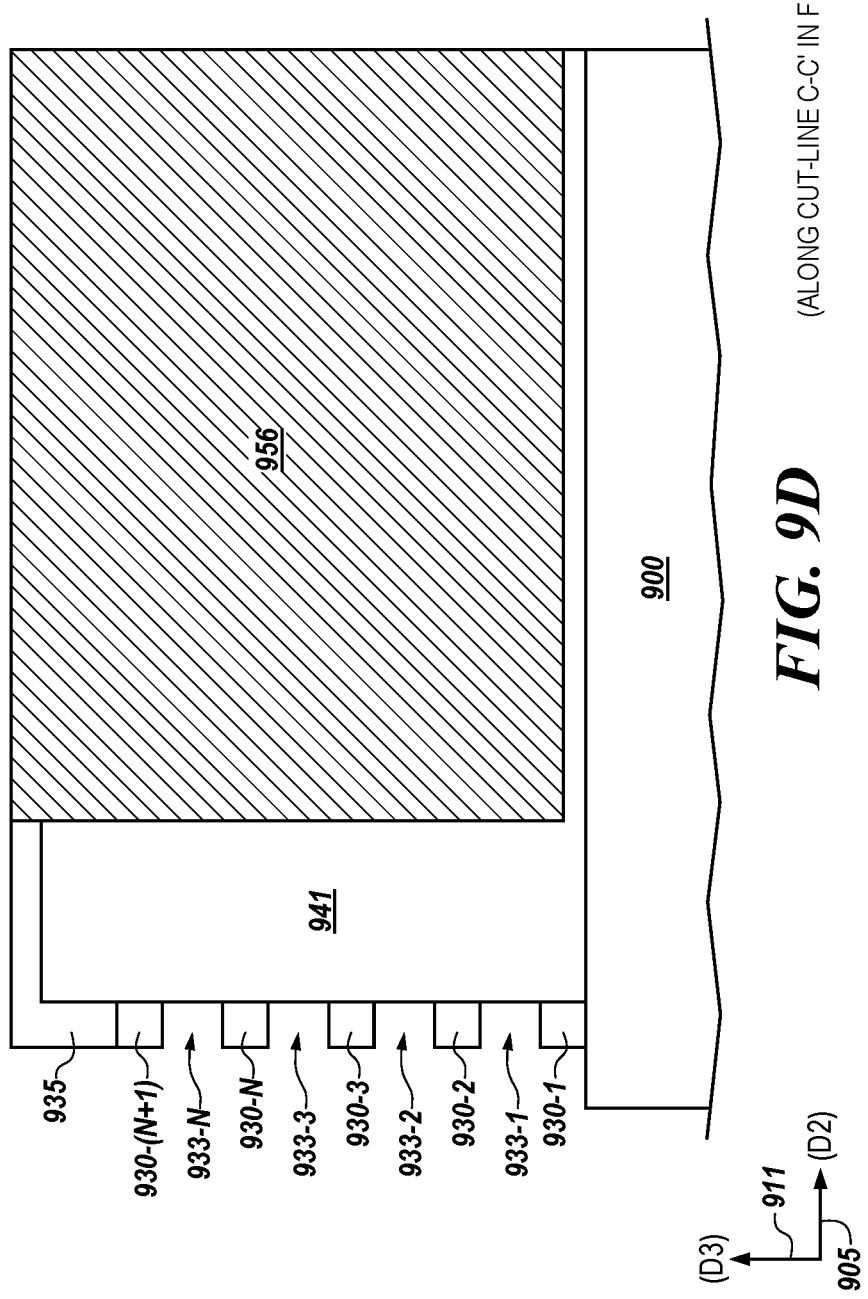

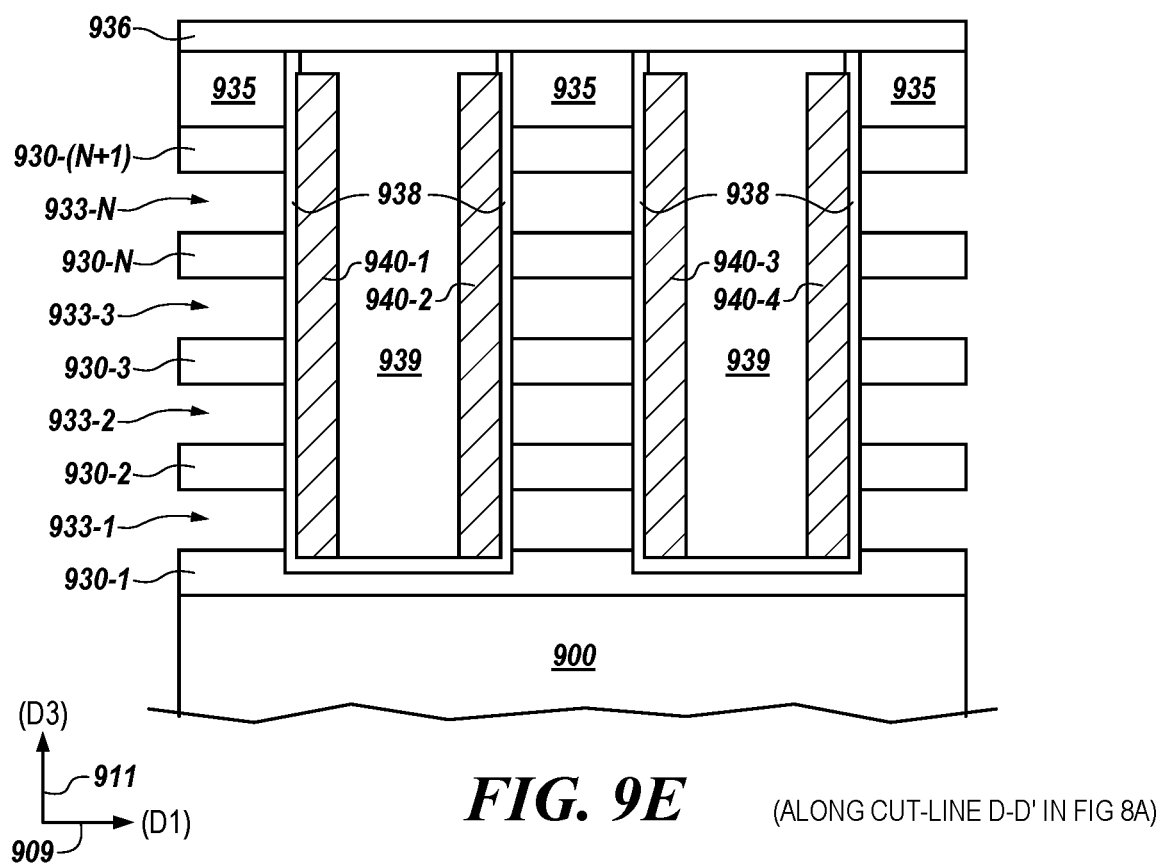
FIG. 9E (ALONG CUT-LINE D-D' IN FIG 8A)

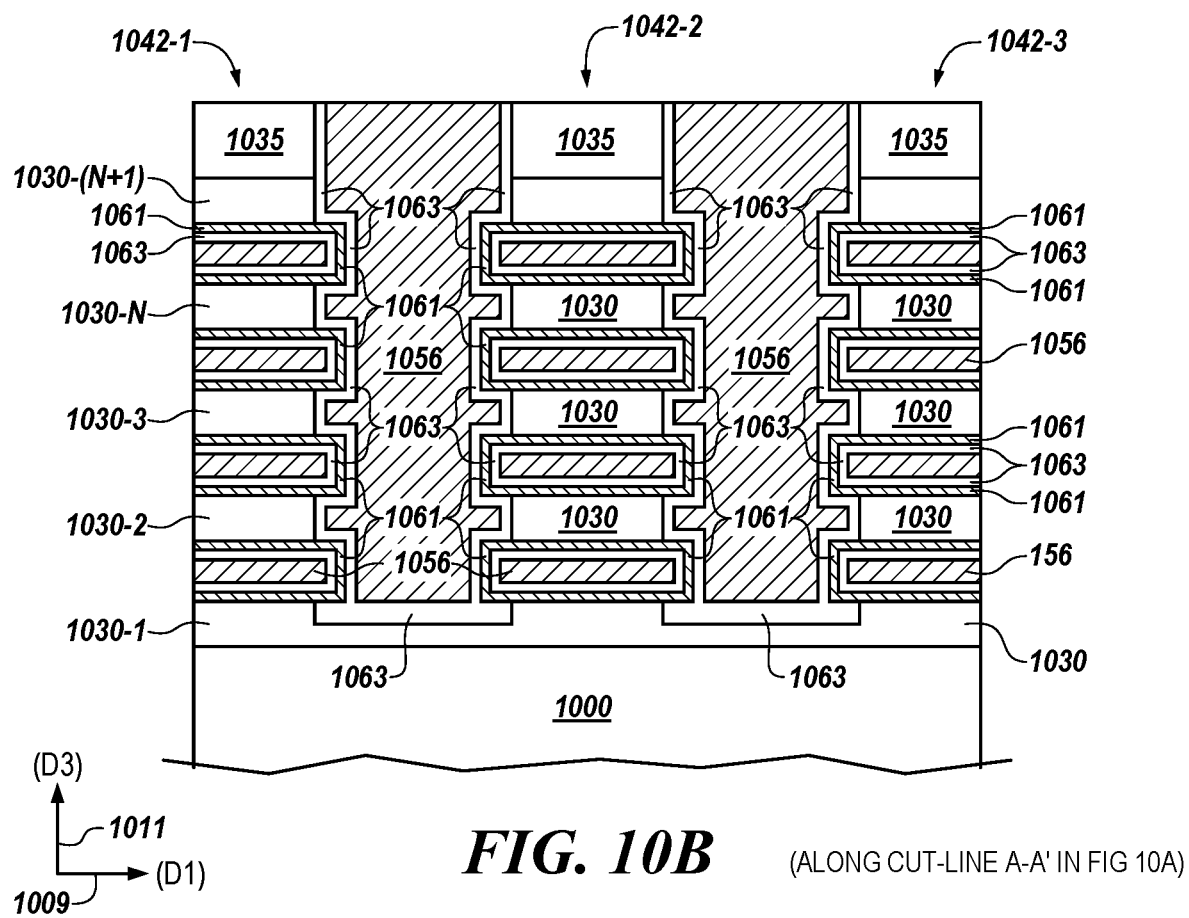
FIG. 10B (ALONG CUT-LINE A-A' IN FIG 10A)

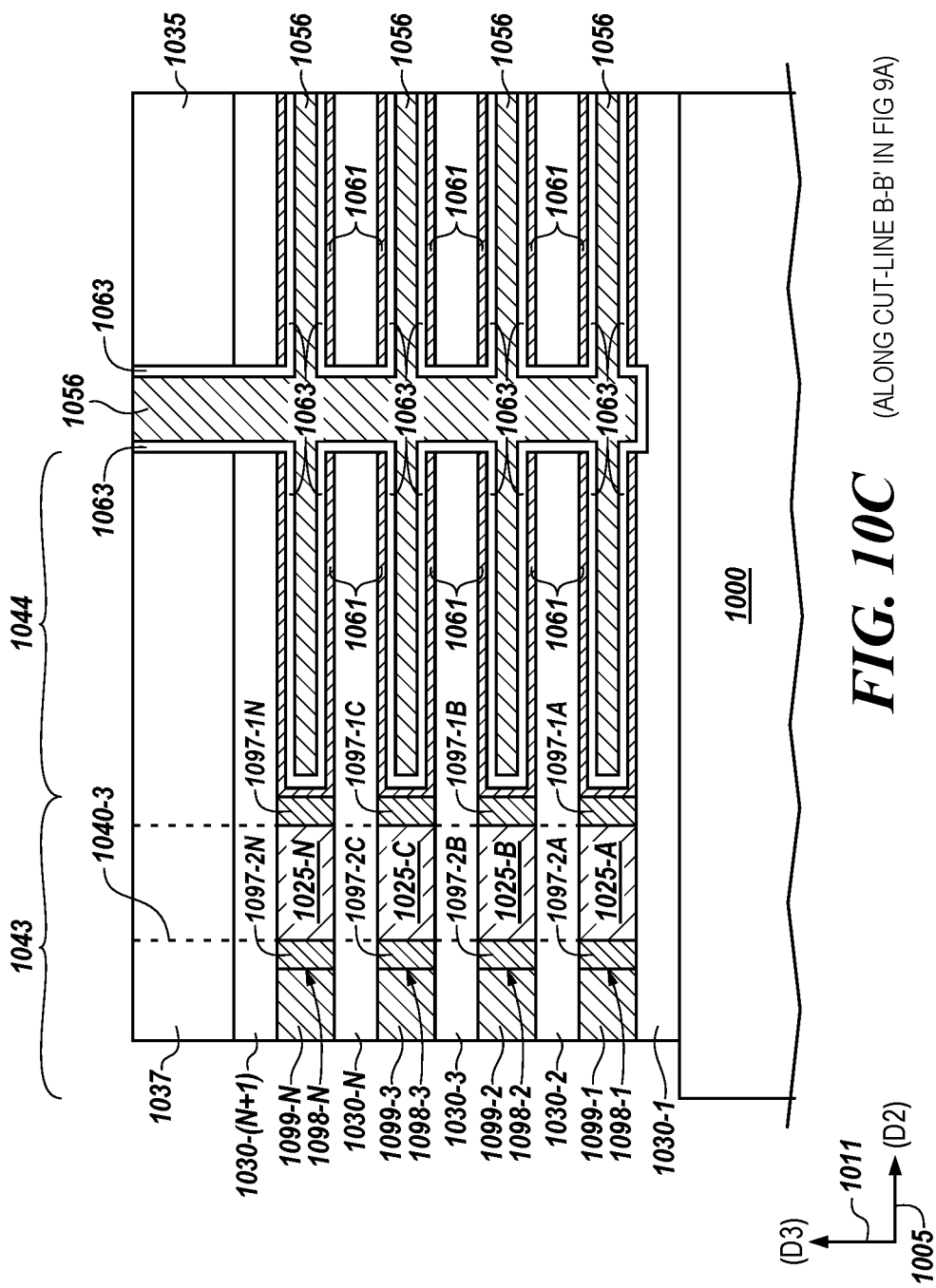
FIG. 10C (ALONG CUT-LINE B-B' IN FIG 9A)

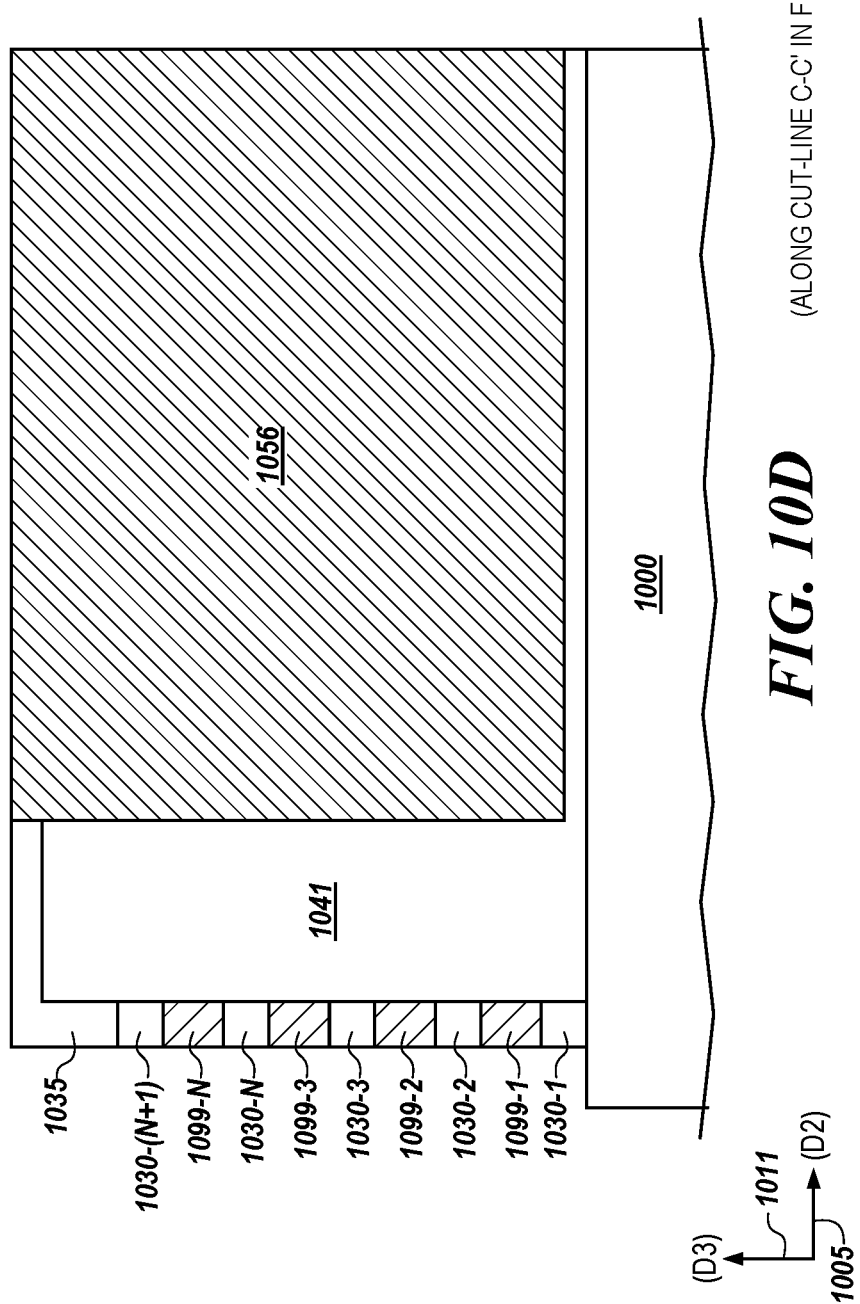

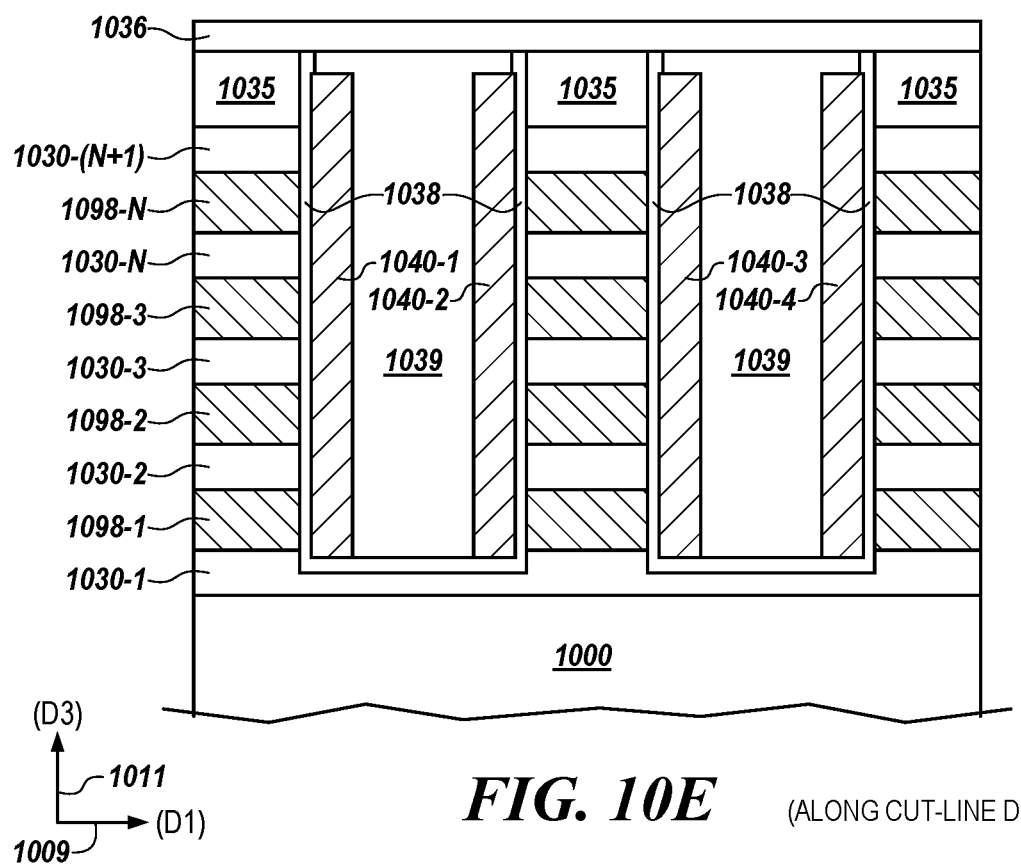
FIG. 10E (ALONG CUT-LINE D-D' IN FIG 10A)

CHANNEL FORMATION FOR VERTICAL THREE DIMENSIONAL (3D) MEMORY

TECHNICAL FIELD

The present disclosure relates generally to memory devices, and more particularly, to channel formation for vertical three dimensional (3D) memory.

BACKGROUND

Memory is often implemented in electronic systems, such as computers, cell phones, hand-held devices, etc. There are many different types of memory, including volatile and non-volatile memory. Volatile memory may require power to maintain its data and may include random-access memory (RAM), dynamic random-access memory (DRAM), static random-access memory (SRAM), and synchronous dynamic random-access memory (SDRAM). Non-volatile memory may provide persistent data by retaining stored data when not powered and may include NAND flash memory, NOR flash memory, nitride read only memory (NROM), phase-change memory (e.g., phase-change random access memory), resistive memory (e.g., resistive random-access memory), cross-point memory, ferroelectric random-access memory (FeRAM), or the like.

As design rules shrink, less semiconductor space is available to fabricate memory, including DRAM arrays. A respective memory cell for DRAM may include an access device, e.g., transistor, having a first and a second source/drain regions separated by a channel. A gate may oppose the channel and be separated therefrom by a gate dielectric. An access line, such as a word line, is electrically connected to the gate of the DRAM cell. A DRAM cell can include a storage node, such as a capacitor cell, coupled by the access device to a digit line. By way of example, and not by way of limitation, a storage node may include conductive material, such as ferroelectric material. The ferroelectric material may include, but is not limited, to zirconium oxide ($ZrO_2$), hafnium oxide ($HfO_2$), lanthanum oxide ($LaO_2$), and aluminum oxide ($Al_2O_3$), or a combination thereof. The access device can be activated (e.g., to select the cell) by an access line coupled to the access transistor. The capacitor can store a charge corresponding to a data value of a respective cell (e.g., a logic "1" or "0").

BRIEF DESCRIPTION OF THE DRAWINGS

FIGS. 6A-6D illustrate an example method, at another stage of a semiconductor fabrication process, for forming arrays of vertically stacked memory cells, having three-node horizontally oriented access devices and vertically oriented access lines, in accordance with a number of embodiments of the present disclosure.

FIGS. 7A-7E illustrate an example method, at another stage of a semiconductor fabrication process, for forming arrays of vertically stacked memory cells, having three-node, horizontally oriented access devices and vertically oriented access lines, in accordance with a number of embodiments of the present disclosure.

FIGS. 8A-8E illustrate an example method, at another stage of a semiconductor fabrication process, for forming arrays of vertically stacked memory cells, having three-node, horizontally oriented access devices and vertically oriented access lines, in accordance with a number of embodiments of the present disclosure.

FIGS. 9A-9E illustrate an example method, at another stage of a semiconductor fabrication process, for forming arrays of vertically stacked memory cells, having three-node, horizontally oriented access devices and vertically oriented access lines, in accordance with a number of embodiments of the present disclosure.

FIGS. 10A-10E illustrate an example method, at another stage of a semiconductor fabrication process, for forming arrays of vertically stacked memory cells, having three-node, horizontally oriented access devices and vertically oriented access lines, in accordance with a number of embodiments of the present disclosure.

DETAILED DESCRIPTION

Figure 1:
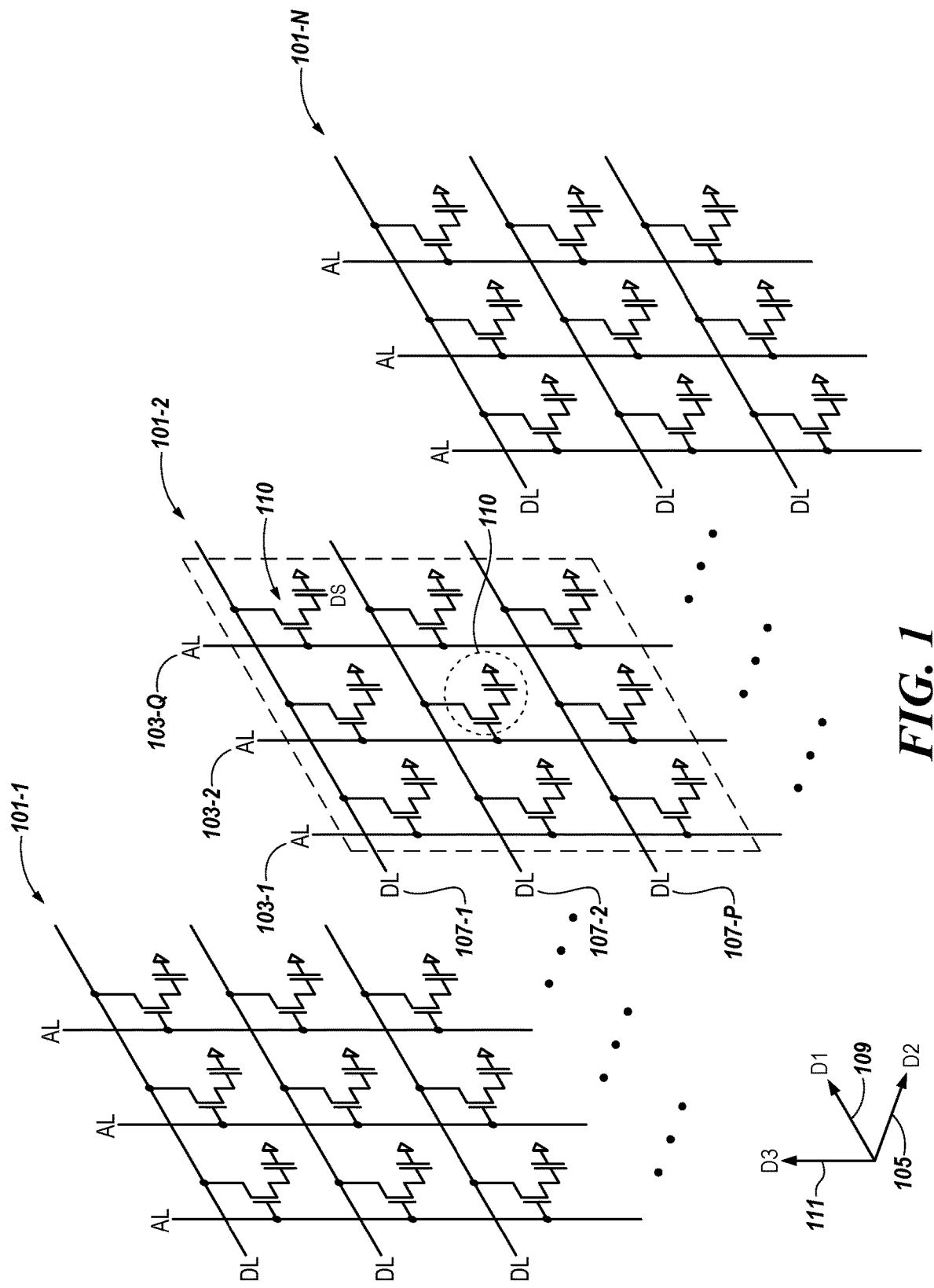
FIG. 1 is a schematic illustration of a vertical three dimensional (3D) memory in accordance a number of embodiments of the present disclosure.

Embodiments of the present disclosure describe a three-node access device for vertical three dimensional (3D) memory. As used herein, three-node is intended to refer to an access device comprising (1) a first source/drain region and (2) a second source/drain region separated by a channel, and (3) one or more gates(s) opposing the channel. In the three-node access device, the channel can be formed from a channel material and a passivation material. Forming the channel from a channel material and a passivation material may increase the stability of the channel in comparison to a channel that does not include a passivation material. Further advantages of the structure include decreasing the threshold voltage of the channel as well as decreasing the change of a threshold voltage of the channel over time.

In some embodiments channel fabrication steps may be performed after a capacitor cell formation process, thus reducing a thermal budget. The channel may be last element of the vertical stack that is formed in situ to decrease the amount of time the channel is exposed to heat during the memory device fabrication process.

The figures herein follow a numbering convention in which the first digit or digits correspond to the figure number of the drawing and the remaining digits identify an element or component in the drawing. Similar elements or components between different figures may be identified by the use of similar digits. For example, reference numeral 103 may reference element "03" in FIG. 1, and a similar element may be referenced as 203 in FIG. 2. Multiple analogous elements within one figure may be referenced with a reference numeral followed by a hyphen and another numeral or a letter. For example, 203-1 may reference element 203-1 in FIG. 2 and 203-2 may reference element 203-2, which may be analogous to element 203-1. Such analogous elements may be generally referenced without the hyphen and extra numeral or letter. For example, elements 203-1 and 203-2 or other analogous elements may be generally referenced as 203.

FIG. 1 is a block diagram of an apparatus in accordance a number of embodiments of the present disclosure. FIG. 1 illustrates a circuit diagram showing a cell array of a three dimensional (3D) semiconductor memory device according to embodiments of the present disclosure. FIG. 1 illustrates a cell array may have a plurality of sub cell arrays 101-1, 101-2, . . . , 101-N. The sub cell arrays 101-1, 101-2, . . . , 101-N may be arranged along a second direction (D2) 105. Each of the sub cell arrays, e.g., sub cell array 101-2, may include a plurality of access lines 103-1, 103-2, . . . , 103-Q (which also may be referred to a word lines). Also, each of the sub cell arrays, e.g., sub cell array 101-2, may include a plurality of digit lines 107-1, 107-2, . . . , 107-P (which also may be referred to as bit lines, data lines, or sense lines). In FIG. 1, the digit lines 107-1, 107-2, . . . , 107-P are illustrated extending in a first direction (D1) 109 and the access lines 103-1, 103-2, . . . , 103-Q are illustrated extending in a third direction (D3) 111. According to embodiments, the first direction (D1) 109 and the second direction (D2) 105 may be considered in a horizontal ("X-Y") plane. The third direction (D3) 111 may be considered in a vertical ("Z") plane. Hence, according to embodiments described herein, the access lines 103-1, 103-2, . . . , 103-Q are extending in a vertical direction, e.g., third direction (D3) 111.

A memory cell, e.g., 110, may include an access device, e.g., access transistor, and a storage node located at an intersection of each access line 103-1, 103-2, . . . , 103-Q and each digit line 107-1, 107-2, . . . , 107-P. Memory cells may be written to, or read from, using the access lines 103-1, 103-2, . . . , 103-Q and digit lines 107-1, 107-2, . . . , 107-P. The digit lines 107-1, 107-2, . . . , 107-P may conductively interconnect memory cells along horizontal columns of each sub cell array 101-, 101-2, . . . , 101-N, and the access lines 103-1, 103-2, . . . , 103-Q may conductively interconnect memory cells along vertical rows of each sub cell array 101-, 101-2, . . . , 101-N. One memory cell, e.g. 110, may be located between one access line, e.g., 103-2, and one digit line, e.g., 107-2. Each memory cell may be uniquely addressed through a combination of an access line 103-1, 103-2, . . . , 103-Q and a digit line 107-1, 107-2, . . . , 107-P.

The digit lines 107-1, 107-2, . . . , 107-P may be or include conducting patterns (e.g., metal lines) disposed on and spaced apart from a substrate. The digit lines 107-1, 107-2, . . . , 107-P may extend in a first direction (D1) 109. The digit lines 107-1, 107-2, . . . , 107-P in one sub cell array, e.g., 101-2, may be spaced apart from each other in a vertical direction, e.g., in a third direction (D3) 111.

The access lines 103-1, 103-2, . . . , 103-Q may be or include conductive patterns (e.g., metal lines) extending in a vertical direction with respect to the substrate, e.g., in a third direction (D3) 111. The access lines in one sub cell array, e.g., 101-2, may be spaced apart from each other in the first direction (D1) 109.

A gate of a memory cell, e.g., memory cell 110, may be connected to an access line, e.g., 103-2, and a first conductive node, e.g., first source/drain region, of an access device, e.g., transistor, of the memory cell 110 may be connected to a digit line, e.g., 107-2. Each of the memory cells, e.g., memory cell 110, may be connected to a storage node, e.g., capacitor. A second conductive node, e.g., second source/drain region, of the access device, e.g., transistor, of the memory cell 110 may be connected to the storage node, e.g., capacitor. While first and second source/drain region reference are used herein to denote two separate and distinct source/drain regions, it is not intended that the source/drain region referred to as the "first" and/or "second" source/drain regions have some unique meaning. It is intended only that one of the source/drain regions is connected to a digit line, e.g., 107-2, and the other may be connected to a storage node.

Figure 2:
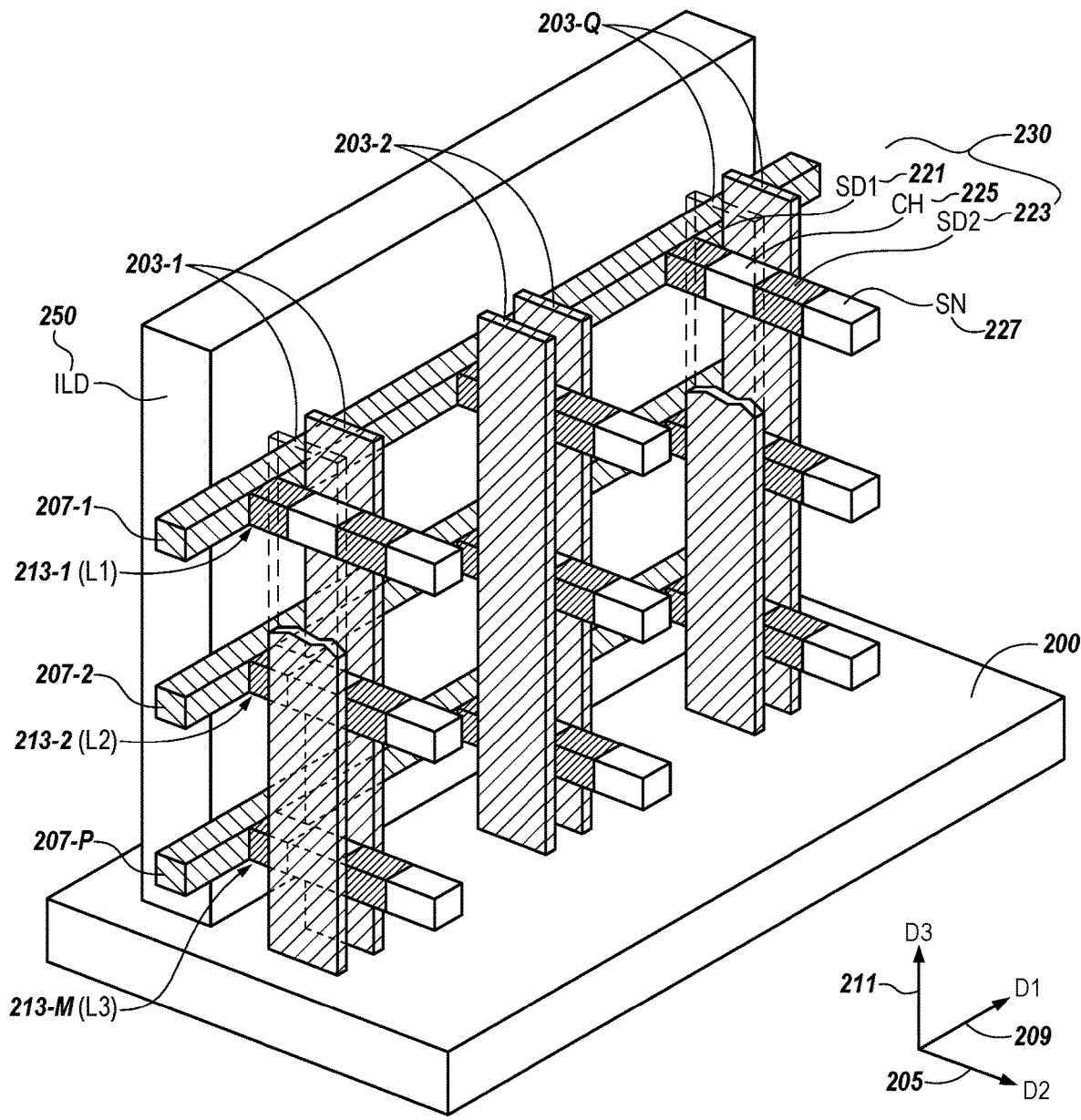
FIG. 2 is a perspective view illustrating a portion of a three-node access device in a vertical three dimensional (3D) memory array in accordance with a number of embodiments of the present disclosure.
Figure 3:
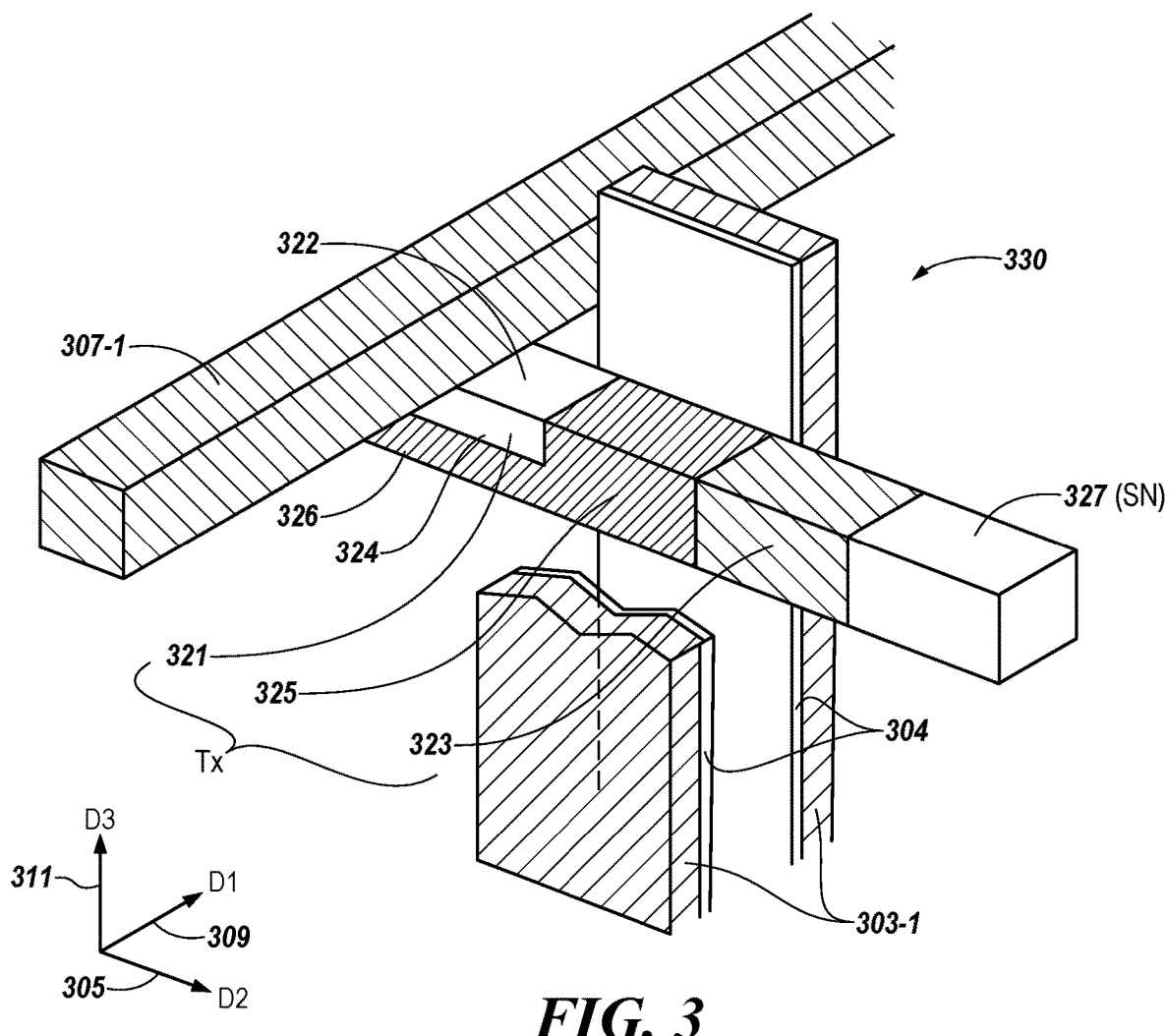
FIG. 3 is a perspective view illustrating a portion of a three-node access device in a vertical three dimensional (3D) memory cell in accordance with a number of embodiments of the present disclosure.

FIG. 2 illustrates a perspective view showing a three dimensional (3D) semiconductor memory device, e.g., a portion of a sub cell array 101-2 shown in FIG. 1 as a vertically oriented stack of memory cells in an array, according to some embodiments of the present disclosure. FIG. 3 illustrates a perspective view showing unit cell, e.g., memory cell 110 shown in FIG. 1, of the 3D semiconductor memory device shown in FIG. 2.

As shown in FIG. 2, a substrate 200 may have formed thereon one of the plurality of sub cell arrays, e.g., 101-2, described in connection with FIG. 1. For example, the substrate 200 may be or include a silicon substrate, a germanium substrate, or a silicon-germanium substrate, etc. Embodiments, however, are not limited to these examples.

As shown in the example embodiment of FIG. 2, the substrate 200 may have fabricated thereon a vertically oriented stack of memory cells, e.g., memory cell 110 in FIG. 1, extending in a vertical direction, e.g., third direction (D3) 111. According to some embodiments, the vertically oriented stack of memory cells may be fabricated such that each memory cell, e.g., memory cell 110 in FIG. 1, is formed on plurality of vertical levels, e.g., a first level (L1), a second level (L2), and a third level (L3). The repeating, vertical levels, L1, L2, and L3, may be arranged, e.g., "stacked", a vertical direction, e.g., third direction (D3) 111 shown in FIG. 1. Each of the repeating, vertical levels, L1, L2, and L3 may include a plurality of discrete components, e.g., regions, to the laterally oriented access devices 230, e.g., transistors, and storage nodes, e.g., capacitors, including access line 203-1, 203-2, . . . , 203-Q connections and digit line 207-1, 207-2, . . . , 207-P connections. The plurality of discrete components to the horizontally oriented, three-node access devices, e.g., transistors 110 in FIG. 1, may be formed in a plurality of iterations of vertically, repeating layers within each level, as described in more detail below in connection with FIGS. 4A-4E, and may extend horizontally in the second direction (D2) 205, analogous to second direction (D2) 105 shown in FIG. 1.

The plurality of discrete components to the horizontally oriented three-node access devices 230, e.g., transistors, may include a first source/drain region 221 and a second source/drain region 223 separated by a channel 225, extending laterally in the second direction (D2) 205. In some embodiments, the channel 225 may include silicon, germanium, silicon-germanium, and/or indium gallium zinc oxide (IGZO). In some embodiments, the first and the second source/drain regions, 221 and 223, can include an n-type dopant region, e.g., semiconductor material, formed adjacent to a p-type doped channel, e.g., semiconductor material, of the access device to form an n-type conductivity transistor. In some embodiments, the first and the second source/drain regions, 221 and 223, may include a p-type conductivity, e.g., doped semiconductor material, formed adjacent to an n-type conductivity channel, e.g., doped semiconductor material, of the access device to form a p-type conductivity transistor. By way of example, and not by way of limitation, the n-type dopant may include Phosphorous (P)

atoms and the p-type dopant may include atoms of Boron (B) formed in an oppositely doped body region of polysilicon semiconductor material. Embodiments, however, are not limited to these examples.

The storage node 227, e.g., capacitor, may be connected to one respective end of the access device. As shown in FIG. 2, the storage node 227, e.g., capacitor may be connected to the second source/drain region 223 of the access device. The storage node may be or include memory elements capable of storing data. Each of the storage nodes may be a memory element using one of a capacitor, a magnetic tunnel junction pattern, and/or a variable resistance body which includes a phase change material, etc. Embodiments, however, are not limited to these examples. In some embodiments, the storage node associated with each access device of a unit cell, e.g., memory cell 110 in FIG. 1, may similarly extend in the second direction (D2) 205, analogous to second direction (D2) 105 shown in FIG. 1.

As shown in FIG. 2 a plurality of horizontally oriented digit lines 207-1, 207-2, . . . , 207-P extend in the first direction (D1) 209, analogous to the first direction (D1) 109 in FIG. 1. The plurality of horizontally oriented digit lines 207-1, 207-2, . . . , 207-P may be analogous to the digit lines 107-1, 107-2, . . . , 107-P shown in FIG. 1. The plurality of horizontally oriented digit lines 207-1, 207-2, . . . , 207-P may be arranged, e.g., "stacked", along the third direction (D3) 211. The plurality of horizontally oriented digit lines 207-1, 207-2, . . . , 207-P may include a conductive material. For example, the conductive material may include one or more of a doped semiconductor, e.g., doped silicon, doped germanium, etc., a conductive metal nitride, e.g., titanium nitride, tantalum nitride, etc., a metal, e.g., tungsten (W), titanium (Ti), tantalum (Ta), etc., and/or a metal-semiconductor compound, e.g., tungsten silicide, cobalt silicide, titanium silicide, etc. Embodiments, however, are not limited to these examples.

Among each of the vertical levels, (L1) 213-1, (L2) 213-2, and (L3) 213-M, the horizontally oriented memory cells, e.g., memory cell 110 in FIG. 1, may be spaced apart from one another horizontally in the first direction (D1) 209. However, as described in more detail below in connection with FIGS. 4A-4E, the plurality of discrete components to the laterally oriented access devices 230, e.g., first source/drain region 221 and second source/drain region 223 separated by a channel 225, extending laterally in the second direction (D2) 205, and the plurality of horizontally oriented digit lines 207-1, 207-2, . . . , 207-P extending laterally in the first direction (D1) 209, may be formed within different vertical layers within each level. For example, the plurality of horizontally oriented digit lines 207-1, 207-2, . . . , 207-P, extending in the first direction (D1) 209, may be disposed on, and in electrical contact with, top surfaces of first source/drain regions 221 and orthogonal to laterally oriented access devices 230, e.g., transistors, extending in laterally in the second direction (D2) 205. In some embodiments, the plurality of horizontally oriented digit lines 207-1, 207-2, . . . , 207-P, extending in the first direction (D1) 209 are formed in a higher vertical layer, farther from the substrate 200, within a level, e.g., within level (L1), than a layer in which the discrete components, e.g., first source/drain region 221 and second source/drain region 223 separated by a channel 225, of the laterally oriented access device are formed. In some embodiments, the plurality of horizontally oriented digit lines 207-1, 207-2, . . . , 207-P, extending in the first direction (D1) 209, may be connected to the top surfaces of the first source/drain regions 221 directly and/or through additional contacts including metal silicides.

As shown in the example embodiment of FIG. 2, the access lines, 203-1, 203-2, . . . , 203-Q, extend in a vertical direction with respect to the substrate 200, e.g., in a third direction (D3) 211. Further, as shown in FIG. 2, the access lines, 203-1, 203-2, . . . , 203-Q, in one sub cell array, e.g., sub cell array 101-2 in FIG. 1, may be spaced apart from each other in the first direction (D1) 209. The access lines, 203-1, 203-2, . . . , 203-Q, may be provided, extending vertically relative to the substrate 200 in the third direction (D3) 211 between a pair of the horizontally oriented, three-node access devices 230, e.g., transistors, extending laterally in the second direction (D2) 205, but adjacent to each other on a level, e.g., first level (L1), in the first direction (D1) 209. Each of the access lines, 203-1, 203-2, . . . , 203-Q, may vertically extend, in the third direction (D3), on sidewalls of respective ones of the plurality of horizontally oriented, three-node access devices 230, e.g., transistors, that are vertically stacked.

For example, and as shown in more detail in FIG. 3, a first one of the vertically extending access lines, e.g., 203-1, may be adjacent a sidewall of a channel 225 to a first one of the horizontally oriented, three-node access devices 230, e.g., transistors, in the first level (L1) 213-1, a sidewall of a channel 225 of a first one of the horizontally oriented, three-node access devices 230, e.g., transistors, in the second level (L2) 213-2, and a sidewall of a channel 225 a first one of the horizontally oriented, three-node access devices 230, e.g., transistors, in the third level (L3) 213-M, etc. Similarly, a second one of the vertically extending access lines, e.g., 203-2, may be adjacent a sidewall to a channel 225 of a second one of the horizontally oriented, three-node access devices 230, e.g., transistors, in the first level (L1) 213-1, spaced apart from the first one of horizontally oriented, three-node access devices 230, e.g., transistors, in the first level (L1) 213-1 in the first direction (D1) 209. And the second one of the vertically extending access lines, e.g., 203-2, may be adjacent a sidewall of a channel 225 of a second one of the horizontally oriented, three-node access devices 230, e.g., transistors, in the second level (L2) 213-2, and a sidewall of a channel 225 of a second one of the horizontally oriented, three-node access devices 230, e.g., transistors, in the third level (L3) 213-M, etc. Embodiments are not limited to a particular number of levels.

The vertically extending access lines, 203-1, 203-2, . . . , 203-Q, may include a conductive material, such as, for example, one of a doped semiconductor material, a conductive metal nitride, metal, and/or a metal-semiconductor compound. The access lines, 203-1, 203-2, . . . , 203-Q, may correspond to word lines (WL) described in connection with FIG. 1.

As shown in the example embodiment of FIG. 2, an insulating layer dielectric (ILD) 250 may be formed extending in the first direction (D1) 209 along an end surface of the horizontally oriented, three-node access devices 230, e.g., transistors, in each level (L1) 213-1, (L2) 213-2, and (L3) 213-M above the substrate 200. The ILD 250 may isolate and separate the arrays of vertically stacked memory cells, e.g., 101-1, 101-2, . . . , 101-N in FIG. 1, along the second direction (D2) 205. The ILD 250 may include an insulating material, e.g., dielectric material, such as, for example, one of an oxide material, silicon oxide ($SiO_2$) material, silicon nitride (SiN) material, silicon oxynitride material, and/or combination thereof, etc.

Although not shown in FIG. 2, an insulating material may fill other spaces in the vertically stacked array of memory cells. For example, the insulating material may include one or more of a silicon oxide material, a silicon nitride material, and/or a silicon oxynitride material, etc. Embodiments, however, are not limited to these examples.

FIG. 3 illustrates in more detail a unit cell, e.g., memory cell 110 in FIG. 1, of the vertically stacked array of memory cells, e.g., within a sub cell array 101-2 in FIG. 1, according to some embodiments of the present disclosure. As shown in FIG. 3, the first and the second source/drain regions, 321 and 323, may be impurity doped regions to the laterally oriented access devices 330, e.g., transistors. The first and the second source/drain regions, 321 and 323, may be analogous to the first and the second source/drain regions 221 and 223 shown in FIG. 2. A storage node 327 may be connected to the second source/drain region 323. The first and the second source/drain regions 321 and 323 may be separated by a channel 325 formed in a body of semiconductor material, e.g., body region 326, of the laterally oriented access devices 230, e.g., transistors. The first and the second source/drain regions, 321 and 323, may be formed from an n-type or p-type dopant doped in the body region 326. Embodiments are not so limited.

For example, for an n-type conductivity transistor construction the body region 326 of the laterally oriented access devices 230, e.g., transistors, may be formed of a low doped (p−) p-type semiconductor material. In one embodiment, the body region 326 and the channel 325 separating the first and the second source/drain regions, 321 and 323, may include a low doped, p-type (e.g., low dopant concentration (p−)) polysilicon material consisting of Boron (B) atoms as an impurity dopant to the polycrystalline silicon. In this example, the first and the second source/drain regions, 321 and 323, may include a high dopant concentration, n-type conductivity impurity (e.g., high dopant (n+)) doped in the first and the second source/drain regions, 321 and 323. In some embodiments, the high dopant, n-type conductivity first and second drain regions 321 and 323 may include a high concentration of Phosphorus (P) atoms deposited therein. Embodiments, however, are not limited to this example. In other embodiments, the laterally oriented access devices 230, e.g., transistors, may be of a p-type conductivity construction in which case the impurity, e.g., dopant, conductivity types would be reversed.

As shown in the example embodiment of FIG. 3, the first source/drain region 321 may occupy an upper portion in the body 326 of the laterally oriented access devices 330, e.g., transistors. For example, the first source/drain region 321 may have a bottom surface 324 within the body 326 of the laterally oriented access device 330 which is located higher, vertically in the third direction (D3) 311, than a bottom surface of the body 326 of the laterally, horizontally oriented access device 330. As such, the laterally, horizontally oriented transistor 330 may have a body portion 326 which is below the first source/drain region 321. Further, as shown in the example embodiment of FIG. 3, a digit line, e.g., 307-1, analogous to the digit lines 207-1, 207-2, . . . , 207-P in FIG. 2 and 107-1, 107-2, . . . , 107-P shown in FIG. 1, may disposed on a top surface 322 of the first source/drain region 321 and electrically coupled thereto. Digit line 307-1 may extend in a first direction (D1) 309.

As shown in the example embodiment of FIG. 3, an access line, e.g., 303-1, analogous to the access lines 203-1, 203-2, . . . , 203-Q in FIG. 2 and 103-1, 103-2, . . . , 103-Q in FIG. 1, may be vertically extending in the third direction (D3) 311 adjacent sidewall of the channel 325 portion of the body 326 to the laterally oriented access devices 330, e.g., transistors horizontally conducting between the first and the second source/drain regions 321 and 323 along the second direction (D2) 305. A gate dielectric material 304 may be interposed between the access line 303-1 (a portion thereof forming a gate to the laterally oriented access devices 330, e.g., transistors) and the channel 325. The gate dielectric material 304 may include, for example, a high-k dielectric material, a silicon oxide material, a silicon nitride material, a silicon oxynitride material, etc., or a combination thereof. Embodiments are not so limited. For example, in high-k dielectric material examples the gate dielectric material 304 may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobite, etc.

FIGS. 4A-4D are cross-sectional views for forming arrays of vertically stacked memory cells, at multiple stages of a semiconductor fabrication process, to form a channel for vertical 3D memory, in accordance with a number of embodiments of the present disclosure.

Figure 4A:
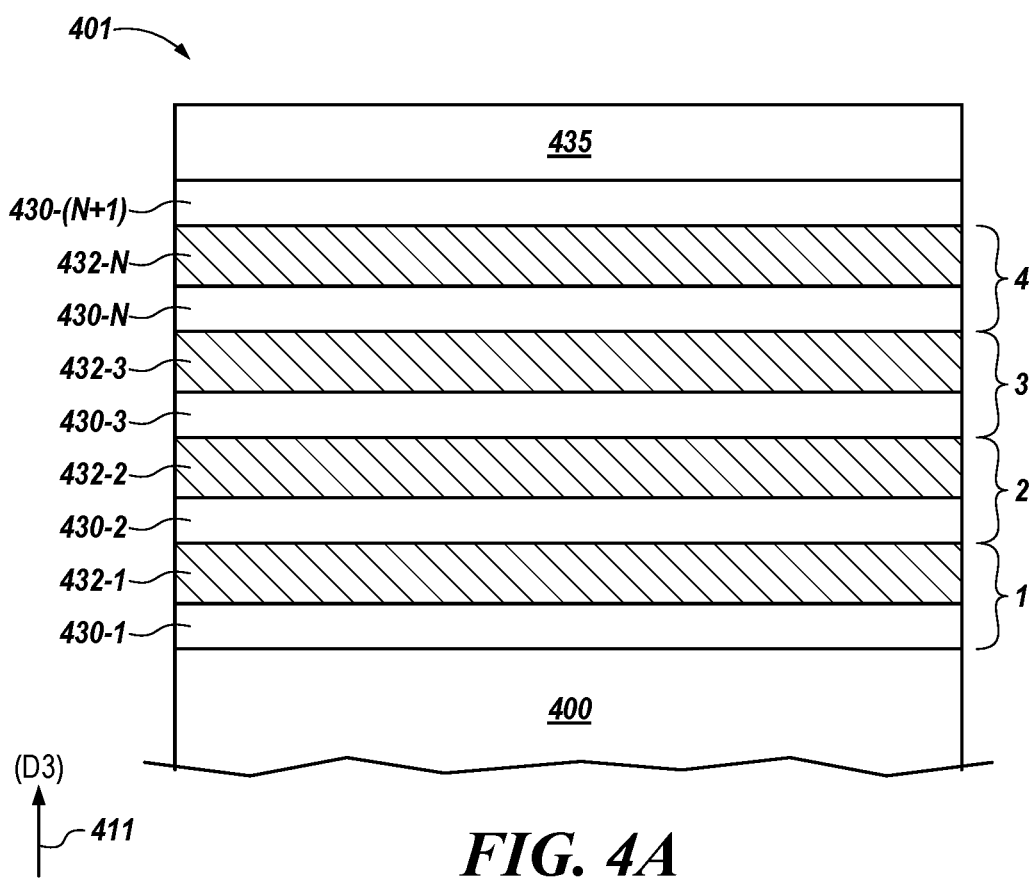
FIGS. 4A-4D are cross-sectional views for forming arrays of vertically stacked memory cells, at multiple stages of a semiconductor fabrication process, to form a channel for vertical three dimensional memory, in accordance with a number of embodiments of the present disclosure.

FIG. 4A is a cross-sectional view at one stage of the semiconductor fabrication process for forming arrays of vertically stacked memory cells, at multiple stages of a semiconductor fabrication process, to form a channel for vertical 3D memory, in accordance with a number of embodiments of the present disclosure. In the example embodiment shown in the example of FIG. 4A, the method comprises depositing alternating layers of a dielectric material, 430-1, 430-2, 430-3, . . . , 430-(N+1) (individually or collectively referred to as dielectric material 430), and a sacrificial material, 432-1, 432-2, 432-3, . . . , 432-N (individually or collectively referred to as sacrificial material 432), in repeating iterations to form a vertical stack 401 on a working surface of a semiconductor substrate 400. In one embodiment, the dielectric material 430 can be deposited to have a thickness, e.g., vertical height in the third direction 411 (D3), in a range of twenty (20) nanometers (nm) to sixty (60) nm. In one embodiment, the sacrificial material 432 can be deposited to have a vertical height in a third direction (D3) in a range of approximately twenty (20) nm to one hundred (100) nm. Embodiments, however, are not limited to these examples.

In one example, the sacrificial material, 432-1, 432-2, 432-3, . . . , 432-N, can comprise a sacrificial semiconductor material such as polycrystalline silicon (Si), silicon nitride (SiN), or even an oxide-based semiconductor composition. While the discussion herein will refer to a sacrificial semiconductor material example, embodiments are not limited to this example. It is intended that the sacrificial material, 432-1, 432-2, 432-3 . . . , 432-N, may be selectively etched relative to the alternating layer of dielectric material, 430-1, 430-2, 430-3, . . . , 430-(N+1).

As shown in FIG. 4A, a vertical direction 411 is illustrated as a third direction (D3), e.g., z-direction in an x-y-z coordinate system, analogous to the third direction (D3), among first, second and third directions, shown in FIGS. 1-3. In some embodiments, at least two (2) tiers of the repeated iterations of the vertical stack 401 are formed. In the example of FIG. 4A, four tiers, numbered 1, 2, 3, and 4, of the repeating iterations of the vertical stack 401 are shown. Embodiments, however, are not limited to this example and more or fewer repeating iterations may be included. A photolithographic hard mask (HM) layer 435 may be deposited as a top layer on the repeating iterations of the vertical stack 401.

In some embodiments, the dielectric material, 430-1, 430-2, 430-3, . . . , 430-(N+1), may be an interlayer dielectric (ILD). By way of example, and not by way of limitation, the dielectric material, 430-1, 430-2, 430-3, . . . , 430-(N+1), may comprise a silicon dioxide ($SiO_2$) material. In another example the dielectric material, 430-1, 430-2, 430-3, . . . , 430-(N+1), may comprise a silicon nitride ($Si_3N_4$) material (also referred to herein a "SiN"). In another example the dielectric material, 430-1, 430-2, 430-3, . . . , 430-(N+1), may comprise a silicon oxy-carbide ($SiO_xC_y$) material (also referred to herein as "SiOC"). In another example the dielectric material, 430-1, 430-2, 430-3, . . . , 430-(N+1), may include silicon oxy-nitride ($SiO_xN_y$) material (also referred to herein as "SiON"), and/or combinations thereof. Embodiments are not limited to these examples. In some embodiments the sacrificial semiconductor material, 432-1, 432-2, 432-3, . . . , 432-N, may comprise a silicon (Si) material in a polycrystalline and/or amorphous state. In another example the sacrificial semiconductor material, 432-1, 432-2, 432-3, . . . , 432-N, may comprise a silicon nitride (SiN) material. Embodiments, however, are not limited to these examples.

The repeating iterations of alternating dielectric material, 430-1, 430-2, 430-3, . . . , 430-(N+1), layers and sacrificial semiconductor material, 432-1, 432-2, 432-3, . . . , 432-N, layers may be deposited according to a semiconductor fabrication process such as chemical vapor deposition (CVD) in a semiconductor fabrication apparatus. Embodiments, however, are not limited to this example and other suitable semiconductor fabrication techniques may be used to deposit the alternating layers of a dielectric material, 430-1, 430-2, 430-3, . . . , 430-(N+1), and a sacrificial semiconductor material, 432-1, 432-2, 432-3, . . . , 432-N, in repeating iterations to form a vertical stack 401, as shown in FIG. 4.

Figure 4B:
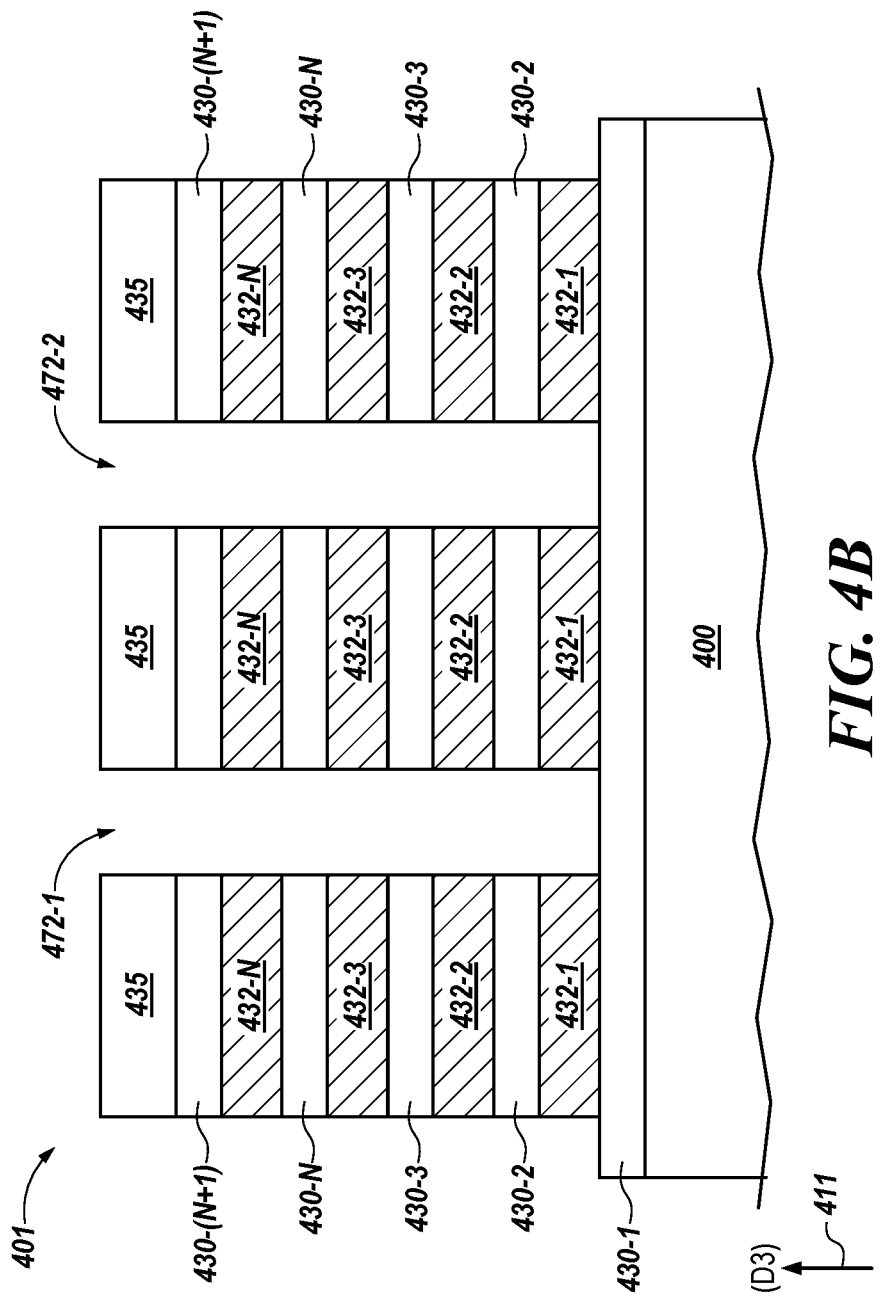

FIG. 4B is a cross-sectional view, at one stage of the semiconductor fabrication process for forming arrays of vertically stacked memory cells, at multiple stages of a semiconductor fabrication process, to form a channel for vertical three dimensional memory, in accordance with a number of embodiments of the present disclosure.

According to embodiments, the semiconductor fabrication process described in 4B-4D can occur after an elongated pillar extending predominantly in second direction and access line formation such as shown in FIGS. 6A-7E have been performed. According to embodiments, the methods in FIGS. 4A-4D can form channels in semiconductor regions.

As shown in FIG. 4B, the vertical stack 401 may be etched to form a plurality of openings 472-1, 472-2 (individually or collectively referred to as vertical openings 472) in the vertical stack 401. In some embodiments, the etch may be an anisotropic etch. As used herein, the term "anisotropic etch" may refer to an etch that occurs in one direction. An anisotropic etch may occur in a direction that is perpendicular to the surface that is being etched. In this example, the anisotropic etch may be perpendicular to the surface of the vertical stack 401. The opening may be formed through the alternating layers of the dielectric material 430 and the semiconductor material 432. In some embodiments, the etch may not etch through the bottom dielectric material 430-1. In some embodiments, the dielectric material 430 has been etched to a substantially equivalent distance from the vertical openings 472 as the semiconductor material 432. In some embodiments, each of the vertical openings 472 may have a width in a range of fifty (50) to five hundred (500) nanometers (nm) and a height in a range of 500 to two thousand (2,000) nm. In some embodiments, vertical openings 472 may form elongated vertical, pillar columns having a horizontal width in the first direction (D1) in a range of 50-500 nm. In some embodiments, the alternating layers of dielectric material 430 and semiconductor material 432 deposited in at least two (2) repeating iterations form the vertical stack 401 to a height in a range of two thousand (2000) to ten thousand (10,000) nm.

Figure 4C:
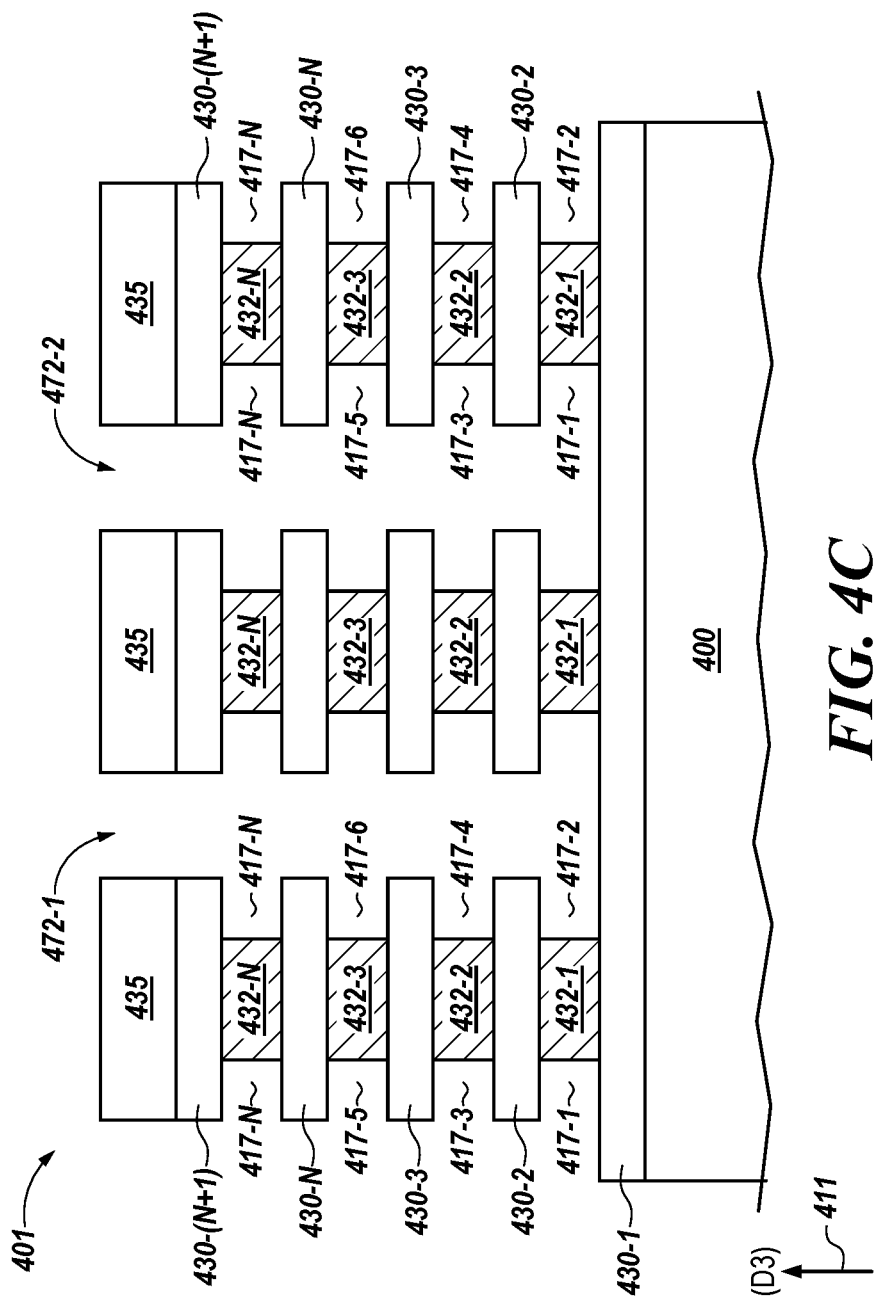

FIG. 4C is a cross-sectional view, at one stage of the semiconductor fabrication process for forming arrays of vertically stacked memory cells, at multiple stages of a semiconductor fabrication process, to form a channel for vertical 3D memory, in accordance with a number of embodiments of the present disclosure.

As shown in FIG. 4C, a subsequent etch may have been performed to undercut the dielectric material 430. As used herein, the term "undercut" may refer to an etch process that etches the vertical stack 401 from the sides of the openings 472 in the vertical stack 401 and under the dielectric material 430. In some embodiments, the etch that undercuts the dielectric material 430 may be an isotropic etch. As used herein, the term "isotropic etch" may refer to an etch that takes place in all directions. In an isotropic etch, the etchant material may have an equal etch rate for all spatial directions. The subsequent etch may selectively etch the semiconductor material 432 to a horizontal depth that is further back from the openings 472 than the dielectric material 430 to form horizontal openings 417-1, 417-2, 417-3, 417-4, 417-5, 417-6, . . . , 417-N (individually or collectively referred to as horizontal openings 417). In some embodiments, the horizontal openings 417 may have a horizontal depth in a range of ten (10) nanometers (nm) to forty (40) nm. In some embodiments, the semiconductor material 432 may be a passivation material such as a yttrium based dielectric material. For example, the semiconductor material 432 may be yttrium oxide ($Y_2O_3$).

Figure 4D:
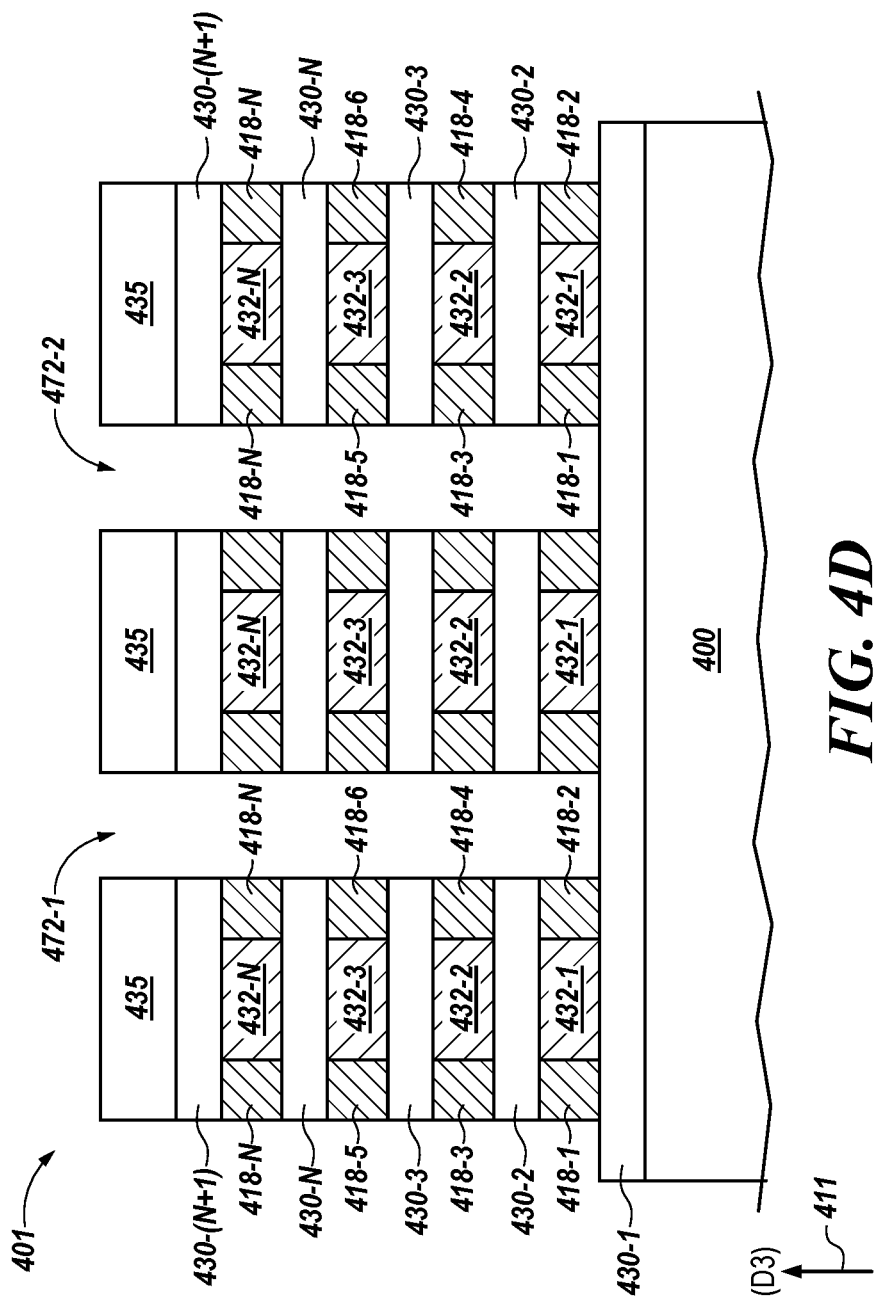

FIG. 4D is a cross-sectional view, at one stage of the semiconductor fabrication process for forming arrays of vertically stacked memory cells, at multiple stages of a semiconductor fabrication process, to form a channel for vertical 3D memory, in accordance with a number of embodiments of the present disclosure.

As shown in FIG. 4D, a channel material 418-1, 418-2, 418-3, 418-4 (individually or collectively referred to as channel material 418) may be deposited into the horizontal openings 417. The channel material 418 may be a semiconductor material. For example, the channel material 418 may be an oxide semiconductor such as zinc oxide (ZnO) and/or indium zinc oxide (InZnO). In some embodiments the channel material may be a two-dimensional (2D) material such as tungsten sulfide ($WS_2$) or a metal diselenide material such as nickel diselenide ($NiSe_2$) or iron diselenide ($FeSe_2$). In some embodiments, the channel material 418 may be formed from an indium zinc gallium oxide (IGZO) material. In some embodiments, the channel material 418 may be selectively deposited in the horizontal openings 417 to have a vertical width (W) in a third direction (D3) which is greater than a horizontal length (L) of the channel region in the second direction (D2). A first portion of the channel material 418-1 may be deposited in a first horizontal opening 417-1, a second potion of the channel material 418-2 may be deposited into a second horizontal opening 417-2 a third portion of the channel material 418-3 may be deposited in the third horizontal opening 417-3, a fourth portion of the channel material 418-4 may be deposited in the fourth horizontal opening 417-4, a fifth portion of the channel material 418-5 may be deposited in a fifth horizontal opening 417-5, a sixth portion of the channel material 418-6 may be deposited in the sixth horizontal opening 417-6, and an Nth channel material 418-N may be deposited in an Nth horizontal opening 417-N. In some embodiments, each portion of the channel material 418 may have a channel length in the second horizontal direction (D2) in a range of approximately twenty (20) to one hundred (100) nm. In some embodiments, the horizontal depth of the horizontal openings 417 may be a substantially equivalent horizontal depth. In some embodiments, the first portion of the channel material 418-1 and the third portion of the channel material 418-3 are in contact with a first side of the semiconductor material 432. In some embodiments, the second portion of the channel material 418-2 and the fourth portion of the channel material 418-4 may be in contact with a second side of the semiconductor material 432 that opposes the first side of the semiconductor material 432. Subsequent processing steps can be completed to form a gate dielectric and an access line as shown in FIG. 5.

In some embodiments, the channel material 418 may be formed after other elements of the vertical stack 401 have been formed. For example, the channel material 418 may be deposited after forming a capacitor cell associated with the horizontal access devices in the arrays of vertically stacked memory cells. In some embodiments, the vertical stack 401 is formed in-situ. The channel material 418 may be formed after other elements of the vertical stack 401 to decrease the amount of time that the channel material 418 may be exposed to heat in-situ. Decreasing the amount of time the channel material is exposed to heat in-situ may decrease the thermal budget of the of the channel (e.g., channel 525 as shown in FIG. 5). As used herein, the term "channel" may refer to the combination of the channel material 418 and the semiconductor material 432 in contact with the channel material 418. As shown in FIG. 4D, different portions of the channel material 418 may be in contact with opposing sides of the semiconductor material 432. As used herein, the term "thermal budget" may refer to the total amount of thermal energy transferred to the vertical stack 401 during the elevated heat processes that occur in-situ. A low thermal budget may provide a variety of benefits to the channel, such as reducing any dopant redistribution in the channel.

As stated above, the semiconductor material 432 may be a passivation material. In some embodiments, selectively depositing the channel material 418 alongside the passivation material 432 may serve as a back channel passivation material and lower a threshold voltage ($V_{th}$) of the channel 425. As used herein, the term "threshold voltage" may refer to the amount of voltage needed to create a conducting path between source/drain regions of a transistor. Decreasing the Vth may increase the conduction of the channel by decreasing the magnitude of voltage that, when applied to the channel, will create a conductive path within the channel. In some embodiments, the channel 425 may be formed to operate with a threshold voltage of less than 0.4 volts (V). Further, the semiconductor material 432 in the channel may decrease the change of the channel's $V_{th}$ over time in comparison to a channel that does not include a passivation material.

Figure 5:
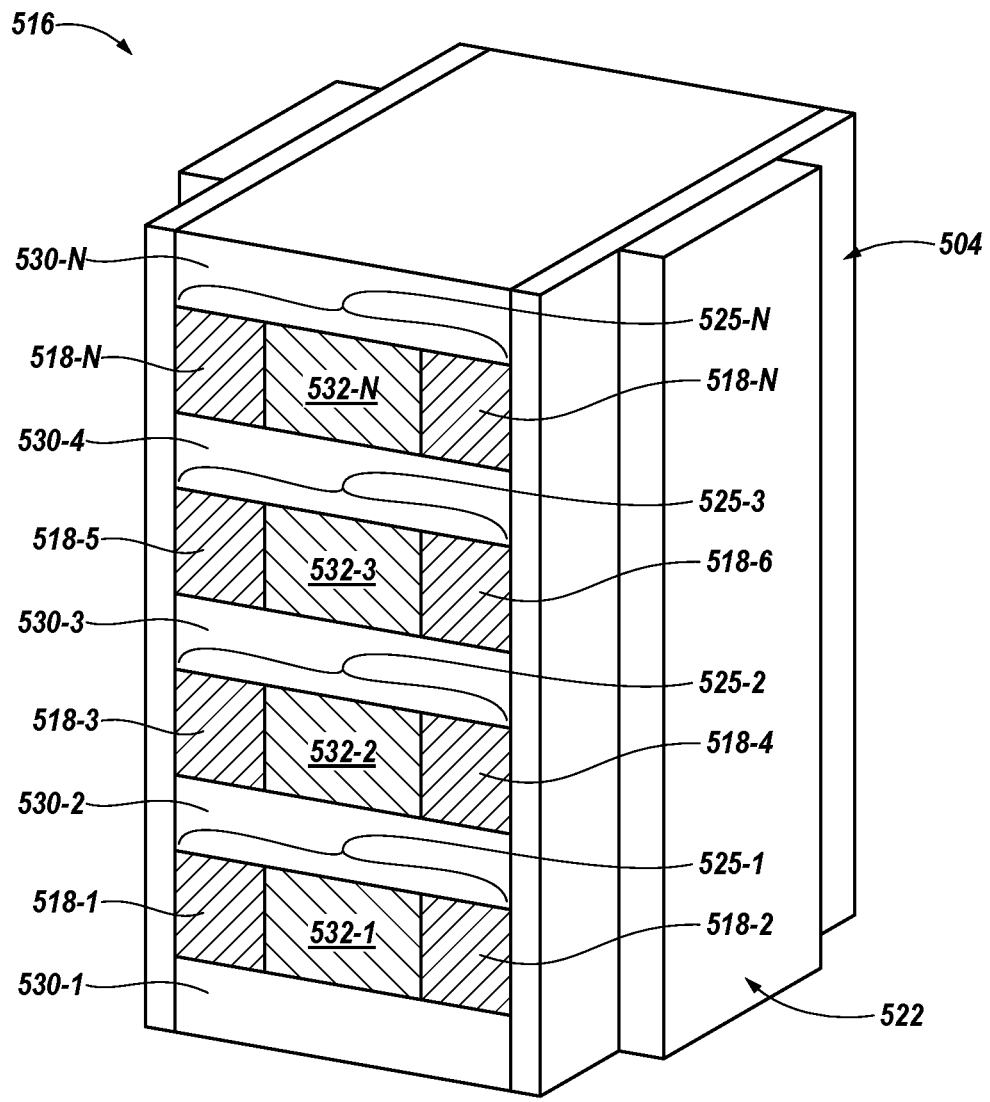
FIG. 5 is a three-dimensional (3D) perspective view of a memory device including multiple channels for vertical 3D memory, in accordance with a number of embodiments of the present disclosure.

FIG. 5 is a perspective three-dimensional (3D) view of a memory device 516 including multiple channels 525 for vertical 3D memory, in accordance with a number of embodiments of the present disclosure. The memory device 516 may include channels 525-1, 525-2, 525-3, . . . , 525-N (individually or collectively referred to as channel 525). The channels 525 may include a channel material 518-1, 518-2, 518-3, 518-4, 518-5, 518-6, . . . , 518-N (individually or collectively referred to as channel material 518) and a semiconductor material 532-1, 532-2, 532-3, . . . , 532-N (individually or collectively referred to as semiconductor material 532). Each of the plurality of channels 525 may be stacked on one another in a vertical orientation with dielectric material 530-1, 530-2, 530-3, 530-4, . . . , 530-N (individually or collectively referred to as dielectric material 530) separating each of the channels 525.

In some embodiments, a gate dielectric 504 may be deposited in the openings (e.g., openings 472-1, 472-2 described in connection with FIG. 4B). In some embodiments, the gate dielectric material 504 may be formed from an oxide material, such as one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobite, etc. The gate dielectric material 504 may be deposited on the sidewalls of the stacks of the memory device 516. Further, an access line material 522 may be deposited on a sidewall of the gate dielectric material 504.

Figure 6A:
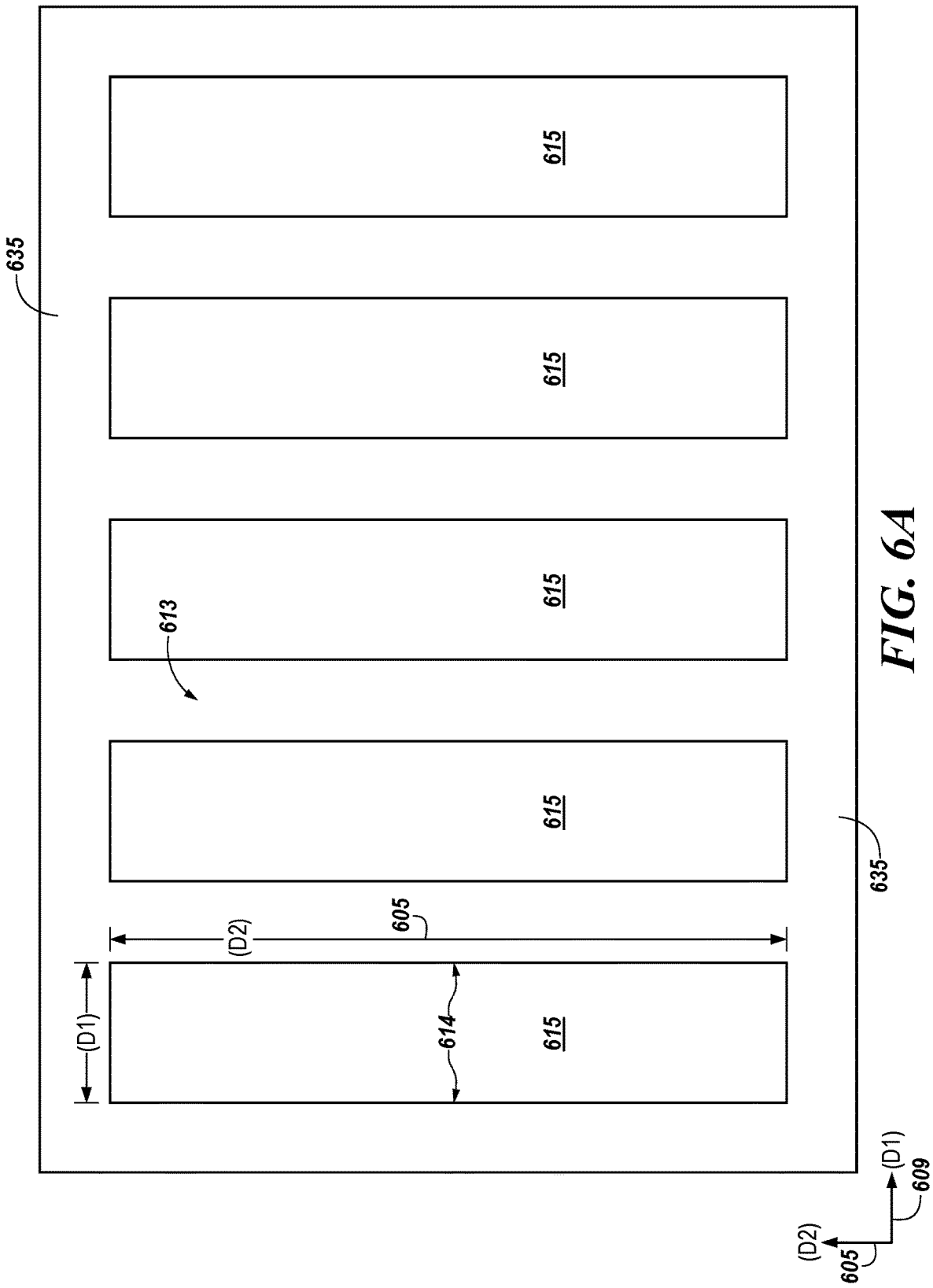

FIG. 6A illustrates an example method, at another stage of a semiconductor fabrication process, for forming arrays of vertically stacked memory cells, having horizontally oriented access devices and vertically oriented access lines, such as illustrated in FIGS. 1-3, and in accordance with a number of embodiments of the present disclosure. FIG. 6A illustrates a top down view of a semiconductor structure, at a particular point in time, in a semiconductor fabrication process, according to one or more embodiments. In the example embodiment shown in the example of FIG. 6A, the method comprises using an etchant process to form a plurality of first vertical openings 615, having a first horizontal direction (D1) 609 and a second horizontal direction (D2) 605, through the vertical stack to the substrate. In one example, as shown in FIG. 6A, the plurality of first vertical openings 615 are extending predominantly in the second horizontal direction (D2) 605 and may form elongated vertical, pillar columns 613 with sidewalls 614 in the vertical stack. The plurality of first vertical openings 615 may be formed using photolithographic techniques to pattern a photolithographic mask 635, e.g., to form a hard mask (HM), on the vertical stack prior to etching the plurality of first vertical openings 615. In some embodiments, the hard mask may be selective to a semiconductor material (e.g., semiconductor material 432 as described in connection with FIGS. 4A-4D) and a dielectric material (e.g., dielectric material 430 as described in connection with FIGS. 4A-4D).

Figure 6B:
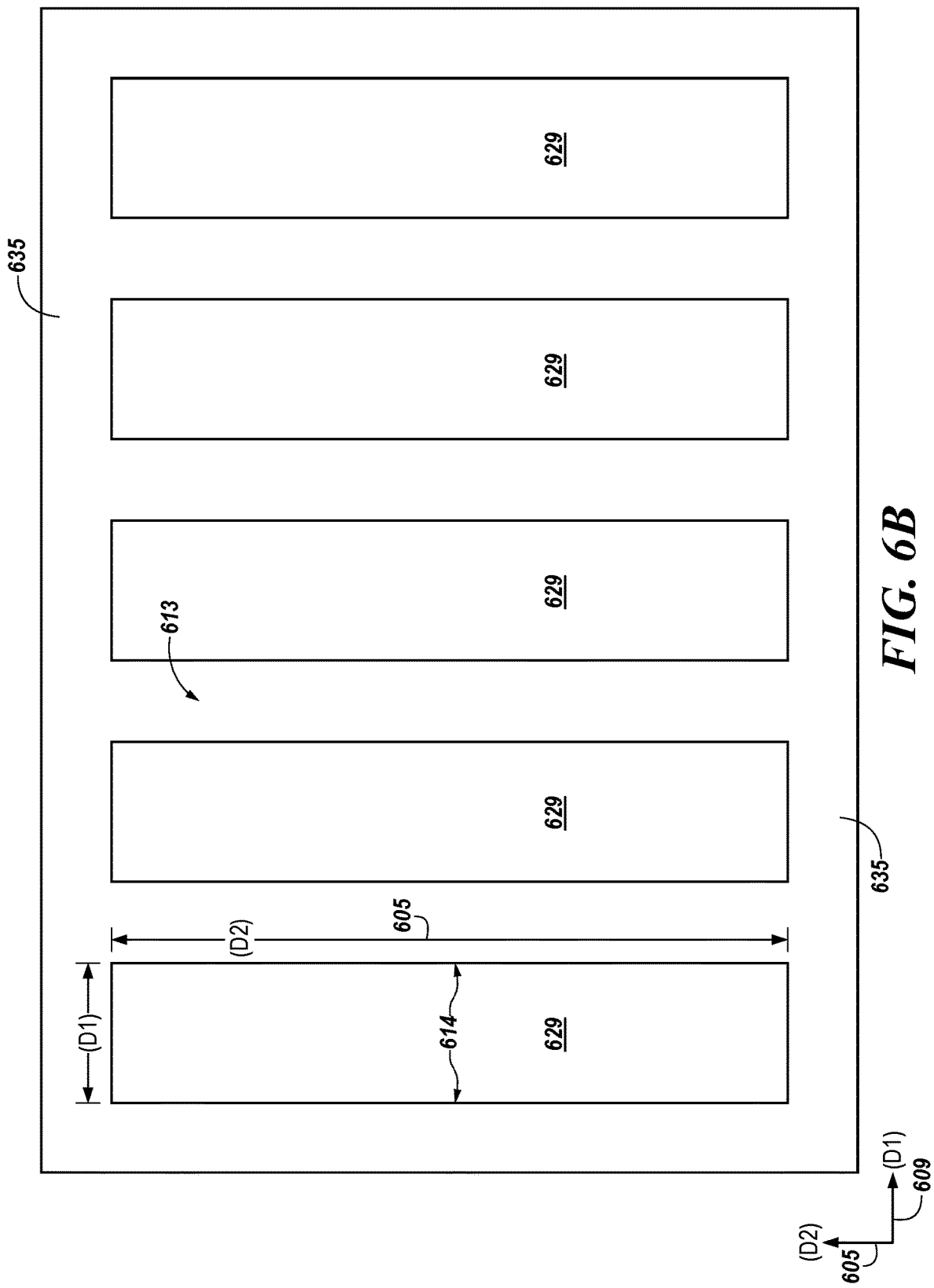

FIG. 6B illustrates a top down view of a semiconductor structure, at a particular point in time, in a semiconductor fabrication process, according to one or more embodiments. In the example embodiment shown in the example of FIG. 6B, the method comprises filling the openings 615 with a dielectric material 629. By way of example and not by way of limitation, dielectric material 629 may be deposited in the plurality of vertical openings 615 using a chemical vapor deposition (CVD) process, plasma enhanced CVD (PECVD), atomic layer deposition (ALD), or other suitable deposition process, to fill the plurality of first vertical openings 615. The dielectric material 629 may have a first horizontal direction (D1) 609 and a second horizontal direction (D2) 605 adjacent vertical pillar columns 613 with sidewalls 614 in the vertical stack.

Figure 6C:
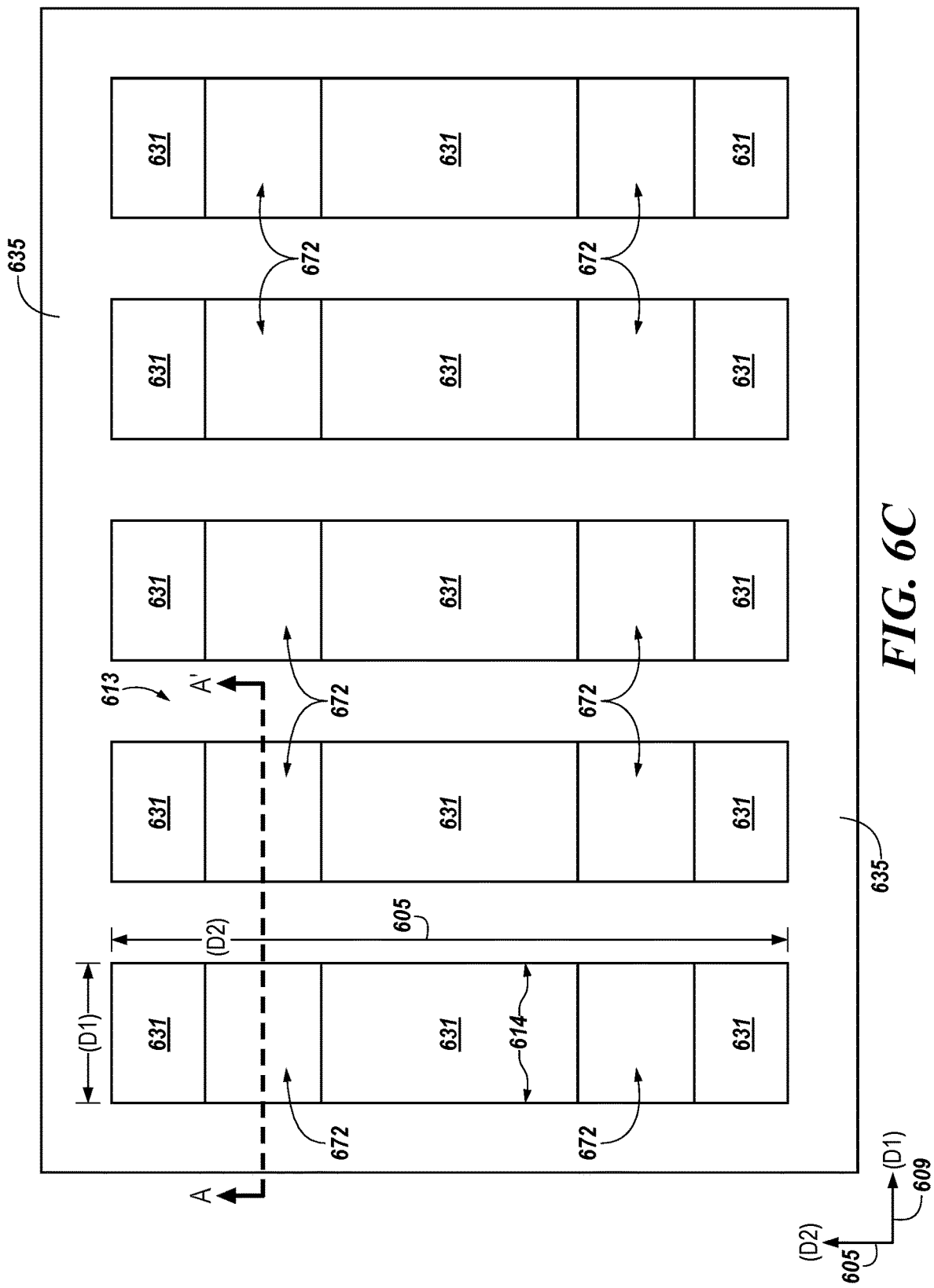

FIG. 6C illustrates a top down view of a semiconductor structure, at a particular point in time, in a semiconductor fabrication process, according to one or more embodiments. In the example embodiment shown in the example of FIG. 6C, a mask material 631 may be deposited over the dielectric material 629. The mask material 631 may be patterned and etched to form openings 672. Portions of dielectric material 629 may also be etched to form openings 672. By way of example and not by way of limitation, the mask material 631 and the dielectric material 629 may be etched using a wet etch, a dry etch, or other suitable etching process to form openings 672.

FIG. 6D is a cross sectional view, taken along cut-line A-A' in FIG. 6C, showing another view of the semiconductor structure at a particular time in the semiconductor fabrication process. FIG. 6D illustrates that a conductive material, 640-1, 640-2, . . . , 640-4, may be formed on a gate dielectric material 638 in the plurality of vertical openings 672. By way of example and not by way of limitation, a gate dielectric material 638 may be conformally deposited in the plurality of vertical openings 672 using a chemical vapor deposition (CVD) process, plasma enhanced CVD (PECVD), atomic layer deposition (ALD), or other suitable deposition process, to cover a bottom surface and the vertical sidewalls of the plurality of vertical openings 672. The gate dielectric 638 may be deposited to a particular thickness (t1) as suited to a particular design rule, e.g., a gate dielectric thickness of approximately 10 nanometers (nm). Embodiments, however, are not limited to this example. The gate dielectric 638 may separate the conductive material 640 from the repeating iterations of dielectric material 630-1, 630-2, 630-3, . . . , 630-N, and 630-(N+1) and semiconductor material 632-1, 632-2, 632-3, . . . , 632-N in the vertical pillars 642. By way of example, and not by way of limitation, the gate dielectric 638 may comprise a silicon dioxide (SiO$_2$) material, aluminum oxide (Al2O3) material, high dielectric constant (k), e.g., high-k, dielectric material, and/or combinations thereof as also described in FIG. 3.

Further, as shown in FIG. 6D, a conductive material, 640-1, 640-2, . . . , 640-4, may be conformally deposited in the plurality of vertical openings 672 on a surface of the gate dielectric material 638. By way of example, and not by way of limitation, the conductive material, 640-1, 640-2, . . . , 640-4, may be conformally deposited in the plurality of vertical openings 672 on a surface of the gate dielectric material 638 using a chemical vapor deposition process (CVD), plasma enhanced CVD (PECVD), atomic layer deposition (ALD), or other suitable deposition process, to cover a bottom surface and the vertical sidewalls of the plurality of vertical openings 672 over the gate dielectric 638. The conductive material, 640-1, 640-2, . . . , 640-4, may be conformally deposited to a particular thickness (t2) to form vertically oriented access lines, such as shown as access lines 103-1, 103-2, . . . , 103-Q (which also may be referred to a word lines) shown in FIG. 1, et. seq., and as suited to a particular design rule. For example, the conductive material, 640-1, 640-2, . . . , 640-4, may be conformally deposited to a thickness of approximately 20 nanometers (nm). Embodiments, however, are not limited to this example. By way of example, and not by way of limitation, the conductive material, 640-1, 640-2, . . . , 640-4, may be comprise a metal such as tungsten (W), metal composition, titanium nitride (TiN), doped polysilicon, and/or some other combination thereof as also described in FIG. 3.

As shown in FIG. 6D, the conductive material, 640-1, 640-2, . . . , 640-4, may be recessed back to remain only along the vertical sidewalls of the elongated vertical, pillar columns, now shown as 642-1, 642-2, and 642-3 in the cross-sectional view of FIG. 6D. The conductive material, 640-1, 640-2, . . . , 640-4, may be recessed back by using a suitable selective, anisotropic etch process to remove the conductive material, 640-1, 640-2, . . . , 640-4, from a bottom surface of the vertical openings, e.g., 672 in FIG. 6C, exposing the gate dielectric 638 on the bottom surface to form separate conductive material, 640-1, 640-2, . . . , 640-4. As shown in FIG. 6D, a dielectric material 639, such as an oxide or other suitable spin on dielectric (SOD), may then be deposited in the vertical openings 672, using a process such as CVD, to fill the vertical openings 672. The dielectric may be planarized to a top surface of the hard mask 635 of the vertical semiconductor stack, e.g., 401 as shown in FIG. 4, using chemical mechanical planarization (CMP) or other suitable semiconductor fabrication technique. A subsequent photolithographic material 636, e.g., hard mask, may be deposited using CVD and planarized using CMP to cover and close the vertical openings 672 over the conductive material, 640-1, 640-2, . . . , 640-4. Similar semiconductor process techniques may be used at other points of the semiconductor fabrication process described herein.

Figure 7A:
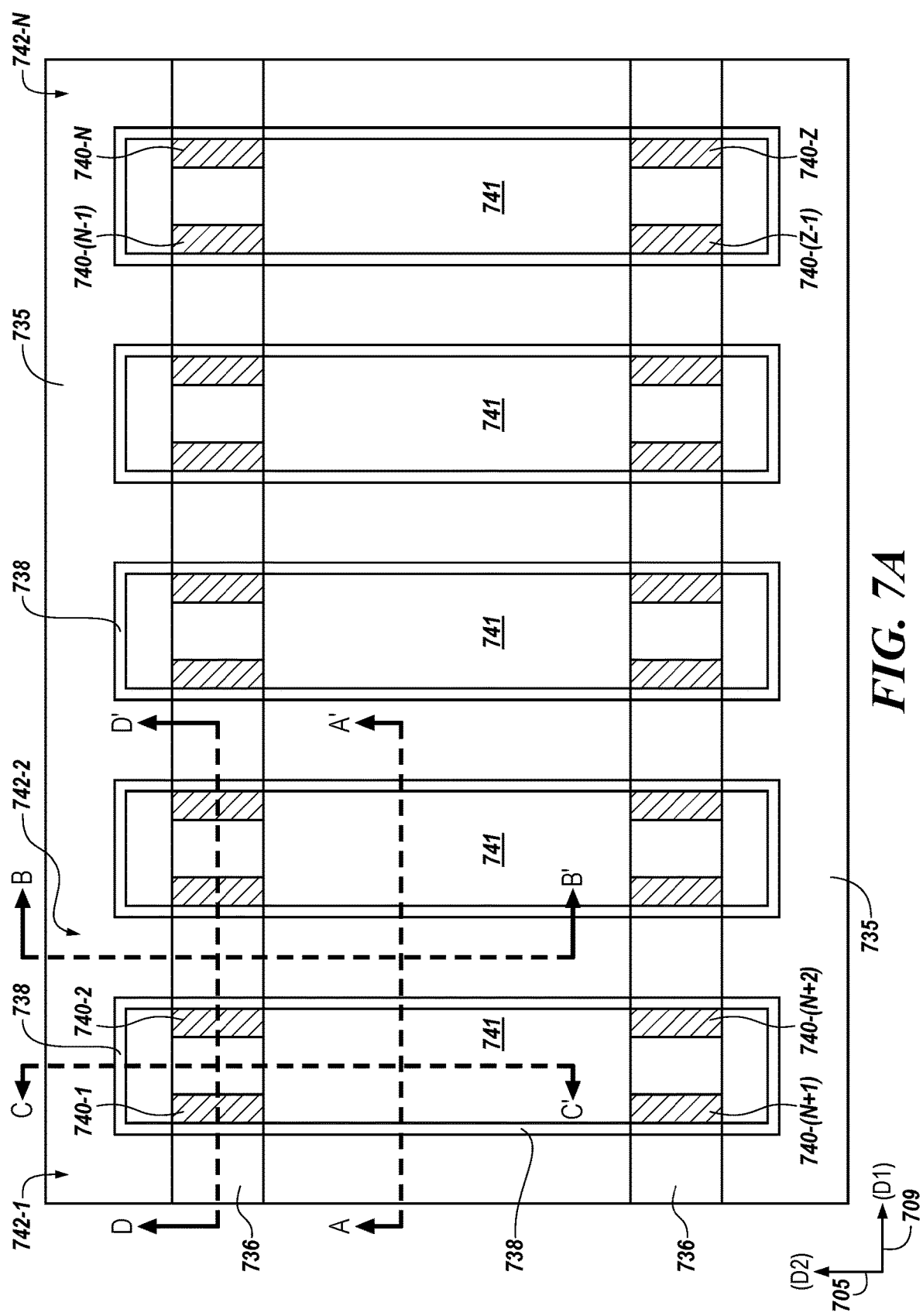

FIG. 7A illustrates an example method, at another stage of a semiconductor fabrication process, for forming arrays of vertically stacked memory cells, having horizontally oriented access devices and vertically oriented access lines, such as illustrated in FIGS. 1-3, and in accordance with a number of embodiments of the present disclosure. The embodiment shown in FIGS. 7A-7E illustrate a different method for forming arrays of vertically stacked memory cells, having horizontally oriented access devices and vertically oriented access lines, than the embodiment shown in FIGS. 6A-6D. FIG. 7A illustrates a top down view of a semiconductor structure, at a particular point in time, in a semiconductor fabrication process, according to one or more embodiments. In the example embodiment of FIG. 7A, the method comprises using a photolithographic process to pattern the photolithographic masks (hard masks) 735 and 736, as well as photolithographic mask (hard mask) 737 in FIG. 7B. The method in FIG. 7A, further illustrates using a selective, isotropic etchant process remove portions of the exposed conductive material, 740-1, 740-2, . . . , 740-N, 740-(N+1), . . . , 740-(Z−1), and 740-Z (740 in FIG. 7B), to separate and individually form the plurality of separate, vertical access lines, 740-1, 740-2, . . . , 740-N, 740-(N+1), . . . , 740-(Z−1), and 740-Z, e.g., access lines 103-1, 103-2, . . . , 103-Q in FIG. 1, et. seq. Hence the plurality of separate, vertical access lines, 740-1, 740-2, . . . , 740-N, 740-(N+1), . . . , 740-(Z−1), and 740-Z, are shown along the sidewalls of the elongated vertical, pillar columns 742-1, 742-2, . . . , 742-N.

As shown in the example of FIG. 7A, the exposed conductive material, 740-1, 740-2, . . . , 740-N, 740-(N+1), . . . , 740-(Z−1), and 740-Z, may be removed back to the gate dielectric material 738 in the first vertical openings, e.g., 615 in FIG. 6A, using a suitable selective, isotropic etch process. As shown in FIG. 7A, a subsequent dielectric material 741, such as an oxide or other suitable spin on dielectric (SOD), may then be deposited to fill the remaining openings from where the exposed conductive material, 740-1, 740-2, . . . , 740-N, 740-(N+1), . . . , 740-(Z−1), and 740-Z, was removed using a process such as CVD, or other suitable technique. The dielectric material 741 may be planarized to a top surface of the previous hard mask 635 in FIG. 6D of the vertical semiconductor stack, e.g., 401 as shown in FIG. 4, using a process such as CMP, or other suitable technique. In some embodiments, a subsequent photolithographic material 737, e.g., hard mask, may be deposited using CVD and planarized using CMP to cover and close the plurality of separate, vertical access lines, 740-1, 740-2, . . . , 740-N, 740-(N+1), . . . , 740-(Z−1), and 740-Z, over a working surface of the vertical semiconductor stack, 401 in FIG. 4, leaving the plurality of separate, vertical access lines, 740-1, 740-2, . . . , 740-N, 740-(N+1), . . . , 740-(Z−1), and 740-Z, protected along the sidewalls of the elongated vertical, pillar columns 742-1, 742-2, . . . , 742-N. Embodiments, however, are not limited to these process examples.

FIG. 7B illustrates a cross sectional view, taken along cut-line A-A' in FIG. 7A, showing another view of the semiconductor structure at this particular point in one example semiconductor fabrication process of an embodiment of the present disclosure. The cross sectional view shown in FIG. 7B is away from the plurality of separate, vertical access lines, 740-1, 740-2, . . . , 740-N, 740-(N+1), . . . , 740-(Z−1), and shows the repeating iterations of alternating layers of a dielectric material, 730-1, 730-2, 730-3 . . . , 730-(N+1), and a sacrificial semiconductor material, 732-1, 732-2, 732-3, . . . , 732-N, on a semiconductor substrate 700 to form the vertical stack, e.g. 401 as shown in FIG. 4. As shown in FIG. 7B, a vertical direction 711 is illustrated as a third direction (D3), e.g., z-direction in an x-y-z coordinate system, analogous to the third direction (D3) 111, among first, second and third directions, shown in FIGS. 1-3. The plane of the drawing sheet, extending right and left, is in a first direction (D1) 709. In the example embodiment of FIG. 7B, the dielectric material 741 is shown filling the vertical openings on the residual gate dielectric 738 deposition. The hard mask 737, described above, is deposited over the hard mask 735 and caps the illustrated structure.

FIG. 7C illustrates a cross sectional view, taken along cut-line B-B' in FIG. 7A, showing another view of the semiconductor structure at this particular point in one example semiconductor fabrication process of an embodiment of the present disclosure. The cross sectional view shown in FIG. 7C is illustrated extending in the second direction (D2) 705 along an axis of the repeating iterations of alternating layers of a dielectric material, 730-1, 730-2, 730-3, . . . , 730-(N+1), and a sacrificial semiconductor material, 732-1, 732-2, 732-3, . . . , 732-N, along and in which the horizontally oriented access devices and horizontally oriented storage nodes, e.g., capacitor cells, can be formed within the layers of sacrificial semiconductor material, 732-1, 732-2, 732-3, . . . , 732-N. In FIG. 7C, a neighboring, opposing vertical access line 740-3 is illustrated by a dashed line indicating a location set in from the plane and orientation of the drawing sheet. Hard mask 735 has been deposited over the repeating iterations of alternating layers of a dielectric material, 730-1, 730-2, 730-3, . . . , 730-(N+1), and a sacrificial semiconductor material, 732-1, 732-2, 732-3, . . . , 732-N.

FIG. 7D illustrates a cross sectional view, taken along cut-line C-C' in FIG. 7A, showing another view of the semiconductor structure at this particular point in one example semiconductor fabrication process of an embodiment of the present disclosure. The cross sectional view shown in FIG. 7D is illustrated extending in the second direction (D2) 705 along an axis of the repeating iterations of alternating layers of a dielectric material, 730-1, 730-2, 730-3, . . . , 730-(N+1), and a sacrificial semiconductor material, 732-1, 732-2, 732-3, . . . , 732-N, outside of a region in which the horizontally oriented access devices and horizontally oriented storage nodes, e.g., capacitor cells, will be formed within the layers of sacrificial semiconductor material, 732-1, 732-2, 732-3, . . . , 732-N. In FIG. 7D, the dielectric material 741 is shown filling the space between the horizontally oriented access devices and horizontally oriented storage nodes, which can be spaced along a second direction (D2) 705, extending into and out from the plane of the drawings sheet, for a three dimensional array of vertically oriented memory cells. At the left end of the drawing sheet is shown the repeating iterations of alternating layers of a dielectric material, 730-1, 730-2, 730-3, . . . , 730-(N+1), and a sacrificial semiconductor material, 732-1, 732-2, 732-3, . . . , 732-N, at which location a horizontally oriented digit line, e.g., digit lines 107-1, 107-2, . . . , 107-P shown in FIG. 1, et. seq., can be integrated to form electrical contact with the second source/drain region, described in more detail below.

FIG. 7E illustrates a cross sectional view, taken along cut-line D-D' in FIG. 7A, showing another view of the semiconductor structure at this particular point in one example semiconductor fabrication process of an embodiment of the present disclosure. The cross sectional view shown in FIG. 7E is illustrated, right to left in the plane of the drawing sheet, extending in the first direction (D1) 709 along an axis of the vertical elongated, pillar columns 742-1, 741-2, 741-3 of repeating iterations of alternating layers of a dielectric material, 730-1, 730-2, 730-3, . . . , 730-(N+1), and a sacrificial semiconductor material, 732-1, 732-2, 732-3, . . . , 732-N, intersecting across the plurality of separate, vertical access lines, 740-1, 740-2, . . . , 740-N, 740-(N+1), . . . , 740-(Z−1), and intersecting regions of the sacrificial semiconductor material, 732-1, 732-2, 732-3, . . . , 732-N, in which a channel may be formed, separated from the plurality of separate, vertical access lines, 740-1, 740-2, . . . , 740-N, 740-(N+1), . . . , 740-(Z−1), by the gate dielectric 738. In FIG. 7E, the first dielectric fill material 739 is shown separating the space between neighboring horizontally oriented access devices and horizontally oriented storage nodes, which may be formed extending into and out from the plane of the drawing sheet as described in more detail below, and can be spaced along a first direction (D1) 709 and stacked vertically in arrays extending in the third direction (D3) 711 in the three dimensional (3D) memory.

Figure 8A:
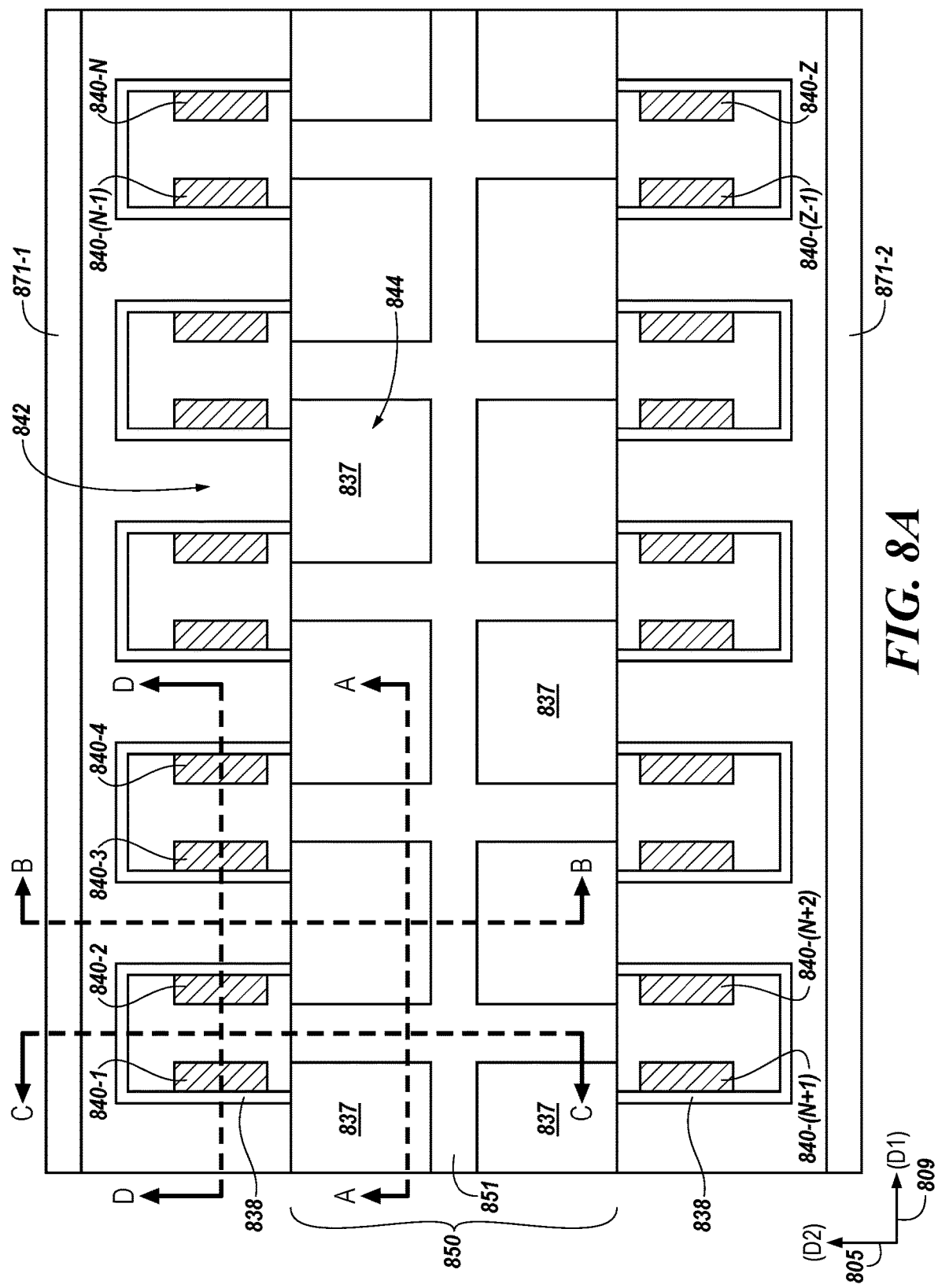

FIG. 8A illustrates an example method, at another stage of a semiconductor fabrication process, for forming arrays of vertically stacked memory cells, having horizontally oriented access devices and vertically oriented access lines, such as illustrated in FIGS. 1-3, and in accordance with a number of embodiments of the present disclosure. FIG. 8A illustrates a top down view of a semiconductor structure, at a particular point in time, in a semiconductor fabrication process, according to one or more embodiments. In the example embodiment of FIG. 8A, the method comprises using a photolithographic process to pattern the photolithographic masks 835, 836 and/or 837, etc. as described in FIGS. 6 and 7. The method in FIG. 8A, further illustrates using one or more etchant processes to form a vertical opening, 871-1 and 871-2, in access device regions, e.g., 843 in FIG. 8C for replacement channel and source/drain transistor regions, through the vertical stack. The vertical openings 871-1 and 871-2 are illustrated extending predominantly in the first horizontal direction (D1) 809. The one or more etchant processes forms a vertical openings, 871-1 and 871-2, to expose third sidewalls in the repeating iterations of a dielectric material, 830-1, 830-2, 830-3, . . . , 830-(N+1), and a sacrificial semiconductor material, 832-1, 832-2, . . . , 832-N, in the vertical stack, shown in FIGS. 8B-8E, adjacent a first region of the sacrificial semiconductor material. The method in FIG. 8A, further illustrates using a selective, isotropic etchant process remove portions of the exposed conductive material, 840-1, 840-2, . . . , 840-N, 840-(N+1), . . . , 840-(Z−1), and 840-Z, to separate and individually form the plurality of separate, vertical access lines, 840-1, 840-2, ..., 840-N, 840-(N+1), ..., 840-(Z-1), and 840-Z, e.g., access lines 103-1, 103-2, ..., 103-Q in FIG. 1, et. seq. Hence the plurality of separate, vertical access lines, 840-1, 840-2, ..., 840-N, 840-(N+1), ..., 840-(Z-1), and 840-Z, are shown along the sidewalls of the elongated vertical, pillar columns 842. Other numerated components may be analogous to those shown and discussed in connection with FIGS. 6 and 7.

According to embodiments, an access device region (843 in FIG. 8A and 8C), e.g., transistor region, of the sacrificial semiconductor material, 832-1, 832-2, 832-3, ..., 832-N, may be removed from the repeating iterations of a dielectric material, 830-1, 830-2, 830-3, ..., 830-(N+1), and a sacrificial semiconductor material, 832-1, 832-2, 832-3, ..., 832-N, in the vertical stack to form an access device, e.g. transistor. In some embodiments, this process is performed before selectively removing semiconductor material in a storage node region 850 of the sacrificial semiconductor material in which to form a capacitor cell. In other embodiments, this process is performed after selectively removing a storage node region 850 of the sacrificial semiconductor material in which to form a capacitor cell. According to an example embodiment, shown in FIGS. 8B-8E, the method comprises selectively etching the access device region 843 of the sacrificial semiconductor material, 832-1, 832-2, 832-3, ..., 832-N, to form a first horizontal opening a first horizontal distance back from a vertical openings, 871-1 and 871-2 in the vertical stack. In some embodiments, the method comprises forming a transistor having a first source/drain region, channel region, and second source/drain region as the access device in the first horizontal opening. By way of example, and not by way of limitation, forming the first source/drain region, the channel region, and the second source/drain region comprises using an atomic layer deposition (ALD) process to sequentially deposit, in the first horizontal opening, the first source/drain region, the channel region, and the second source/drain region. Other suitable semiconductor fabrication techniques and/or storage nodes structures may be used.

FIG. 8B illustrates a cross sectional view, taken along cut-line A-A' in FIG. 8A, showing another view of the semiconductor structure at this particular point in one example semiconductor fabrication process of an embodiment of the present disclosure. The cross sectional view shown in FIG. 8B is away from the plurality of separate, vertical access lines, 840-1, 840-2, ..., 840-N, 840-(N+1), ..., 840-(Z-1), and shows repeating iterations of alternating layers of a dielectric material, 830-1, 830-2, 830-3, ..., 830-(N+1) and a semiconductor material, 832-1, 832-2, 832-3, ..., 832-N separated by an opening 851, on a semiconductor substrate 800 to form elongated vertical, pillar columns 842-1, 842-2, 842-3 the vertical stack. Hard mask 835 has been deposited over the elongated vertical, pillar columns 843-1, 843-2, 843-3. As shown in FIG. 8B, a vertical direction 811 is illustrated as a third direction (D3), e.g., z-direction in an x-y-z coordinate system, analogous to the third direction (D3) 111, among first, second and third directions, shown in FIGS. 1-3. The plane of the drawing sheet, extending right and left, is in a first direction (D1) 809. In the example embodiment of FIG. 8B, the materials within the vertical stack—a dielectric material, 830-1, 830-2, 830-3, ..., 830-(N+1) and a semiconductor material, 832-1, 832-2, 832-3, ..., 832-N, extending into and out of the plane of the drawing sheet in second direction (D2) and along an axis of orientation of the horizontal access devices and horizontal storage nodes of the arrays of vertically stacked memory cells of the three-dimensional (3D) memory.

FIG. 8C illustrates a cross sectional view, taken along cut-line B-B' in FIG. 8A, showing another view of the semiconductor structure at this particular point in one example semiconductor fabrication process of an embodiment of the present disclosure. The cross sectional view shown in FIG. 8C is illustrated extending in the second direction (D2) 805, left and right along the plane of the drawing sheet, along an axis of the repeating iterations of alternating layers of a dielectric material, 830-1, 830-2, 830-3, ..., 830-N, and a semiconductor material, 832-1, 832-2, 832-3, ..., 832-N, and in which the horizontally oriented access devices and horizontally oriented storage nodes, e.g., capacitor cells, can be formed within the layers of semiconductor material, 832-1, 832-2, 832-3, ..., 832-N. In the example embodiment of FIG. 8C, an opening 851 is illustrated where the horizontally oriented storage nodes, e.g., capacitor cells, may be formed later in this semiconductor fabrication process.

In the example embodiment of FIG. 8C, a vertical opening 851 and horizontal openings 879 are shown formed from the mask, patterning and etching process described in connection with FIG. 8A. As shown in FIG. 8C, the semiconductor material, 832-1, 832-2, 832-3, ..., 832-N, in the second region 844 has been selectively removed to form the horizontal openings 879. In one example, an atomic layer etching (ALE) process is used to selectively etch the semiconductor material, 832-1, 832-2, 832-3, ..., 832-N, and remove a second distance (D2 opening) back from the vertical opening 851. Horizontally oriented storage nodes, e.g., capacitor cells, may be formed, as shown in FIGS. 9A-9E, later or first, relative to the fabrication process shown in FIGS. 4A-4D in the horizontal openings 879.

According to one example embodiment, as shown in FIG. 8C a first source/drain region 897-1A, 897-1B, 897-1C, ..., 897-1N (individually or collectively referred to as first source/drain region 897-1) may be formed by flowing a source/drain material into the horizontal openings 879 at a distal end of the horizontal openings 879 from the vertical opening 851. In some embodiments, the source/drain region material may be an n-type doped semiconductor material or a p-type doped semiconductor material. By way of example, and not by way of limitation, the n-type dopant may include Phosphorous (P) atoms and the p-type dopant may include atoms of Boron (B). In some embodiments, the source/drain material may be a conductive material. By way of example, and not by way of limitation, the conductive material may be a metal material such as ruthenium (Ru), molybdenum (Mo), nickel (Ni), titanium (Ti), copper (Cu), and tin (Sn). Embodiments, however, are not so limited and other suitable semiconductor fabrication techniques may be utilized.

As shown further in FIG. 9C, a first electrode, e.g., 961, for horizontally oriented storage nodes are to be coupled to the first source/drain regions 897-1 of the horizontal access devices. As shown later in FIG. 9C, such horizontally oriented storage nodes are shown formed in a horizontal opening 879 extending in second direction (D2), left and right in the plane of the drawing sheet, a second distance (D2 opening) from the vertical opening 851 formed in the vertical stack, e.g., 401 in FIG. 4A, and along an axis of orientation of the horizontal access devices and horizontal storage nodes of the arrays of vertically stacked memory cells of the three-dimensional (3D) memory. In FIG. 8C, a neighboring, opposing vertical access line 840-3 is illustrated by a dashed line indicating a location set inward from the plane and orientation of the drawing sheet.

FIG. 8D illustrates a cross sectional view, taken along cut-line C-C' in FIG. 8A, showing another view of the semiconductor structure at this particular point in one example semiconductor fabrication process of an embodiment of the present disclosure. The cross sectional view shown in FIG. 8D is illustrated extending in the second direction (D2) 805, left and right in the plane of the drawing sheet, along an axis of the repeating iterations of alternating layers of a dielectric material, 830-1, 830-2, 830-3, ..., 830-N, and a semiconductor material, 832-1, 832-2, 832-3, ..., 832-N, outside of a region in which the horizontally oriented access devices and horizontally oriented storage nodes, e.g., capacitor cells, will be formed within the layers of semiconductor material, 832-1, 832-2, 832-3, ..., 832-N. In FIG. 8D, the dielectric material 841 is shown filling the space between the horizontally oriented access devices and horizontally oriented storage nodes, which can be spaced along a third direction 811 (D3), extending into and out from the plane of the drawings sheet, for a three dimensional array of vertically oriented memory cells. At the left end of the drawing sheet is shown the repeating iterations of alternating layers of a dielectric material, 830-1, 830-2, 830-3, ..., 830-N, and a semiconductor material, 832-1, 832-2, 832-3, ..., 832-N, at which location a horizontally oriented digit line, e.g., digit lines 107-1, 107-2, ..., 107-P shown in FIG. 1, et. seq., can be integrated to form electrical contact with first source/drain regions.

Again, while first and second source/drain region references are used herein to denote two separate and distinct source/drain regions, it is not intended that the source/drain region referred to as the "first" and/or "second" source/drain regions have some unique meaning. It is intended only that one of the source/drain regions is connected to a digit line, e.g., 107-2, and the other may be connected to a storage node.

FIG. 8E illustrates a cross sectional view, taken along cut-line D-D' in FIG. 8A, showing another view of the semiconductor structure at this particular point in one example semiconductor fabrication process of an embodiment of the present disclosure. The cross sectional view shown in FIG. 8E is illustrated, right to left in the plane of the drawing sheet, extending in the first direction (D1) 809 along an axis of the repeating iterations of alternating layers of a dielectric material, 830-1, 830-2, 830-3, ..., 830-(N+1), and semiconductor material, 832-1, 832-2, 832-3, ..., 832-N, in which channel regions will be formed in horizontal openings and separated from the plurality of separate, vertical access lines, 840-1, 840-2, ..., 840-4, by the gate dielectric 838. In FIG. 8E, the first dielectric fill material 839 is shown separating the space between neighboring horizontally oriented access devices and horizontally oriented storage nodes, which may be formed extending into and out from the plane of the drawing sheet as described in more detail below, and can be spaced along a first direction (D1) 809 and stacked vertically in arrays extending in the third direction (D3) 811 in the three dimensional (3D) memory. A hard mask 836 may cap the structure.

Figure 9A:
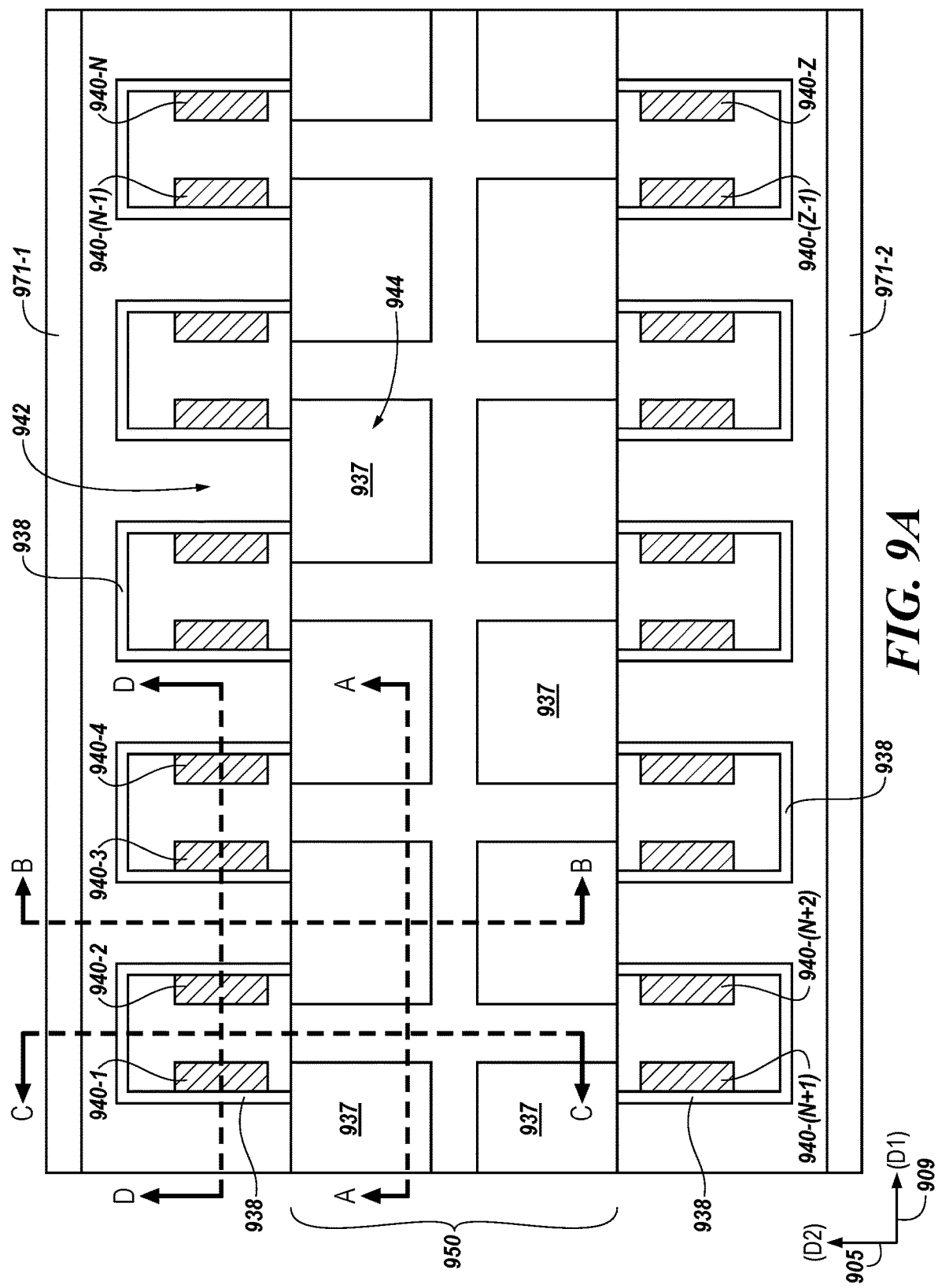

FIG. 9A illustrates an example method, at another stage of a semiconductor fabrication process, for forming arrays of vertically stacked memory cells, having horizontally oriented access devices and vertically oriented access lines, such as illustrated in FIGS. 1-3, and in accordance with a number of embodiments of the present disclosure. FIG. 9A illustrates a top down view of a semiconductor structure, at a particular point in time, in a semiconductor fabrication process, according to one or more embodiments. In the example embodiment of FIG. 9A, the method comprises using a photolithographic process to pattern the photolithographic masks 935, 936 and/or 937, etc. as described in FIGS. 6-8. The method in FIG. 9A, further illustrates using one or more etchant processes to form a vertical opening, 971-1 and 971-2, in access device regions, e.g., 843 in FIG. 8C and 943 in FIG. 9C for replacement channel and source/drain transistor regions, through the vertical stack. The vertical openings 971-1 and 971-2 are illustrated extending predominantly in the first horizontal direction (D1) 909. The one or more etchant processes forms a vertical openings, 971-1 and 971-2, to expose third sidewalls in the repeating iterations of alternating layers of a dielectric material, 930-1, 930-2, 930-3, ..., 930-(N+1), and a sacrificial semiconductor material, 932-1, 932-2, 932-3, ..., 932-N, in the vertical elongated, pillar columns 942 of the vertical stack, shown in FIGS. 9B-9E, adjacent a first region of the sacrificial semiconductor material. As shown in FIG. 9A, access lines, 940-1, 940-2, ..., 940-N, 940-(N+1), ..., 940-Z, and gate dielectric material 938 may be formed. Other numerated components may be analogous to those shown and discussed in connection with FIGS. 6-8.

According to embodiments, an access device region (943 in FIG. 9C), e.g., transistor region, of the sacrificial semiconductor material, 932-1, 832-2, 932-3, ..., 932-N, may be removed from the repeating iterations of alternating layers of a dielectric material, 930-1, 930-2, 930-3, ..., 930-(N+1), and a sacrificial semiconductor material, 932-1, 932-2, 932-3, ..., 932-N, in the vertical stack to form an access device, e.g. transistor. In some embodiments, this process is performed before selectively removing sacrificial material in a storage node region 950 of the sacrificial semiconductor material, 932-1, 932-2, 932-3, ..., 932-N, in which to form a capacitor cell. In other embodiments, this process is performed after selectively removing a storage node region of the sacrificial semiconductor material, 932-1, 932-2, 932-3, ..., 932-N, in which to form a capacitor cell.

According to an example embodiment, shown in FIGS. 9B-9E, the method comprises selectively etching the access device region 943 of the sacrificial semiconductor material, 932-1, 932-2, 932-3, ..., 932-N, to form a first horizontal opening a first horizontal distance back from a vertical openings, 971-1 and 971-2 in the vertical stack. In some embodiments, as shown in FIGS. 9B-9E, the method comprises forming a transistor having a first source/drain region, channel region, and second source/drain region as the access device in the first horizontal opening. By way of example, and not by way of limitation, forming the first source/drain region, the channel region, and the second source/drain region comprises using an atomic layer deposition (ALD) process to sequentially deposit, in the first horizontal opening, the first source/drain region, the channel region, and the second source/drain region. Other suitable semiconductor fabrication techniques and/or storage nodes structures may be used. In some embodiments, the channel region (e.g., channel 525 as shown in FIG. 5) can be formed as described in FIGS. 4A-4D.

FIG. 9B illustrates a cross sectional view, taken along cut-line A-A' in FIG. 9A, showing another view of the semiconductor structure at this particular point in one example semiconductor fabrication process of an embodiment of the present disclosure. The cross sectional view shown in FIG. 9B is away from the plurality of separate, vertical access lines, 940-1, 940-2, . . . , 940-N, 940-(N+1), . . . , 940-(Z–1), and shows repeating iterations of alternating layers of a dielectric material, 930-1, 930-2, 930-3, . . . , 930-(N+1), separated by capacitor cells having first electrodes 961, e.g., bottom cell contact electrodes, cell dielectrics 963, and second electrodes 956, e.g., top, common node electrode, on a semiconductor substrate 900 to form the vertical stacks 942-1, 942-2, 942-3. A hard mask 935 may be deposited over the vertical stacks 942-1, 942-2, 942-3. As shown in FIG. 9B, a vertical direction 911 is illustrated as a third direction 911 (D3), e.g., z-direction in an x-y-z coordinate system, analogous to the third direction (D3) 111, among first, second and third directions, shown in FIGS. 1-3. The plane of the drawing sheet, extending right and left, is in a first direction (D1) 909. In the example embodiment of FIG. 9B, the first electrodes 961, e.g., bottom electrodes to be coupled to source/drain regions of horizontal access devices, and second electrodes 956 are illustrated separated by a cell dielectric material 963 extending into and out of the plane of the drawing sheet and along an axis of orientation of the horizontal access devices and horizontal storage nodes of the arrays of vertically stacked memory cells of the three-dimensional (3D) memory.

FIG. 9C illustrates a cross sectional view, taken along cut-line B-B' in FIG. 9A, showing another view of the semiconductor structure at this particular point in one example semiconductor fabrication process of an embodiment of the present disclosure. The cross sectional view shown in FIG. 9C is illustrated extending in the second direction (D2) 905, left and right along the plane of the drawing sheet, along an axis of the repeating iterations of alternating layers of a dielectric material, 930-1, 930-2, 930-3, . . . , 930-(N+1). However, now is shown that a portion of the sacrificial semiconductor material has been removed in an access device region 943 of the alternating layers of the vertical stack to form horizontal openings, 933-1, 933-2, 932-3, . . . , 933-N, in which the horizontally oriented access devices having a first source/drain region, e.g., first source/drain region 997-1A, 997-1B, 997-1C, . . . , 997-1N (individually or collectively referred to as first source/drain region 997-1), channel region, and second source/drain region can be formed between the vertical alternating layers of a dielectric material, 930-1, 930-2, 930-3, . . . , 930-(N+1). In the example embodiment of FIG. 9C, the horizontally oriented storage nodes, e.g., capacitor cells, are illustrated as having been formed been formed in this semiconductor fabrication process in the storage node region 944 and first electrodes 961, e.g., bottom electrodes to be coupled to a first source/drain region 997-1 of a horizontal access device, and second electrodes 956, e.g., top electrodes to be coupled to a common electrode plane such as a ground plane, separated by a cell dielectric 963, are shown. However, embodiments are not limited to this example. In other embodiments the first electrodes 961, e.g., bottom electrodes to be coupled to source/drain regions of horizontal access devices, and second electrodes 956, e.g., top electrodes to be coupled to a common electrode plane such as a ground plane, separated by cell dielectrics 963, may be formed subsequent to forming a first source/drain region, a channel region, and a second source/drain region in a region of the sacrificial semiconductor material, 932-1, 932-2, 932-3, . . . , 932-N.

In the example embodiment of FIG. 9C, the horizontally openings 930-1, 930-2, 930-3, . . . , 930-N, in which to form the access devices having a first source/drain region 997-1, a channel region, and second source/drain region, are shown extending in second direction 905 (D2), left and right in the plane of the drawing sheet, a distance from the vertical openings 971-1 and 971-2 formed in the vertical stack and along an axis of orientation of the horizontal access devices and horizontal storage nodes of the arrays of vertically stacked memory cells of the three dimensional (3D) memory. In FIG. 9C, a neighboring, opposing vertical access line 940-3 is illustrated by a dashed line indicating a location set inward from the plane and orientation of the drawing sheet.

FIG. 9D illustrates a cross sectional view, taken along cut-line C-C' in FIG. 9A, showing another view of the semiconductor structure at this particular point in one example semiconductor fabrication process of an embodiment of the present disclosure. The cross sectional view shown in FIG. 9D is illustrated extending in the second direction (D2) 905, left and right in the plane of the drawing sheet, along an axis of the repeating iterations of alternating layers of a dielectric material, 930-1, 930-2, 930-3, . . . , 930-N, 930-(N+1) and horizontal openings 933-1, 933-2, 933-3, . . . , 933-N, outside of a region in which the horizontally oriented access devices and horizontally oriented storage nodes, e.g., capacitor cells, will be formed. In FIG. 9D, the dielectric material 941 is shown filling the space between the horizontally oriented access devices, which can be spaced along a first direction (D1), extending into and out from the plane of the drawings sheet, for a three dimensional array of vertically oriented memory cells. However, in the cross sectional view of FIG. 9D, the second electrode 956, e.g., top, common electrode to the capacitor cell structure, is additionally shown present in the space between horizontally neighboring devices. At the left end of the drawing sheet is shown the repeating iterations of alternating layers of a dielectric material, 930-1, 930-2, 930-3, . . . , 930-(N+1), and horizontal openings, 933-1, 933-2, 933-3, . . . , 933-N, at which location a horizontally oriented digit line, e.g., digit lines 107-1, 107-2, . . . , 107-P shown in FIG. 1, et. seq., can be integrated to form electrical contact with the second source/drain regions, of the formed horizontal access devices.

FIG. 9E illustrates a cross sectional view, taken along cut-line D-D' in FIG. 9A, showing another view of the semiconductor structure at this particular point in one example semiconductor fabrication process of an embodiment of the present disclosure. The cross sectional view shown in FIG. 9E is illustrated, right to left in the plane of the drawing sheet, extending in the first direction (D1) 909 along an axis of the repeating iterations of alternating layers of a dielectric material, 930-1, 930-2, 930-3, . . . , 930-(N+1), and horizontal openings, 933-1, 933-2, 933-3, . . . , 933-N, in which channel regions will be formed separated from the plurality of separate, vertical access lines, 940-1, 940-2, . . . , 940-4, by the gate dielectric 938. In FIG. 9E, the first dielectric fill material 939 is shown separating the space between neighboring horizontally oriented access devices and horizontally oriented storage nodes, which may be formed extending into and out from the plane of the drawing sheet, and can be spaced along a first direction (D1) 909 and stacked vertically in arrays extending in the third direction (D3) 911 in the three dimensional (3D) memory. Hard mask 936 may cap the structure shown in FIG. 9E.

Figure 10A:
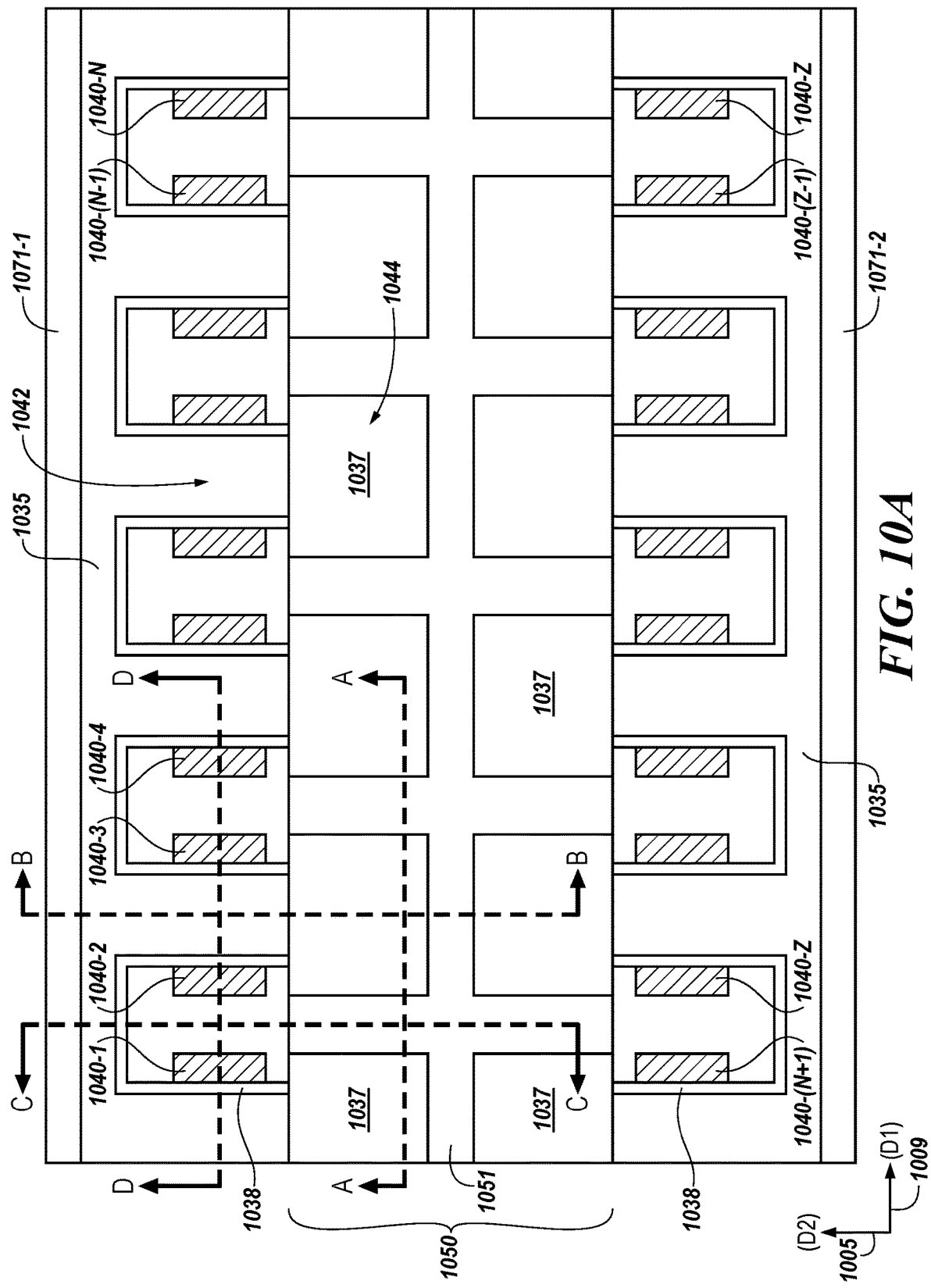

FIG. 10A illustrates an example method, at another stage of a semiconductor fabrication process, for forming arrays of vertically stacked memory cells, having horizontally oriented access devices and vertically oriented access lines, such as illustrated in FIGS. 1-3, and in accordance with a number of embodiments of the present disclosure. FIG. 10A illustrates a top down view of a semiconductor structure, at a particular point in time, in a semiconductor fabrication process, according to one or more embodiments. In the example embodiment of FIG. 10A, the vertical openings 1071-1 and 1071-2 remain present from FIG. 9A-9E. However, in FIGS. 10A-10E, horizontal access devices, 1098-1, 1098-2, . . . , 1098-N, having first source/drain regions 1097-1, channel regions 1025-A, 1025-B, 1025-C, . . . , 1025-N (individually or collectively referred to as channel 1025), and second source/drain regions1097-2A, 1097-2B, 1097-2C, . . . , 1097-2N (individually or collectively referred to as second source/drain region 1097-2), in FIG. 10C, have been formed in the horizontal openings, 933-1, 933-2, 933-3, . . . , 933-N shown in FIGS. 9C and 9D. The horizontal access devices, 1098-1, 1098-2, . . . , 1098-N, are formed extending in the second direction 1005 (D2) in the horizontal access device regions 1043 of the vertical stack. Additionally, horizontal digit lines, 1099-1, 1099-2, 1099-N, have been formed and integrated in contact with the second source/drain regions, e.g., 1097-2, as shown in FIGS. 10C and 10D. Further, a hard mask 1035 may be deposited over vertical elongated, pillar columns 1042. Other numerated components may be analogous to those shown and discussed in connection with FIGS. 6, 7, 8, and 9.

According to embodiments, in the access device region 1043, e.g., transistor region, the sacrificial semiconductor material, e.g., 832-1, 832-2, 832-3, . . . , 832-N, in FIGS. 8A-8E, has been removed to leave the repeating iterations of alternating layers of a dielectric material, e.g., 1030-1, 1030-2, 1030-3, . . . , 1030-(N+1), and horizontal openings, e.g., 933-1, 933-2, 933-3, . . . , 933-N, in a vertical stack to form an access device, e.g. transistor. In some embodiments, this process is performed before selectively removing sacrificial material in a storage node region 1050 in which to form a capacitor cell. In other embodiments, this process is performed after selectively removing sacrificial material in a storage node region 1050 of the sacrificial semiconductor material in which to form a capacitor cell. According to an example embodiment, shown in FIGS. 10B-10E, the method comprises selectively depositing, using an atomic layer deposition (ALD) process, or other suitable deposition technique, a first source/drain region 1097-1, channel region 1025, and second source/drain region 1097-2 in each of the horizontal openings, e.g., 933-1, 933-2, 933-3, . . . , 933-N, in FIGS. 9A-9E. In some embodiments, a first source/drain region 1097-1 may be formed by depositing a first source/drain region material in the storage node region 1044, 1050. Further, a channel 1025 and a second source/drain region 1097-2 may be formed depositing a channel material 1025 and the second source/drain region material in the horizontal openings, e.g., 933-1, 933-2, 933-3, . . . , 933-N, in FIGS. 9A-9E. Further, opening 1051 may be formed by patterning and etching hard mask 1037.

FIG. 10B illustrates a cross sectional view, taken along cut-line A-A' in FIG. 10A, showing another view of the semiconductor structure at this particular point in one example semiconductor fabrication process of an embodiment of the present disclosure. The cross sectional view shown in FIG. 10B is away from the plurality of separate, vertical access lines, 1040-1, 1040-2, . . . , 1040-N, 1040-(N+1), . . . , 1040-(Z−1), and shows repeating iterations of alternating layers of a dielectric material, 1030-1, 1030-2, 1030-3, . . . , 1030-(N+1), separated by capacitor cells having first electrodes 1061, e.g., bottom cell contact electrodes, cell dielectrics 1063, and second electrodes 1056, e.g., top, common node electrode, on a semiconductor substrate 1000 to form vertical elongated, pillar columns 1042-1, 1042-2, 1042-3 in the vertical stack. As shown in FIG. 10B, a vertical direction 1011 is illustrated as a third direction (D3), e.g., z-direction in an x-y-z coordinate system, analogous to the third direction (D3) 111, among first, second and third directions, shown in FIGS. 1-3. The plane of the drawing sheet, extending right and left, is in a first direction (D1) 1009. In the example embodiment of FIG. 10B, the first electrodes 1061, e.g., bottom electrodes to be coupled to source/drain regions of horizontal access devices, and second electrodes 1056 are illustrated separated by a cell dielectric material 1063 extending into and out of the plane of the drawing sheet along an axis of orientation of the horizontal access devices and horizontal storage nodes of the arrays of vertically stacked memory cells of the three-dimensional (3D) memory. As shown in FIG. 10B, hard mask 1035 has been deposited over the alternating layers of dielectric material, 1030-1, 1030-2, 1030-3, . . . , 1030-(N+1), and capacitor cells having first electrodes 1061, e.g., bottom cell contact electrodes, cell dielectrics 1063, and second electrodes 1056.

FIG. 10C illustrates a cross sectional view, taken along cut-line B-B' in FIG. 10A, showing another view of the semiconductor structure at this particular point in one example semiconductor fabrication process of an embodiment of the present disclosure. The cross sectional view shown in FIG. 10C is illustrated extending in the second direction (D2) 1005, left and right along the plane of the drawing sheet, along an axis of the repeating iterations of alternating layers of a dielectric material, 1030-1, 1030-2, 1030-3, . . . , 1030-(N+1). However, now is shown that the first source/drain region material 1097-1, channel region material 1025, and second source/drain region material 1097-2 have been deposited in the horizontal openings, e.g., 933-1, 933-2, 933-3, . . . , 933-N, in FIGS. 9A-9E, extending in the second direction 1005 (D2). As one example, a first source/drain region 1097-1, a channel region 1025, and a second source/drain region 1097-2 are illustrated distinctly. Further, horizontal digit line, 1099-1, 1099-2, . . . , 1099-N, integration is achieved in contact with the second source/drain regions, e.g., 1097-2, extending in a first direction (D1), e.g., extending into and out from the plane of the drawing sheet in alternating layers vertically with the dielectric material, 1030-1, 1030-2, 1030-3, . . . , 1030-(N+1) in direction (D3) 1011.

Hence, three-node horizontal access devices, 1098-1, 1098-2, . . . , 1098-N, have been formed and integrated to vertical access lines, 1040-1, 1040-2, . . . , 1040-(Z+1) and integrated to digit lines, 1099-1, 1099-2, . . . , 1099-N, without body contacts. Advantages to the structure and process described herein can include a lower off-current (Ioff) for the access devices, as compared to silicon based (Si-based) access devices, a channel region 1025 with a lower voltage threshold in comparison to channels that are not formed as described in FIGS. 4A-4D, and/or reduced gate/drain induced leakage (GIDL) for the access devices. In some embodiments channel and/or source/drain region replacement fabrication steps may be performed after a capacitor cell formation process, thus reducing a thermal budget. The digit line integration may be more easily achieved in the fabrication process since a body contact to a body region of the access device 1098 is not used. Additionally, the embodiments described herein may achieve a better lateral scaling path than achieved with doped polysilicon based channel regions due to less channel length and lower source/drain semiconductor fabrication process formation overhead.

In the example embodiment of FIG. 10C, the horizontal access devices having a first source/drain region 1097-1, channel region 1025, and second source/drain region 1097-2 are shown extending in second direction 1005 (D2), left and right in the plane of the drawing sheet, a distance from the vertical openings 1071-1 and 1071-2 formed in the vertical stack and along an axis of orientation of the horizontal access devices and horizontal storage nodes of the arrays of vertically stacked memory cells of the three dimensional (3D) memory. In FIG. 10C, a neighboring, opposing vertical access line 1040-3 is illustrated by a dashed line indicating a location set inward from the plane and orientation of the drawing sheet.

FIG. 10D illustrates a cross sectional view, taken along cut-line C-C' in FIG. 10A, showing another view of the semiconductor structure at this particular point in one example semiconductor fabrication process of an embodiment of the present disclosure. The cross sectional view shown in FIG. 10D is illustrated extending in the second direction (D2) 1005, left and right in the plane of the drawing sheet, along an axis of the repeating iterations of alternating layers of a dielectric material, 1030-1, 1030-2, 1030-3 . . . , 1030-N, 1030-(N+1) and digit lines 1099-1, 1099-2, 1099-3, . . . , 1099-N (individually or collectively referred to as digit lines 1099), outside of a region in which the horizontally oriented access devices and horizontally oriented storage nodes, e.g., capacitor cells, are formed. In FIG. 10D, the dielectric material 1041 is shown filling the space between the horizontally oriented access devices, which can be spaced horizontally along a first direction (D1), extending into and out from the plane of the drawings sheet, for a three-dimensional array of vertically oriented memory cells. In the cross sectional view of FIG. 10D, the second electrode 1056, e.g., top, common electrode to the capacitor cell structure, is additionally shown present in the space between horizontally neighboring devices. At the left end of the drawing sheet is shown the repeating iterations of alternating layers of a dielectric material, 1030-1, 1030-2, 1030-3, . . . , 1030-(N+1), and the integrally formed horizontally oriented digit lines 1099 extending into and out from the plane of the drawing sheet, and connected to a source/drain region of the horizontally oriented access devices 1098.

FIG. 10E illustrates a cross sectional view, taken along cut-line D-D' in FIG. 10A, showing another view of the semiconductor structure at this particular point in one example semiconductor fabrication process of an embodiment of the present disclosure. The cross sectional view shown in FIG. 10E is illustrated, right to left in the plane of the drawing sheet, extending in the first direction (D1) 1009 along an axis of the repeating iterations of alternating layers of a dielectric material, 1030-1, 1030-2, 1030-3, . . . , 1030-(N+1), and a channel region, e.g., 1025 in FIG. 10C, of the horizontally oriented access devices 1098, extending in to and out from a plane of the drawing sheet, and intersecting across the plurality of separate, vertical access lines, 1040-1, 1040-2, . . . , 1040-4 separated from the channel regions by the gate dielectric 1038. In FIG. 10E, the dielectric fill material 1039 is shown separating the space between neighboring horizontally oriented access devices and horizontally oriented storage nodes, which may be formed extending into and out from the plane of the drawing sheet and can be spaced along a first direction (D1) 1009 and stacked vertically in arrays extending in the third direction (D3) 1011 in the three-dimensional (3D) memory.

Figure 11:
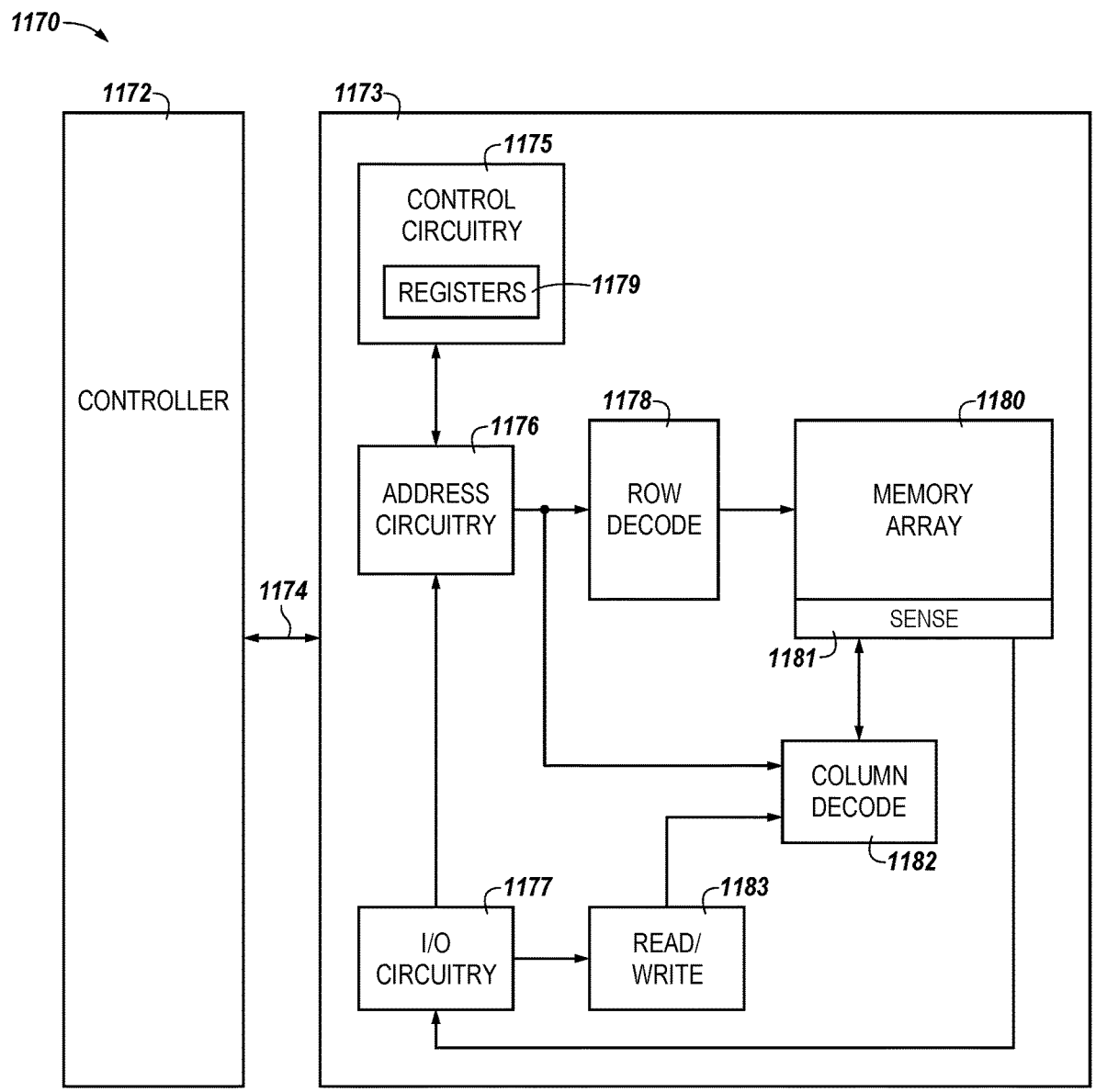
FIG. 11 is a block diagram of an apparatus in the form of a computing system including a memory device in accordance with a number of embodiments of the present disclosure.

FIG. 11 is a block diagram of an apparatus in the form of a computing system 1170 including a memory device 1173 in accordance with a number of embodiments of the present disclosure. As used herein, a memory device 1173, a memory array 1180, and/or a host 1172, for example, might also be separately considered an "apparatus." According to embodiments, the memory device 1173 may comprise at least one memory array 1180 having a three-node access device for vertical three dimensional (3D) memory, as has been described herein.

In this example, system 1170 includes a host 1172 coupled to memory device 1173 via an interface 1174. The computing system 1170 can be a personal laptop computer, a desktop computer, a digital camera, a mobile telephone, a memory card reader, or an Internet-of-Things (IoT) enabled device, among various other types of systems. Host 1172 can include a number of processing resources (e.g., one or more processors, microprocessors, or some other type of controlling circuitry) capable of accessing memory 1173. The system 1170 can include separate integrated circuits, or both the host 1172 and the memory device 1173 can be on the same integrated circuit. For example, the host 1172 may be a system controller of a memory system comprising multiple memory devices 1173, with the system controller 1175 providing access to the respective memory devices 1173 by another processing resource such as a central processing unit (CPU).

In the example shown in FIG. 11, the host 1172 is responsible for executing an operating system (OS) and/or various applications (e.g., processes) that can be loaded thereto (e.g., from memory device 1173 via controller 1175). The OS and/or various applications can be loaded from the memory device 1173 by providing access commands from the host 1172 to the memory device 1173 to access the data comprising the OS and/or the various applications. The host 1172 can also access data utilized by the OS and/or various applications by providing access commands to the memory device 1173 to retrieve said data utilized in the execution of the OS and/or the various applications.

For clarity, the system 1170 has been simplified to focus on features with particular relevance to the present disclosure. The memory array 1180 can be a DRAM array, SRAM array, STT RAM array, PCRAM array, TRAM array, RRAM array, NAND flash array, and/or NOR flash array, comprising at least one three-node access device for three dimension (3D) memory. For example, the memory array 1180 can be an unshielded DL 4F2 array such as a 3D-DRAM memory array. The array 1180 can comprise memory cells arranged in rows coupled by word lines (which may be referred to herein as access lines or select lines) and columns coupled by digit lines (which may be referred to herein as sense lines or data lines). Although a single array 1180 is shown in FIG. 1, embodiments are not so limited. For instance, memory device 1173 may include a number of arrays 1180 (e.g., a number of banks of DRAM cells).

The memory device 1173 includes address circuitry 1176 to latch address signals provided over an interface 1174. The interface can include, for example, a physical interface employing a suitable protocol (e.g., a data bus, an address bus, and a command bus, or a combined data/address/command bus). Such protocol may be custom or proprietary, or the interface 1174 may employ a standardized protocol, such as Peripheral Component Interconnect Express (PCIe), Gen-Z, CCIX, or the like. Address signals are received and decoded by a row decoder 1178 and a column decoder 1182 to access the memory array 1180. Data can be read from memory array 1180 by sensing voltage and/or current changes on the sense lines using sensing circuitry 1181. The sensing circuitry 1181 can comprise, for example, sense amplifiers that can read and latch a page (e.g., row) of data from the memory array 1180. The I/O circuitry 1177 can be used for bi-directional data communication with the host 1172 over the interface 1174. The read/write circuitry 1183 is used to write data to the memory array 1180 or read data from the memory array 1180. As an example, the circuitry 1183 can comprise various drivers, latch circuitry, etc.

Control circuitry 1175 includes registers 1179 and decodes signals provided by the host 1172. The signals can be commands provided by the host 1172. These signals can include chip enable signals, write enable signals, and address latch signals that are used to control operations performed on the memory array 1180, including data read operations, data write operations, and data erase operations. In various embodiments, the control circuitry 1175 is responsible for executing instructions from the host 1172. The control circuitry 1175 can comprise a state machine, a sequencer, and/or some other type of control circuitry, which may be implemented in the form of hardware, firmware, or software, or any combination of the three. In some examples, the host 1172 can be a controller external to the memory device 1173. For example, the host 1172 can be a memory controller which is coupled to a processing resource of a computing device.

The term semiconductor can refer to, for example, a material, a wafer, or a substrate, and includes any base semiconductor structure. "Semiconductor" is to be understood as including silicon-on-sapphire (SOS) technology, silicon-on-insulator (SOI) technology, thin-film-transistor (TFT) technology, doped and undoped semiconductors, epitaxial silicon supported by a base semiconductor structure, as well as other semiconductor structures. Furthermore, when reference is made to a semiconductor in the preceding description, previous process steps may have been utilized to form regions/junctions in the base semiconductor structure, and the term semiconductor can include the underlying materials containing such regions/junctions.

The figures herein follow a numbering convention in which the first digit or digits correspond to the drawing figure number and the remaining digits identify an element or component in the drawing. Similar (e.g., the same) elements or components between different figures may be identified by the use of similar digits. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure and should not be taken in a limiting sense.

As used herein, "a number of" or a "quantity of" something can refer to one or more of such things. For example, a number of or a quantity of memory cells can refer to one or more memory cells. A "plurality" of something intends two or more. As used herein, multiple acts being performed concurrently refers to acts overlapping, at least in part, over a particular time period. As used herein, the term "coupled" may include electrically coupled, directly coupled, and/or directly connected with no intervening elements (e.g., by direct physical contact), indirectly coupled and/or connected with intervening elements, or wirelessly coupled. The term coupled may further include two or more elements that co-operate or interact with each other (e.g., as in a cause and effect relationship). An element coupled between two elements can be between the two elements and coupled to each of the two elements.

It should be recognized the term vertical accounts for variations from "exactly" vertical due to routine manufacturing, measuring, and/or assembly variations and that one of ordinary skill in the art would know what is meant by the term "perpendicular." For example, the vertical can correspond to the z-direction. As used herein, when a particular element is "adjacent to" another element, the particular element can cover the other element, can be over the other element or lateral to the other element and/or can be in direct physical contact the other element. "Lateral to" may refer to the horizontal direction (e.g., the y-direction or the x-direction) that may be perpendicular to the z-direction, for example.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

What is claimed is:

1. A method for forming arrays of vertically stacked memory cells, having horizontally oriented access devices and vertically oriented access lines, comprising:
    depositing alternating layers of a dielectric material and a sacrificial material in repeating iterations to form a vertical stack;
    forming a plurality of vertical openings, having a first horizontal direction and a second horizontal direction, through the vertical stack and extending predominantly in the second horizontal direction to form elongated vertical, pillar columns with sidewalls in the vertical stack;
    patterning the elongated vertical, pillar columns to expose a location to form a channel region in sacrificial material in each of the layers;
    selectively removing a portion of the sacrificial material to form first horizontal openings in the first horizontal direction in the sidewalls of the elongated vertical, pillar columns; and
    depositing a channel material in the first horizontal openings to form the channel region within the sidewalls for the horizontally oriented access devices.

2. The method of claim 1, wherein depositing the sacrificial material comprises depositing yttrium oxide ($Y_2O_3$).

3. The method of claim 1, wherein depositing the channel material comprises depositing an indium zinc gallium oxide (IGZO) material as the channel material.

4. The method of claim 1, wherein selectively removing the portion of the sacrificial material in the first direction to form first horizontal openings comprises selectively removing the portion to a horizontal depth in a range of ten (10) nanometers (nm) to forty (40) nm.

5. The method of claim 1, wherein selectively removing the portion of the sacrificial material comprises selectively removing using an atomic layer etching (ALE) process.

6. The method of claim 1, further comprising depositing the alternating layers in at least two (2) repeating iterations to form the vertical stack to a height in a range of 2000 nanometers (nm) to 10,000 nm.

7. The method of claim 1, wherein forming the plurality of vertical openings to form elongated vertical, pillar columns comprises forming elongated vertical pillar columns having a horizontal width in the first direction in a range of fifty (50) nanometers to five hundred (500) nm.

8. A method for forming arrays of vertically stacked memory cells, having horizontally oriented access devices and vertically oriented access lines, comprising:
depositing alternating layers of a dielectric material and a yttrium oxide ($Y_2O_3$) material in repeating iterations to form a vertical stack;
forming a plurality of vertical openings, having a first horizontal direction and a second horizontal direction, through the vertical stack and extending predominantly in the second horizontal direction, to form elongated vertical, pillar columns with sidewalls in the vertical stack;
patterning the elongated vertical, pillar columns to expose locations to form channel regions in the layers of the yttrium oxide ($Y_2O_3$) material;
selectively etching to remove portions of the yttrium oxide ($Y_2O_3$) material in the first horizontal direction to form first horizontal openings in opposing sides of sidewalls of the elongated vertical, pillar columns; and
depositing a channel material in the first horizontal openings to form channel regions on the opposing sides of the sidewalls of the elongated vertical, pillar columns.

9. The method of claim 8, wherein patterning the elongated vertical, pillar columns to expose the locations to form channel regions comprises pattering the elongated vertical, pillar columns to form channel regions having a channel length in the second horizontal direction in a range of approximately twenty (20) nanometers (nm) to one hundred (100) nm.

10. The method of claim 8, wherein depositing the yttrium oxide ($Y_2O_3$) material comprises depositing the yttrium oxide ($Y_2O_3$) material to have a vertical height in a third direction in a range of approximately twenty (20) nanometers to one hundred (100) nm.

11. The method of claim 8, further comprising selectively depositing the channel material after forming a capacitor cell associated with the horizontal access devices in the arrays of vertically stacked memory cells.

12. The method of claim 8, further comprising forming a first source/drain region coupling the channel region to a digit line and forming a second source/drain region coupling the channel region to a horizontally oriented storage node for each of the horizontally oriented access devices.

13. The method of claim 8, wherein depositing the channel material comprises depositing the channel material using an atomic layer deposition (ALD) process.

14. A method for forming arrays of vertically stacked memory cells, having horizontally oriented access devices and vertically oriented access lines, comprising:
depositing alternating layers of a dielectric material and a semiconductor material to form a vertical stack;
forming a plurality of vertical openings, having a first horizontal direction and a second horizontal direction, through the vertical stack and extending predominantly in the second horizontal direction, to form elongated vertical, pillar columns with sidewalls in the vertical stack;
patterning the elongated vertical, pillar columns to expose a location to form channel regions in semiconductor material;
selectively etching to remove portions of the semiconductor material in the first horizontal direction to form first horizontal openings on opposite sidewalls of the elongated vertical, pillar columns against the semiconductor material;
selectively depositing a channel material in the first horizontal openings to form channel regions of the horizontally oriented access devices;
conformally depositing a conductive material on a gate dielectric material in the plurality of vertical openings; and
removing portions of the first conductive material to form a plurality of separate, vertical access lines along the sidewalls of the elongated vertical, pillar columns opposing the channel regions.

15. The method of claim 14, wherein depositing the semiconductor material comprises depositing a yttrium oxide ($Y_2O_3$) composition.

16. The method of claim 15, wherein selectively depositing the channel material in the first horizontal openings comprises depositing the channel material alongside the yttrium oxide ($Y_2O_3$) composition to serve as a back channel passivation material and lower a threshold voltage ($V_{th}$) of the channel.

17. The method of claim 14, wherein selectively depositing the channel material in the first horizontal openings to form the channel regions alongside the yttrium oxide ($Y_2O_3$) composition of the horizontally oriented access devices comprises forming the channel regions to operate with a threshold voltage ($V_{th}$) of less than 0.4 volts (V).

18. The method of claim 14, further comprising selectively depositing the channel material in the first horizontal openings to have a vertical width (W) in a third direction which is greater than a horizontal length (L) of the channel region in the second direction.

19. A memory cell array, comprising:
a plurality of access transistors stacked on one another, each of the access transistors including a first source/drain region, a second source/drain region, and an individual channel therebetween which are horizontally arranged, and a body region, wherein the individual channel includes a first portion of a channel material, a second portion of the channel material and a passivation material formed therebetween;
a first access line elongating vertically and coupled to the first portion of the channel material with an intervention of a first gate dielectric;
a second access line elongating vertically and coupled to the second portion of the channel material with an intervention of a second gate dielectric;
a plurality of storage capacitors stacked on one another, each of the plurality of storage capacitors lying horizontally and coupled to a corresponding one of the second source/drain regions of the plurality of access transistors; and
a plurality of digit lines, each of the plurality of digit lines coupled to a corresponding one of the first source/drain regions of the plurality of access transistors.

20. The memory cell array of claim 19, wherein the first portion of the channel material is in direct physical contact with a side of the passivation material and the second portion of the channel material is in direct physical contact with an opposite side of the passivation material.

21. The memory cell array of claim 19, wherein a plurality of individual channels is formed in a vertical pattern, wherein a dielectric material separates each of the individual channels.

* * * * *